US012796311B2

(12) United States Patent
Kim et al.

(10) Patent No.: US 12,796,311 B2
(45) Date of Patent: *Nov. 10, 2026

(54) ORGANOMETALLIC COMPOUND, LIGHT-EMITTING DEVICE INCLUDING THE SAME, AND ELECTRONIC APPARATUS INCLUDING THE LIGHT-EMITTING DEVICE

(71) Applicant: Samsung Display Co., Ltd., Yongin-si (KR)

(72) Inventors: Soyeon Kim, Suwon-si (KR); Sunghun Lee, Suwon-si (KR); Yongsuk Cho, Suwon-si (KR); Jongwon Choi, Suwon-si (KR); Dmitry Kravchuk, Suwon-si (KR); Sungmin Kim, Suwon-si (KR); Myungsun Sim, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1032 days.

This patent is subject to a terminal disclaimer.

(21) Appl. No.: 18/055,099

(22) Filed: Nov. 14, 2022

(65) Prior Publication Data

US 2023/0157152 A1 May 18, 2023

(30) Foreign Application Priority Data

Nov. 15, 2021 (KR) ........................ 10-2021-0157102

(51) Int. Cl.
*H10K 85/30* (2023.01)
*C07F 15/00* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
CPC ........................................................ C07F 15/00
See application file for complete search history.

(56) References Cited

U.S. PATENT DOCUMENTS 6,465,115 B2 10/2002 Shi et al.
6,596,415 B2 7/2003 Shi et al.
(Continued)

FOREIGN PATENT DOCUMENTS

EP 2465912 A1 6/2012
EP 3778614 A1 2/2021
(Continued)

OTHER PUBLICATIONS

M. A. Baldo et al., "Highly efficient phosphorescent emission fromorganic electroluminescent devices," Nature, Sep. 10, 1998, pp. 151-154, vol. 395.
(Continued)

*Primary Examiner* — Chanceity N Robinson
(74) *Attorney, Agent, or Firm* — CANTOR COLBURN LLP

(57) ABSTRACT

An organometallic compound represented by Formula 1:

Formula 1

(Continued)

wherein $Y_1$ to $Y_4$ are each independently C or N, one of $Y_1$ to $Y_4$ is N bonded to iridium in Formula 1, and another of $Y_1$ to $Y_4$ is C bonded to ring $CY_2$ in Formula 1, $Y_9$ is O, S, $N(R_{19})$, $C(R_{19a})(R_{19b})$, or $Si(R_{19a})(R_{19b})$, $X_2$ is C, ring $CY_1$ and ring $CY_2$ are each independently a $C_5$-$C_{30}$ carbocyclic group or a $C_1$-$C_{30}$ heterocyclic group, a1 and a2 are each independently an integer from 0 to 20, and $R_1$, $R_{19}$, $R_{19a}$, $R_{19b}$, $R_2$, $R_{30a}$, $R_{30b}$, and $R_{37}$ are each as described herein.

10 Claims, 1 Drawing Sheet

(51) Int. Cl.
*C09K 11/06* (2006.01)
*H10K 50/11* (2023.01)

(52) U.S. Cl.
CPC ................ *C09K 2211/1037* (2013.01); *C09K 2211/185* (2013.01); *H10K 50/11* (2023.02)

(56) References Cited

U.S. PATENT DOCUMENTS

| | | | |
|---|---|---|---|
| 8,431,243 B2 | 4/2013 | Kwong et al. | |
| 9,478,756 B2 | 10/2016 | Lee et al. | |
| 9,685,617 B2 | 6/2017 | Beers et al. | |
| 10,862,055 B2 | 12/2020 | Boudreault et al. | |
| 2001/0019782 A1 | 9/2001 | Igarashi et al. | |
| 2013/0334521 A1* | 12/2013 | Lee | H10K 85/342 546/4 |
| 2015/0236276 A1* | 8/2015 | Boudreault | H10K 85/342 257/40 |
| 2016/0093814 A1 | 3/2016 | Hwang et al. | |
| 2020/0212319 A1 | 7/2020 | Choi et al. | |
| 2020/0227659 A1* | 7/2020 | Boudreault | C07F 15/0033 |
| 2021/0083205 A1 | 3/2021 | Hwang et al. | |
| 2021/0104691 A1 | 4/2021 | Lee et al. | |
| 2021/0355148 A1 | 11/2021 | Choi et al. | |
| 2022/0348599 A1* | 11/2022 | Kwon | H10K 85/633 |
| 2024/0292748 A1* | 8/2024 | Ji | C07F 15/0033 |

FOREIGN PATENT DOCUMENTS

| | | | |
|---|---|---|---|
| JP | 2000003782 | A | 1/2000 |
| KR | 20120114030 | A | 10/2012 |
| KR | 101298735 | B1 | 8/2013 |
| KR | 101468065 | B1 | 12/2014 |
| KR | 20150096314 | A | 8/2015 |
| KR | 1020200083198 | A | 7/2020 |
| KR | 20200118376 | A | 10/2020 |
| KR | 1020210141385 | A | 11/2021 |

OTHER PUBLICATIONS

M. A. Baldo et al., "Very high-efficiency green organic light-emitting devices based on electrophosphorescence," Appl. Phys. Lett., Jun. 29, 1999, pp. 4-6, vol. 75, No. 1.

Qin Wang et al., "Effects of charged self-assembled quantum dots on two-dimensional quantum transport," Appl. Phys. Lett., Feb. 1, 2000, pp. 1704-1706, vol. 76, No. 13.

Raymond C. Kwong et al., "High operational stability of electrophosphorescent devices," Applied Physics Letters, Apr. 30, 2002, pp. 162-164, vol. 81, No. 1.

Sergey Lamansky et al., "Highly Phosphorescent Bis-Cyclometalated Iridium Complexes: Synthesis, Photophysical Characterization, and Use in Organic Light Emitting Diodes," Apr. 13, 2001, pp. 4304-4312, vol. 123.

Sergey Lamansky et al., Synthesis and Characterization of Phosphorescent Cyclometalated Iridium Complexes, Inorg. Chem., Mar. 1, 2001, pp. 1704-1711, vol. 40.

Office Action issued Jan. 24, 2025 of KR Patent Application No. 10-2021-0157102.

* cited by examiner

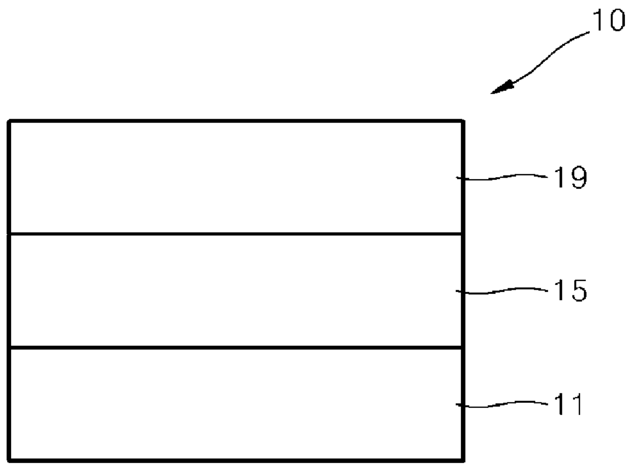
10
19
15
11

ORGANOMETALLIC COMPOUND, LIGHT-EMITTING DEVICE INCLUDING THE SAME, AND ELECTRONIC APPARATUS INCLUDING THE LIGHT-EMITTING DEVICE

CROSS-REFERENCE TO RELATED APPLICATION

This application is based on and claims priority to and the benefit of Korean Patent Application No. 10-2021-0157102, filed on Nov. 15, 2021, in the Korean Intellectual Property Office, and all the benefits accruing therefrom under 35 U.S.C. § 119, the content of which is incorporated by reference herein in its entirety.

BACKGROUND

1. Field

The present subject matter relates to an organometallic compound, a light-emitting device including the same, and an electronic apparatus including the light-emitting device.

2. Description of the Related Art

From among light-emitting devices, organic light-emitting devices (OLEDs) are self-emissive devices, which have improved characteristics in terms of viewing angles, response time, luminance, driving voltage, and response speed. OLEDS can also produce full-color images.

In a typical example, an organic light-emitting device includes an anode, a cathode, and an organic layer arranged between the anode and the cathode, wherein the organic layer includes an emission layer. A hole transport region may be arranged between the anode and the emission layer, and an electron transport region may be arranged between the emission layer and the cathode. Holes provided from the anode move toward the emission layer through the hole transport region, and electrons provided from the cathode move toward the emission layer through the electron transport region. The holes and the electrons recombine in the emission layer to produce excitons. The excitons may transition from an excited state to a ground state, thereby generating light (for example, a visible light).

SUMMARY

Provided are an organometallic compound, a light-emitting device including the same, and an electronic apparatus including the light-emitting device.

Additional aspects will be set forth in part in the detailed description that follows and, in part, will be apparent from the detailed description, or may be learned by practice of the presented exemplary embodiments herein.

According to an aspect, provided is an organometallic compound represented by Formula 1.

Formula 1

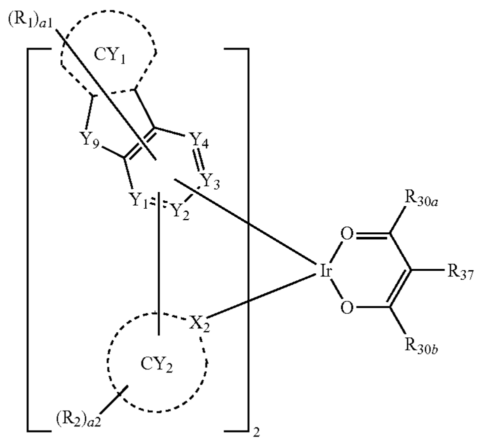

In Formula 1, $Y_1$ to $Y_4$ are each independently C or N, one of $Y_1$ to $Y_4$ is N bonded to iridium (Ir) in Formula 1, and another of $Y_1$ to $Y_4$ is C bonded to ring $CY_2$ in Formula 1, $Y_9$ is O, S, $N(R_{19})$, $C(R_{19a})(R_{19b})$, or $Si(R_{19a})(R_{19b})$, $X_2$ is C, ring $CY_1$ and ring $CY_2$ are each independently a $C_5$-$C_{30}$ carbocyclic group or a $C_1$-$C_{30}$ heterocyclic group, $R_1$, $R_{19}$, $R_{19a}$, $R_{19b}$, $R_2$, $R_{30a}$, $R_{30b}$, and $R_{37}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_0$ alkyl aryl group, a substituted or unsubstituted $C_7$-$C_0$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, a1 and a2 are each independently an integer from 0 to 20, with the proviso that i) a1 is not 0, and at least one of $R_1$ is —$Ge(Q_3)(Q_4)(Q_5)$, ii) a2 is not 0, and at least one of $R_2$ is —$Ge(Q_3)(Q_4)(Q_5)$, or iii) a1 is not 0, and at least one of $R_1$ is —$Ge(Q_3)(Q_4)(Q_5)$, and a2 is not 0, and at least one of $R_2$ is —$Ge(Q_3)(Q_4)(Q_5)$, two or more of a plurality of $R_1$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_2$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_1$ and $R_2$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_{30a}$, $R_{30b}$, and $R_{37}$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $R_{10a}$ is the same as described in connection with $R_1$, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$heterocycloalkenyl group, the substituted $C_6$-$C_{60}$ aryl group, the substituted $C_7$-$C_0$ alkyl aryl group, the substituted $C_7$-$C_0$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_0$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof, —$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$, or a combination thereof, and $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_0$ alkyl aryl group, a substituted or unsubstituted $C_7$-$C_0$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

According to another aspect, provided is a light-emitting device including a first electrode, a second electrode, and an organic layer arranged between the first electrode and the second electrode, wherein the organic layer includes an emission layer, and wherein the organic layer further includes at least one organometallic compound represented by Formula 1.

The organometallic compound may be included in the emission layer of the organic layer, and the organometallic compound included in the emission layer may act as a dopant.

According to another aspect, provided is an electronic apparatus including the light-emitting device.

BRIEF DESCRIPTION OF THE DRAWING

The above and other aspects, features, and advantages of certain exemplary embodiments will be more apparent from the following detailed description taken in conjunction with the FIGURE, which is a schematic cross-sectional view of a light-emitting device according to one or more embodiments.

DETAILED DESCRIPTION

Reference will now be made in further detail to exemplary embodiments, examples of which are illustrated in the accompanying drawing, wherein like reference numerals refer to like elements throughout the specification. In this regard, the present exemplary embodiments may have different forms and should not be construed as being limited to the detailed descriptions set forth herein. Accordingly, the exemplary embodiments are merely described in further detail below, and by referring to the drawing, to explain certain aspects of the present description. As used herein, the term "and/or" includes any and all combinations of one or more of the same associated listed items. As used herein, the expression "at least one of a, b or c" indicates only a, only b, only c, both a and b, both a and c, both b and c, all of a, b, and c, or variations thereof.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Hereinafter, a work function or a highest occupied molecular orbital (HOMO) energy level is expressed as an absolute value from a vacuum level. In addition, when the work function or the HOMO energy level is referred to be "deep," "high" or "large," the work function or the HOMO energy level has a large absolute value based on "0 electron Volts (eV)" of the vacuum level, while when the work function or the HOMO energy level is referred to be "shallow," "low," or "small," the work function or HOMO energy level has a small absolute value based on "0 eV" of the vacuum level.

Provided is an organometallic compound that is represented by Formula 1:

Formula 1

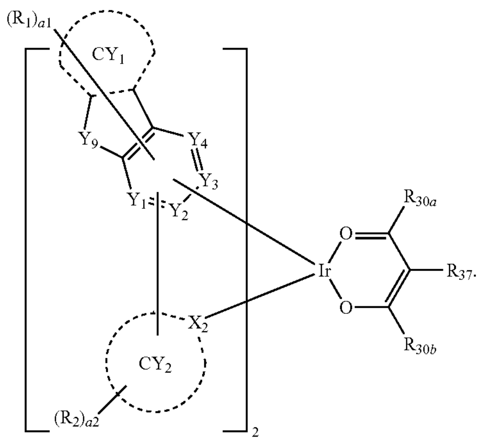

$Y_1$ to $Y_4$ in Formula 1 are each independently C or N. One of $Y_1$ to $Y_4$ is N bonded to iridium (Ir) in Formula 1, and another of $Y_1$ to $Y_4$ is C bonded to ring $CY_2$ in Formula 1.

In one or more embodiments,

1) $Y_2$ may be N bonded to iridium in Formula 1, and $Y_1$ may be C bonded to ring $CY_2$ in Formula 1, 2) $Y_1$ may be N bonded to iridium in Formula 1, and $Y_2$ may be C bonded to ring $CY_2$ in Formula 1, 3) $Y_3$ may be N bonded to iridium in Formula 1, and $Y_2$ may be C bonded to ring $CY_2$ in Formula 1, 4) $Y_2$ may be N bonded to iridium in Formula 1, and $Y_3$ may be C bonded to ring $CY_2$ in Formula 1, 5) $Y_4$ may be N bonded to iridium in Formula 1, and $Y_3$ may be C bonded to ring $CY_2$ in Formula 1, or 6) $Y_3$ may be N bonded to iridium in Formula 1, and $Y_4$ may be C bonded to ring $CY_2$ in Formula 1.

In Formula 1, $Y_9$ is O, S, $N(R_{19})$, $C(R_{19a})(R_{19b})$, or $Si(R_{19a})(R_{19b})$. $R_{19}$, $R_{19a}$, and $R_{19b}$ are each as described herein.

In one or more embodiments, $Y_9$ may be O, S, or $N(R_{19})$.

In one or more embodiments, $Y_9$ may be O or S.

In Formula 1, $X_2$ is C.

In Formula 1, ring $CY_1$ and ring $CY_2$ are each independently a $C_5$-$C_{30}$ carbocyclic group or a $C_1$-$C_{30}$ heterocyclic group.

In one or more embodiments, ring $CY_2$ in Formula 1 may be a polycyclic group in which two or more cyclic groups are condensed with each other, and each of the two or more cyclic groups may be a $C_5$-$C_1$ carbocyclic group or a $C_1$-$C_{15}$ heterocyclic group.

In one or more embodiments, ring $CY_1$ and ring $CY_2$ in Formula 1 may each independently be i) a first ring, ii) a second ring, iii) a condensed cyclic ring group in which two or more first rings are condensed with each other, iv) a condensed cyclic ring group in which two or more second rings are condensed with each other, or v) a condensed cyclic ring group in which one or more first rings and one or more second rings are condensed with each other, the first ring may be a cyclopentane group, a cyclopentene group, a furan group, a thiophene group, a pyrrole group, a silole group, a germole group, a borole group, a selenophene group, a phosphole group, an oxazole group, an oxadiazole group, an oxatriazole group, a thiazole group, a thiadiazole group, a thiatriazole group, a pyrazole group, an imidazole group, a triazole group, a tetrazole group, an azasilole group, an azagermole group, an azaborole group, an azaselenophene group, or an azaphosphole group, and the second ring may be an adamantane group, a norbornane group, a norbornene group, a bicyclo[1.1.1]pentane group, a bicyclo[2.1.1]hexane group, a bicyclo[2.2.2]octane group, a cyclohexane group, a cyclohexene group, a benzene group, pyridine group, a pyrimidine group, a pyrazine group, a pyridazine group, or a triazine group.

In one or more embodiments, ring $CY_1$ in Formula 1 may be i) a first ring, ii) a second ring, iii) a condensed cyclic ring group in which two or more first rings are condensed with each other, iv) a condensed cyclic ring group in which two or more second rings are condensed with each other, or v) a condensed cyclic ring group in which one or more first rings and one or more second rings are condensed with each other, and ring $CY_2$ may be a) a condensed cyclic ring group in which two or more first rings are condensed with each other, b) a condensed cyclic ring group in which two or more second rings are condensed with each other, or c) a condensed cyclic ring group in which one or more first rings and one or more second rings are condensed with each other. The first ring and the second ring may each be as described herein.

In one or more embodiments, ring $CY_1$ and ring $CY_2$ in Formula 1 may each independently be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a thiophene group, a furan group, a pyrrole group, a cyclopentadiene group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a fluorene group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, ring $CY_1$ and ring $CY_2$ in Formula 1 may each independently be a benzene group, a naphthalene group, a phenanthrene group, a pyridine group, a pyrimidine group, a pyrazine group, a pyridazine group, a quinoline group, an isoquinoline group, a quinoxaline group, a benzoquinoline group, a benzoisoquinoline group, a benzoquinoxaline group, a benzofuran group, or a benzothiophene group.

In one or more embodiments, in Formula 1, ring $CY_1$ may be a benzene group, a naphthalene group, a phenanthrene group, a pyridine group, a pyrimidine group, a pyrazine group, a pyridazine group, a quinoline group, an isoquinoline group, a quinoxaline group, a benzoquinoline group, a benzoisoquinoline group, a benzoquinoxaline group, a benzofuran group, or a benzothiophene group, and ring $CY_2$ may be a naphthalene group, a phenanthrene group, a quinoline group, an isoquinoline group, a quinoxaline group, a benzoquinoline group, a benzoisoquinoline group, a benzoquinoxaline group, a benzofuran group, or a benzothiophene group.

$R_1$, $R_{19}$, $R_{19a}$, $R_{19b}$, $R_2$, $R_{30a}$, $R_{30b}$, and $R_{37}$ in Formula 1 are each independently hydrogen, deuterium, —F, —Cl, —Br, —I, $—SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_0$ alkyl aryl group, a substituted or unsubstituted $C_7$-$C_0$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$. $Q_1$ to $Q_9$ are each as described herein.

In one or more embodiments, $R_{30a}$ in Formula 1 may be a group represented by $*—C(R_{31})(R_{32})(R_{33})$. $R_{31}$ to $R_{33}$ may each be as defined for $R_{30a}$.

$R_{30b}$ in Formula 1 may be a group represented by $*—C(R_{34})(R_{35})(R_{36})$. $R_{34}$ to $R_{36}$ may each be as defined for $R_{30b}$.

For example, $R_1$, $R_{19}$, $R_{19a}$, $R_{19b}$, $R_2$, $R_{30a}$, $R_{30b}$, and $R_{31}$ to $R_{37}$ may each independently be:

hydrogen, deuterium, —F, —Cl, —Br, —I, $—SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, a $C_2$-$C_{20}$ alkenyl group, a $C_1$-$C_{20}$ alkoxy group, or a $C_1$-$C_{20}$ alkylthio group, a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with at least one of deuterium, —F, —Cl, —Br, —I, $—SF_5$, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl) phenyl group, a biphenyl group, a terphenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one of deuterium, —F, —Cl, —Br, —I, $—SF_5$, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl) phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$).

$Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group; a substituted or unsubstituted $C_2$-$C_{60}$ alkynyl group; a substituted or unsubstituted $C_1$-$C_{60}$ alkoxy group; a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_0$ alkyl aryl group, a substituted or unsubstituted $C_7$-$C_0$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

For example, $Q_1$ to $Q_9$ may each independently be:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, a phenyl group, or a combination thereof.

In one or more embodiments, $R_1$, $R_{19}$, $R_{19a}$, $R_{19b}$, $R_2$, $R_{30a}$, $R_{30b}$, and $R_{31}$ to $R_{37}$ may each independently be:

hydrogen, deuterium, —F, or a cyano group;

a $C_1$-$C_{20}$ alkyl group that is unsubstituted or substituted with at least one of deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or a combination thereof;

a $C_3$-$C_{10}$ cycloalkyl group, a $C_1$-$C_{10}$ heterocycloalkyl group, a phenyl group, a biphenyl group, a naphthyl group, a pyridinyl group, a fluorenyl group, a carbazolyl group, a dibenzofuranyl group, or a dibenzothiophenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a $C_1$-$C_{20}$ alkylthio group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or a combination thereof; or —Si($Q_3$)($Q_4$)($Q_5$) or —Ge($Q_3$)($Q_4$)($Q_5$).

In one or more embodiments, $R_{37}$ in Formula 1 may be hydrogen, deuterium, a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_7$-$C_0$ alkyl aryl group, a substituted or unsubstituted $C_7$-$C_0$ aryl alkyl group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted monovalent non-aromatic condensed polycyclic group, or a substituted or unsubstituted monovalent non-aromatic condensed heteropolycyclic group.

In one or more embodiments, at least one of $R_1$, at least one of $R_2$, $R_{30a}$, $R_{30b}$, $R_{37}$, or a combination thereof may each independently be:

deuterium, —F, or a cyano group;

a $C_1$-$C_{20}$ alkyl group that is unsubstituted or substituted with at least one of deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or a combination thereof;

a $C_3$-$C_{10}$ cycloalkyl group, a $C_1$-$C_{10}$ heterocycloalkyl group, a phenyl group, a biphenyl group, a naphthyl group, a pyridinyl group, a fluorenyl group, a carbazolyl group, a dibenzofuranyl group, or a dibenzothiophenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a $C_1$-$C_{20}$ alkylthio group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or a combination thereof; or —$Si(Q_3)(Q_4)(Q_5)$ or —$Ge(Q_3)(Q_4)(Q_5)$.

In one or more embodiments, $R_1$, $R_{19}$, $R_{19a}$, $R_{19b}$, $R_2$, $R_{30a}$, $R_{30b}$, and $R_{31}$ to $R_{37}$ may each independently be hydrogen, deuterium, —F, —$CH_3$, —$CD_3$, —$CD_2H$, —$CDH_2$, —$CF_3$, —$CF_2H$, —$CFH_2$, a $C_2$-$C_{10}$ alkenyl group, a $C_1$-$C_{10}$ alkoxy group, a $C_1$-$C_{10}$ alkylthio group, a group represented by one of Formulae 9-1 to 9-39, a group represented by one of Formulae 9-1 to 9-39 in which at least one hydrogen is substituted with deuterium, a group represented by Formulae one of 9-1 to 9-39 in which at least one hydrogen is substituted with —F, a group represented by one of Formulae 9-201 to 9-237, a group represented by one of Formulae 9-201 to 9-237 in which at least one hydrogen is substituted with deuterium, a group represented by one of Formulae 9-201 to 9-237 in which at least one hydrogen is substituted with —F, a group represented by one of Formulae 10-1 to 10-129, a group represented by one of Formulae 10-1 to 10-129 in which at least one hydrogen is substituted with deuterium, a group represented by one of Formulae 10-1 to 10-129 in which at least one hydrogen is substituted with —F, a group represented by one of Formulae 10-201 to 10-350, a group represented by one of Formulae 10-201 to 10-350 in which at least one hydrogen is substituted with deuterium, a group represented by one of Formulae 10-201 to 10-350 in which at least one hydrogen is substituted with —F, —$Si(Q_3)(Q_4)(Q_5)$, or —$Ge(Q_3)(Q_4)(Q_5)$ (wherein $Q_3$ to $Q_5$ may each be the same as described herein):

9-1

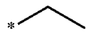

9-2

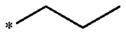

9-3

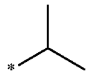

9-4

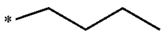

9-5

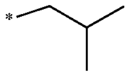

9-6

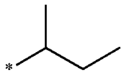

9-7

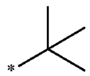

9-8

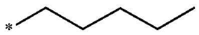

9-9

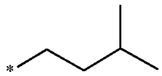

9-10

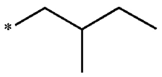

9-11

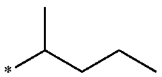

9-12

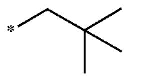

9-13

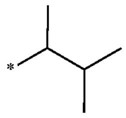

-continued
9-14
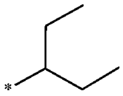
9-15
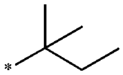
9-16
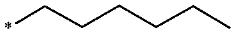
9-17
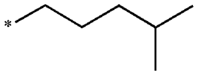
9-18
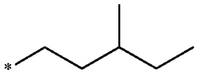
9-19
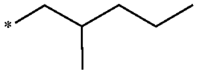
9-20
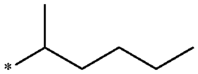
9-21
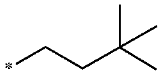
9-22
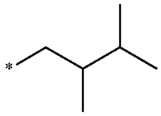
9-23
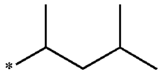
9-24
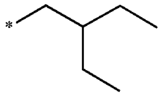
9-25
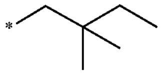
9-26
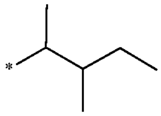
9-27
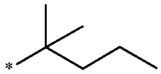
9-28
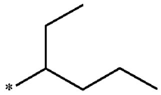
9-29
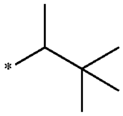
-continued
9-30
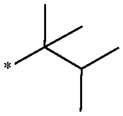
9-31
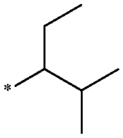
9-32
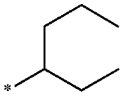
9-33
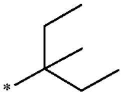
9-34
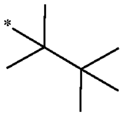
9-35
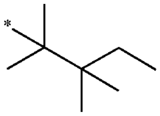
9-36
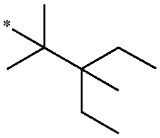
9-37
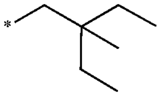
9-38
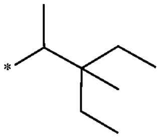
9-39
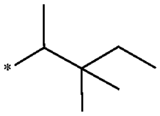
9-201
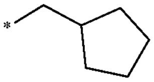
9-202
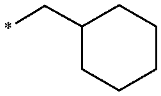
9-203
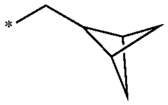

-continued
9-204
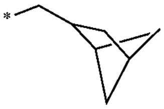
9-205
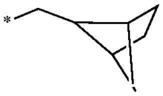
9-206
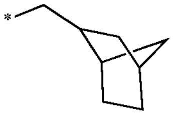
9-207
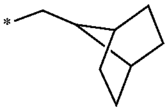
9-208
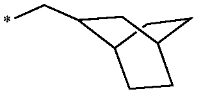
9-209
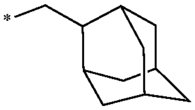
9-210
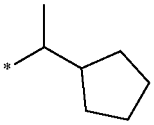
9-211
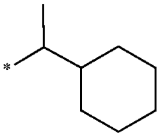
9-212
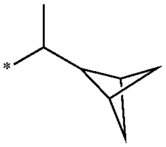
9-213
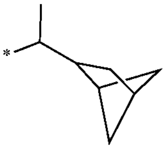
9-214
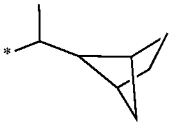
9-215
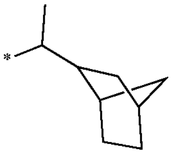
-continued
9-216
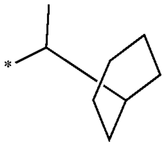
9-217
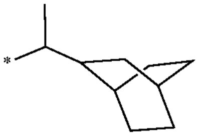
9-218
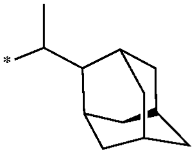
9-219
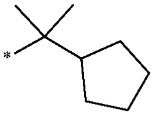
9-220
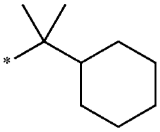
9-221
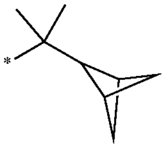
9-222
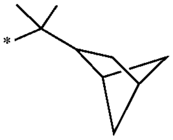
9-223
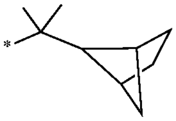
9-224
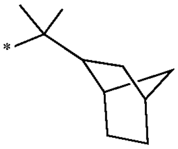
9-225
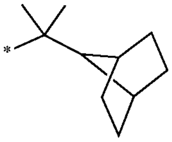

-continued
9-226
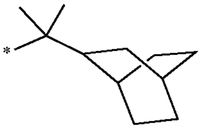
9-227
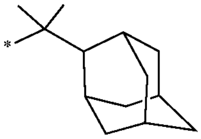
9-228
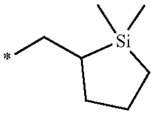
9-229
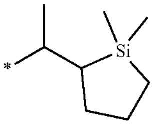
9-230
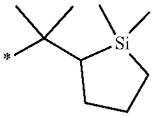
9-231
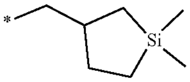
9-232
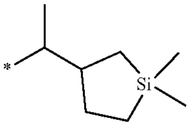
9-233
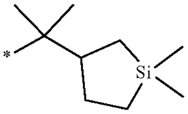
9-234
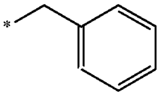
9-235
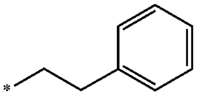
9-236
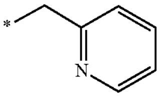
9-237
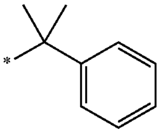
10-1
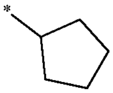
-continued
10-2
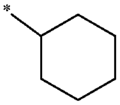
10-3
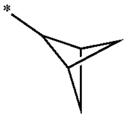
10-4
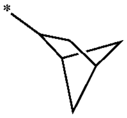
10-5
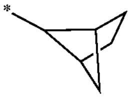
10-6
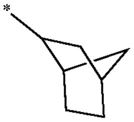
10-7
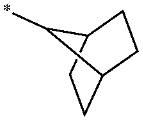
10-8
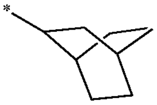
10-9
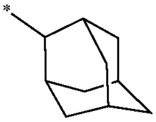
10-10
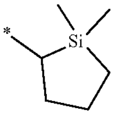
10-11
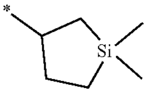
10-12
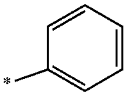
10-13
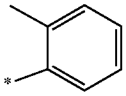
10-14
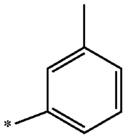

-continued
10-15
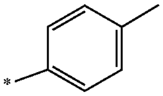
10-16
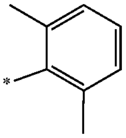
10-17
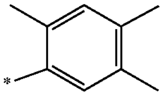
10-18
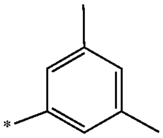
10-19
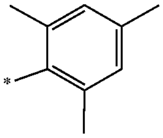
10-20
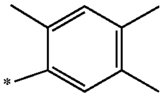
10-21
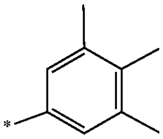
10-22
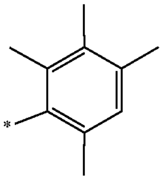
10-23
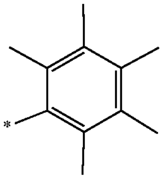
10-24
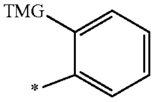
10-25
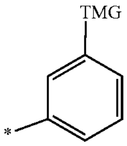
-continued
10-26
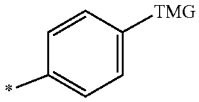
10-27
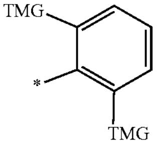
10-28
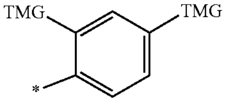
10-29
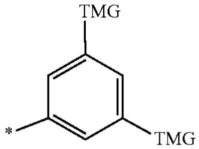
10-30
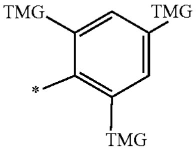
10-31
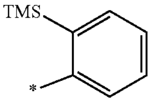
10-32
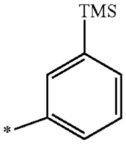
10-33
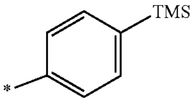
10-34
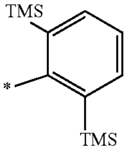
10-35
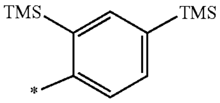
10-36
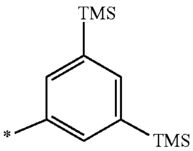

-continued
10-37
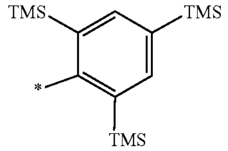
10-38
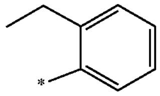
10-39
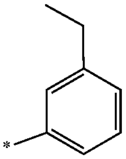
10-40
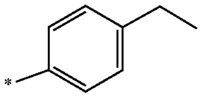
10-41
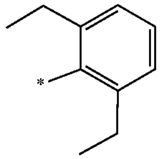
10-42
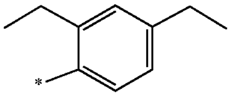
10-43
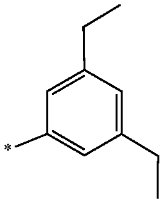
10-44
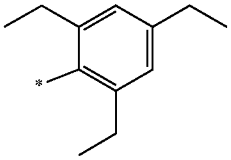
10-45
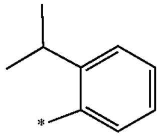
10-46
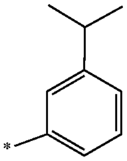
-continued
10-47
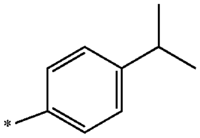
10-48
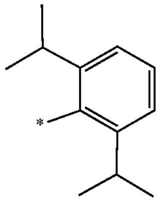
10-49
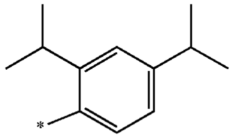
10-50
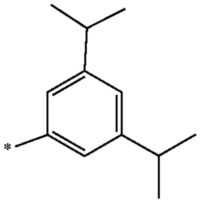
10-51
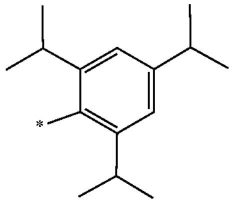
10-52
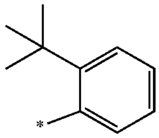
10-53
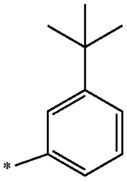
10-54
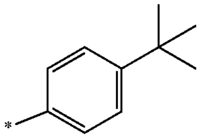

-continued
10-55
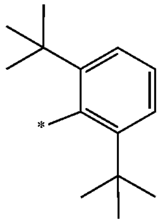
10-56
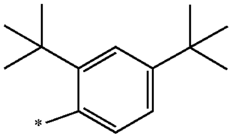
10-57
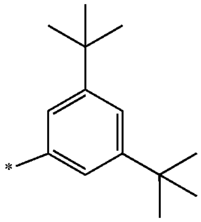
10-58
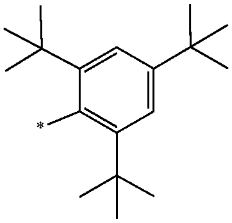
10-59
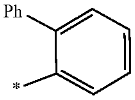
10-60
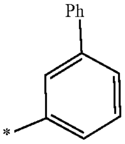
10-61
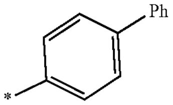
10-62
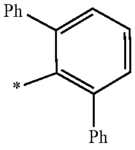
10-63
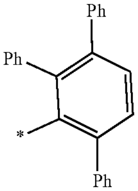
-continued
10-64
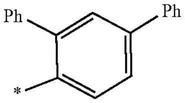
10-65
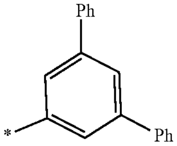
10-66
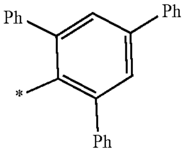
10-67
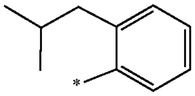
10-68
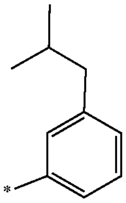
10-69
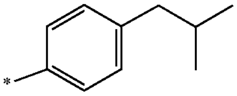
10-70
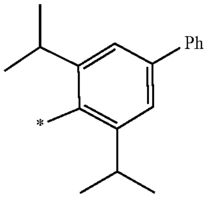
10-71
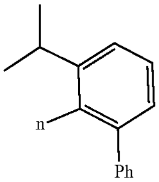
10-72
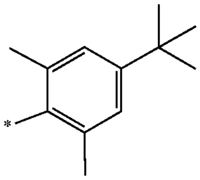
10-73
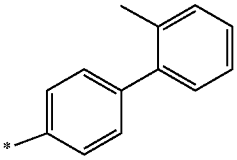

-continued
10-74
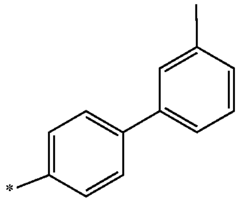
10-75
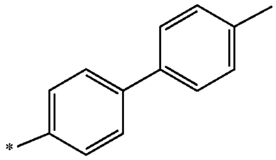
10-76
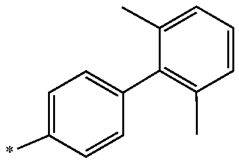
10-77
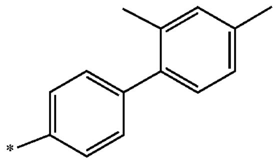
10-78
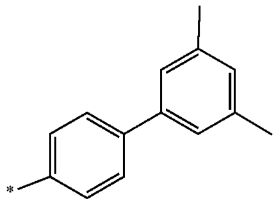
10-79
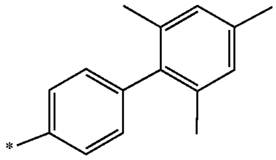
10-80
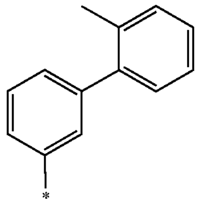
10-81
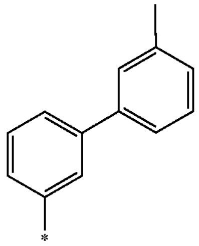
-continued
10-82
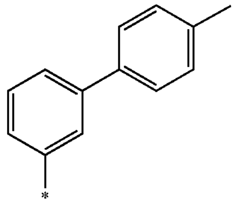
10-83
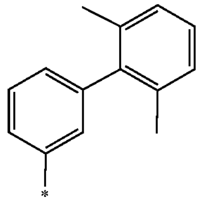
10-84
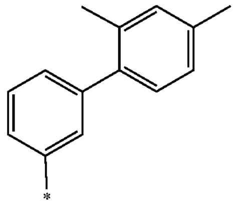
10-85
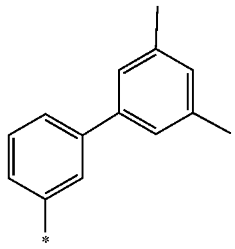
10-86
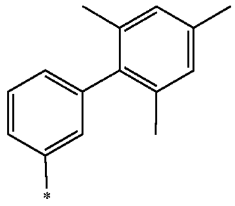
10-87
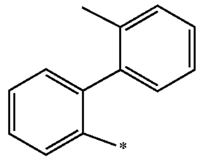
10-88
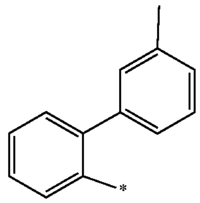

-continued
10-89
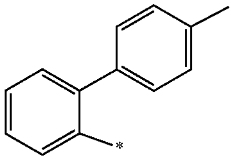
10-90
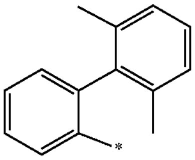
10-91
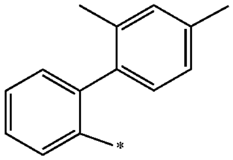
10-92
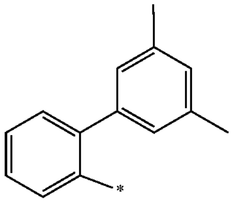
10-93
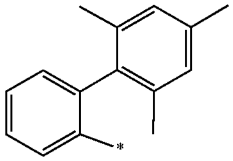
10-94
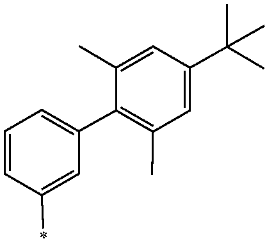
10-95
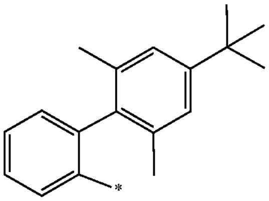
10-96
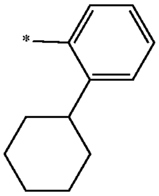
-continued
10-97
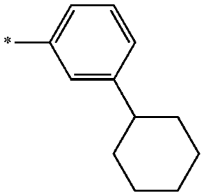
10-98
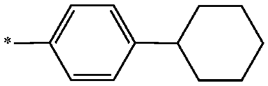
10-99
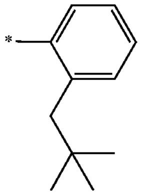
10-100
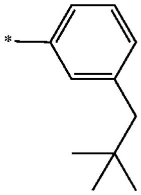
10-101
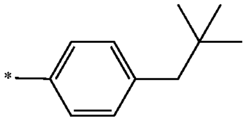
10-102
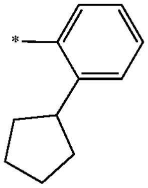
10-103
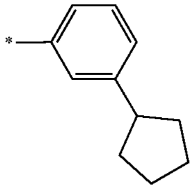
10-104
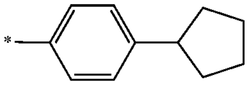
10-105
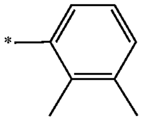
10-106
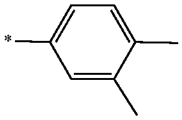

-continued
10-107
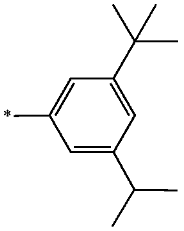
10-108
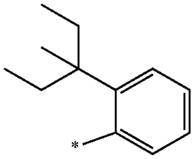
10-109
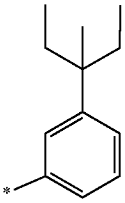
10-110
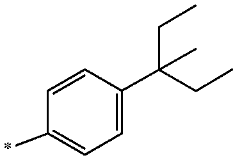
10-111
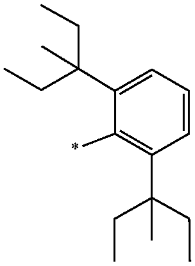
10-112
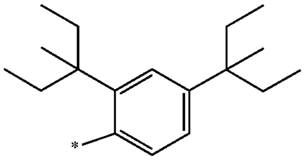
10-113
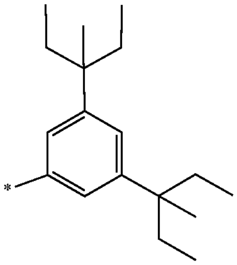
-continued
10-114
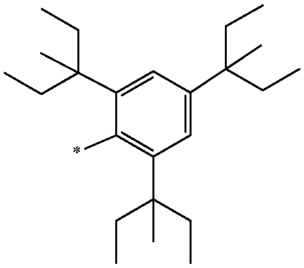
10-115
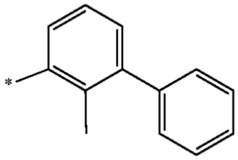
10-116
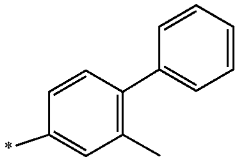
10-117
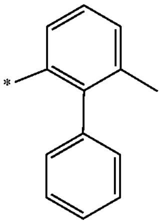
10-118
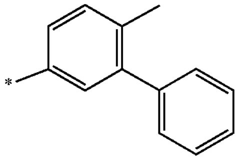
10-119
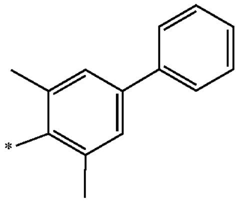
10-120
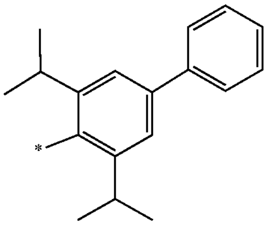
10-121
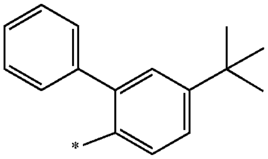

-continued
10-122
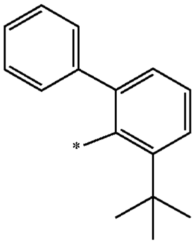
10-123
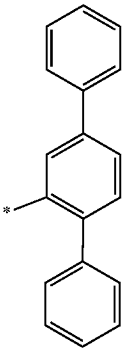
10-124
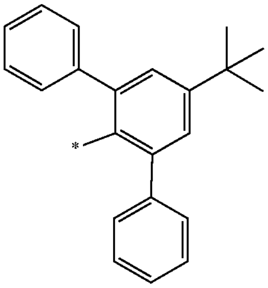
10-125
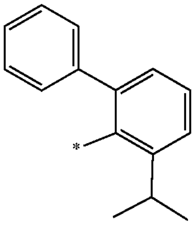
10-126
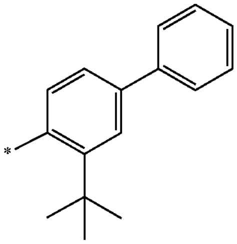
10-127
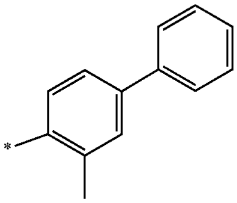
-continued
10-128
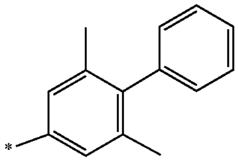
10-129
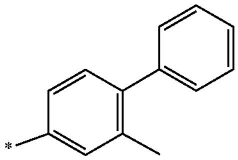
10-201
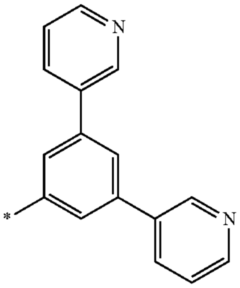
10-202
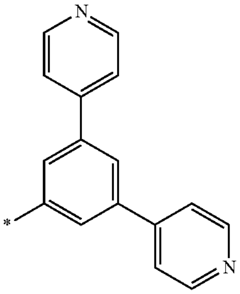
10-203
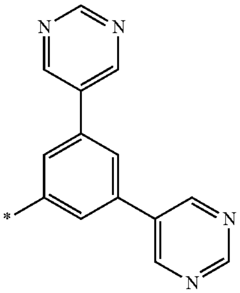

-continued
10-204
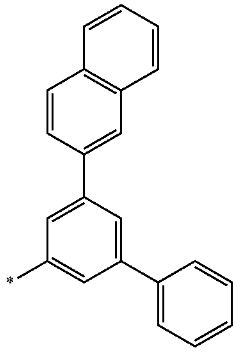
10-205
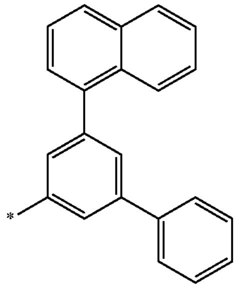
10-206
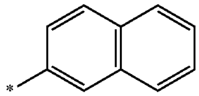
10-207
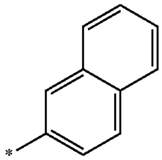
10-208
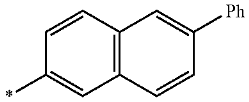
10-209
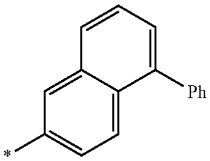
10-210
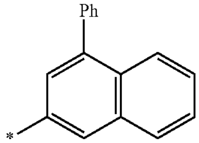
10-211
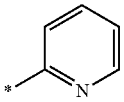
10-212
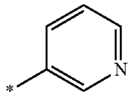
-continued
10-213
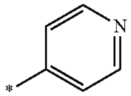
10-214
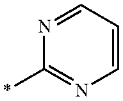
10-215
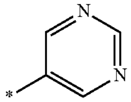
10-216
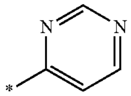
10-217
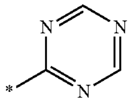
10-218
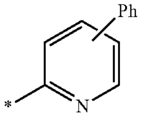
10-219
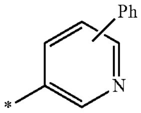
10-220
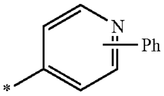
10-221
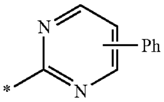
10-222
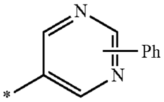
10-223
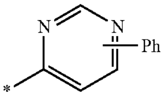
10-224
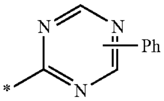
10-225
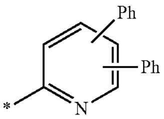

-continued
10-226
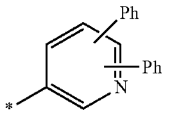
10-227
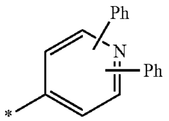
10-228
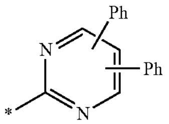
10-229
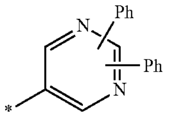
10-230
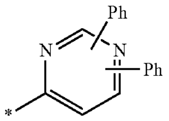
10-231
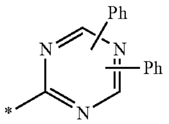
10-232
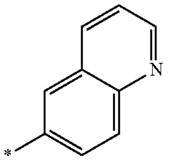
10-233
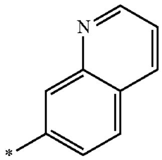
10-234
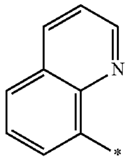
10-235
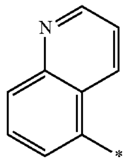
-continued
10-236
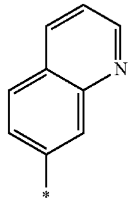
10-237
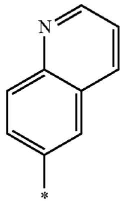
10-238
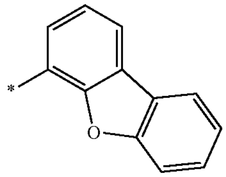
10-239
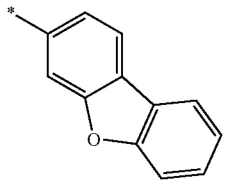
10-240
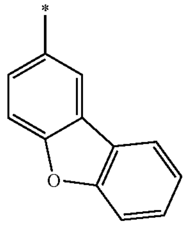
10-241
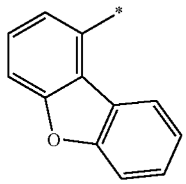
10-242
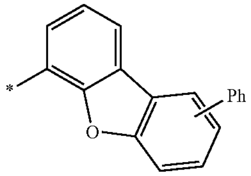
10-243
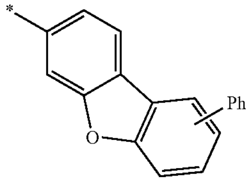

-continued
10-244
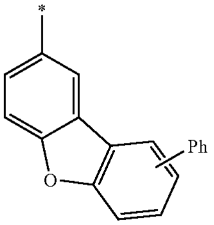
10-245
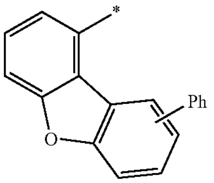
10-246
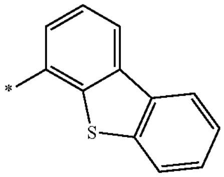
10-247
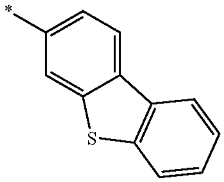
10-248
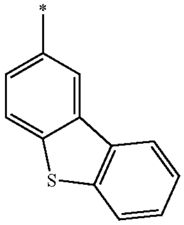
10-249
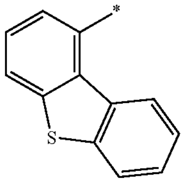
10-250
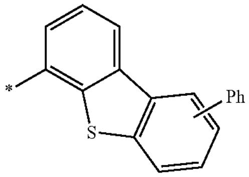
10-251
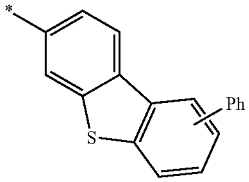
-continued
10-252
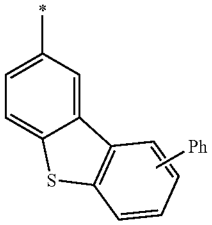
10-253
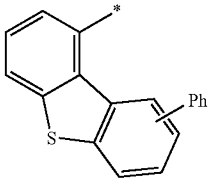
10-254
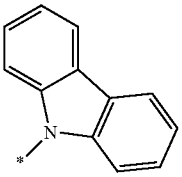
10-255
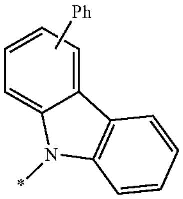
10-256
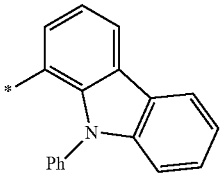
10-257
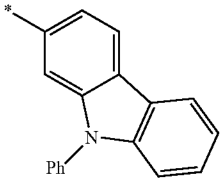
10-258
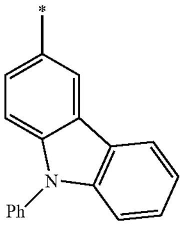
10-259
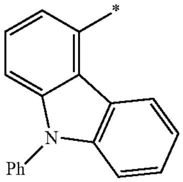

-continued
10-260
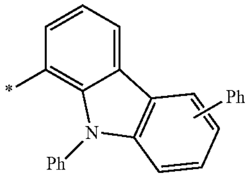
10-261
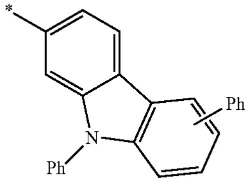
10-262
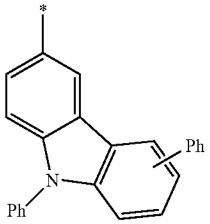
10-263
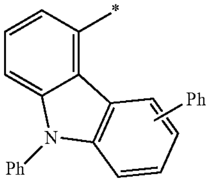
10-264
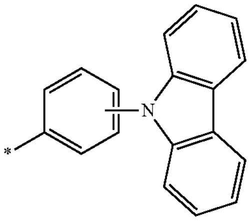
10-265
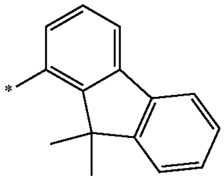
10-266
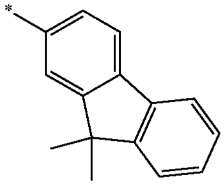
-continued
10-267
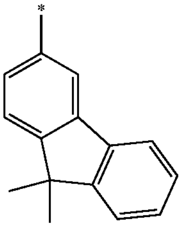
10-268
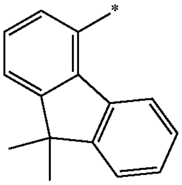
10-269
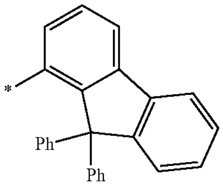
10-270
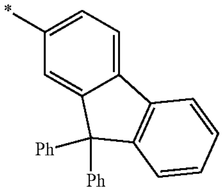
10-271
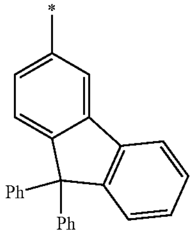
10-272
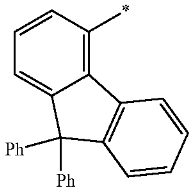
10-273
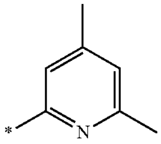
10-274
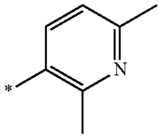

-continued
10-275
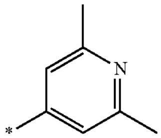
10-276
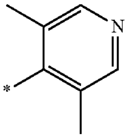
10-277
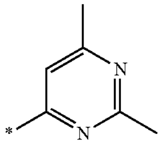
10-278
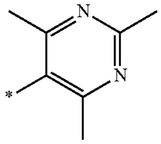
10-279
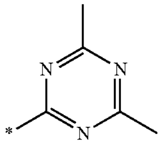
10-280
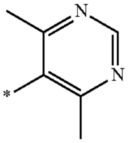
10-281
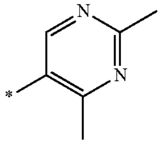
10-282
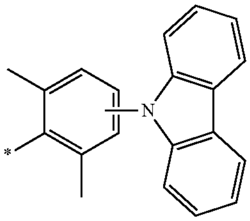
10-283
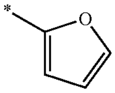
10-284
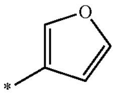
10-285
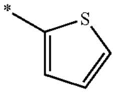
-continued
10-286
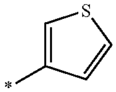
10-287
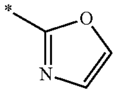
10-288
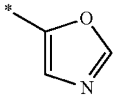
10-289
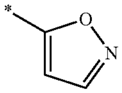
10-290
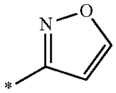
10-291
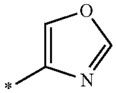
10-292
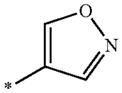
10-293
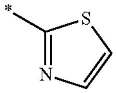
10-294
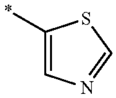
10-295
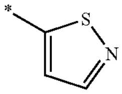
10-296
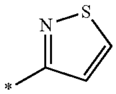
10-297
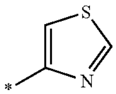
10-298
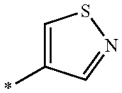
10-299
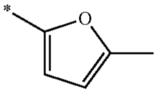
10-300
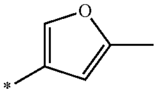

-continued
10-301
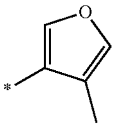
10-302
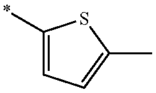
10-303
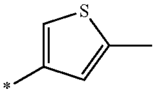
10-304
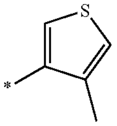
10-305
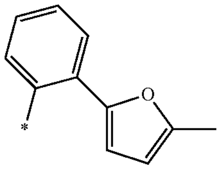
10-306
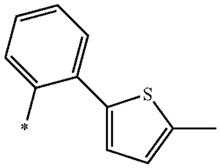
10-307
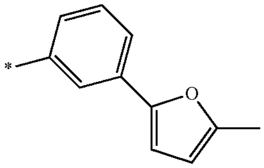
10-308
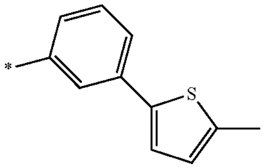
10-309
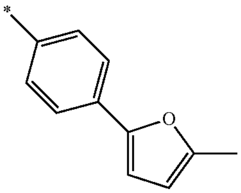
10-310
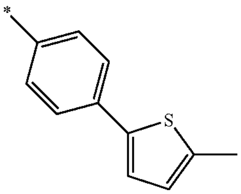
-continued
10-311
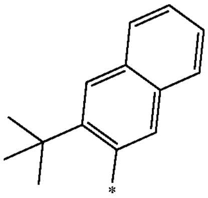
10-312
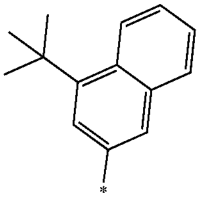
10-313
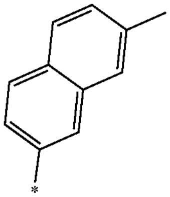
10-314
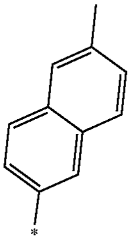
10-315
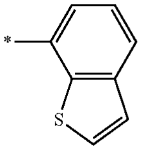
10-316
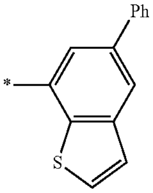
10-317
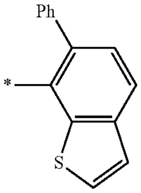
10-318
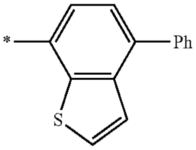

-continued
10-319
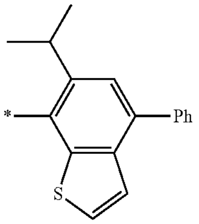
10-320
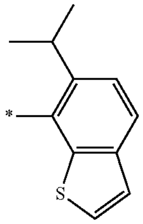
10-321
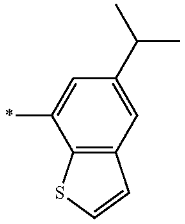
10-322
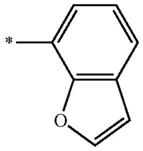
10-323
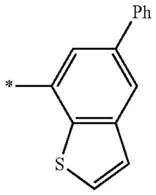
10-324
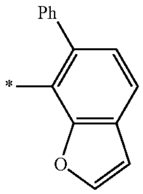
10-325
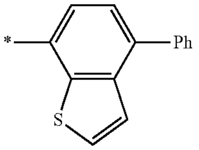
-continued
10-326
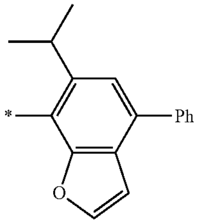
10-327
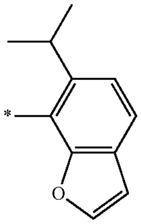
10-328
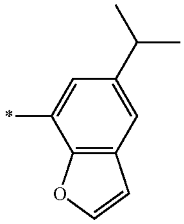
10-329
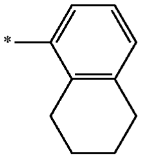
10-330
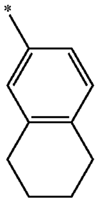
10-331
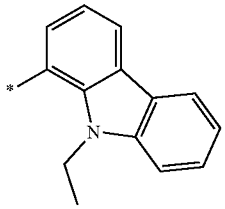
10-332
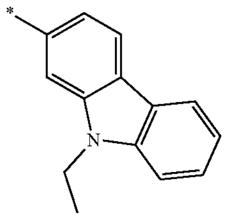

-continued 10-333

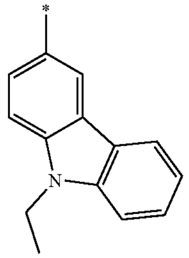

10-334

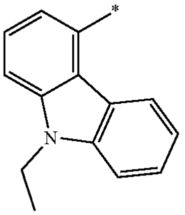

10-335

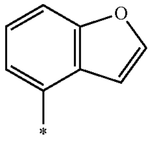

10-336

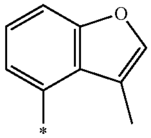

10-337

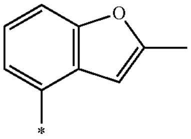

10-338

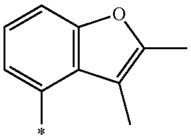

10-339

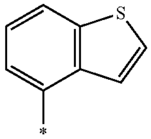

10-340

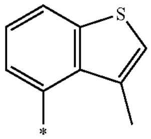

10-341

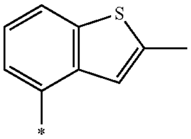

-continued 10-342

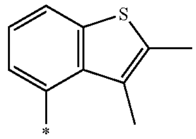

10-343

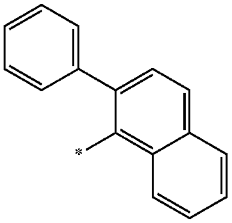

10-344

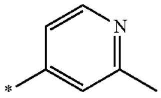

10-345

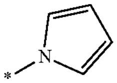

10-346

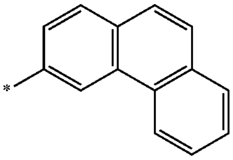

10-347

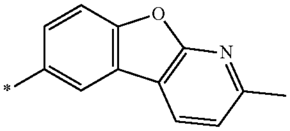

10-348

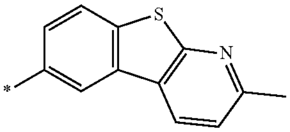

10-349

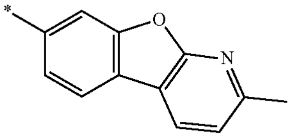

10-350

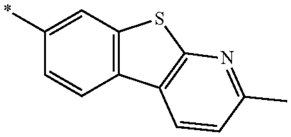

wherein, in Formulae 9-1 to 9-39, 9-201 to 9-237, 10-1 to 10-129, and 10-201 to 10-350, * indicates a binding site to a neighboring atom, “Ph” indicates a phenyl group, “TMS” indicates a trimethylsilyl group, and “TMG” indicates a trimethylgermyl group.

The “group represented by one of Formulae 9-1 to 9-39 in which at least one hydrogen is substituted with deuterium” and the “group represented by one of Formulae 9-201 to 9-237 in which at least one hydrogen is substituted with deuterium” may each be, for example, a group represented by one of Formulae 9-501 to 9-514 or 9-601 to 9-636:

9-501
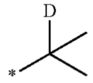
9-502
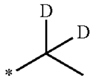
9-503
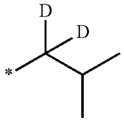
9-504
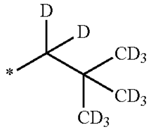
9-505
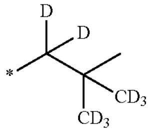
9-506
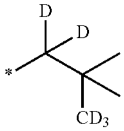
9-507
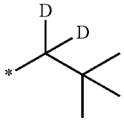
9-508
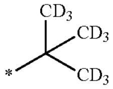
9-509
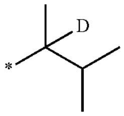
9-510
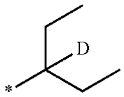
9-511
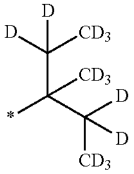
9-512
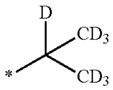
9-513
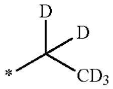
-continued
9-514
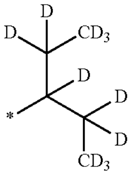
9-601
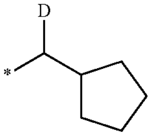
9-602
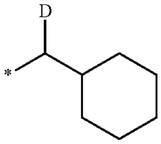
9-603
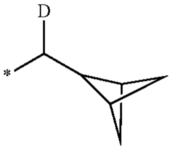
9-604
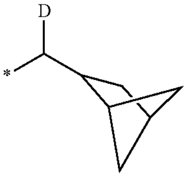
9-605
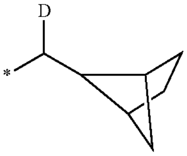
9-606
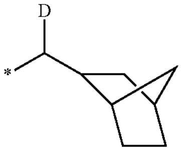
9-607
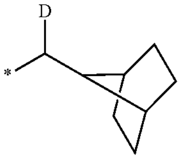
9-608
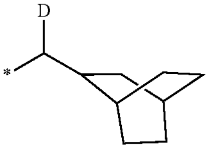

-continued
9-609
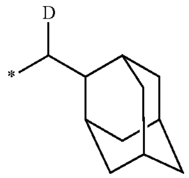
9-610
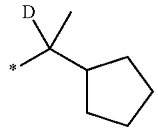
9-611
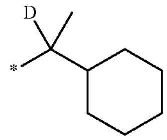
9-612
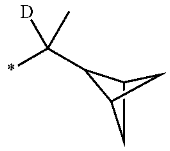
9-613
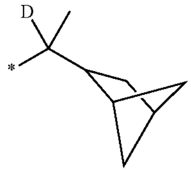
9-614
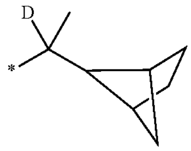
9-615
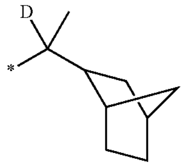
9-616
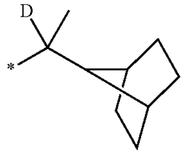
9-617
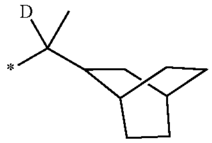
-continued
9-618
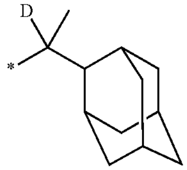
9-619
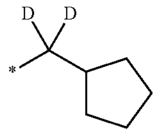
9-620
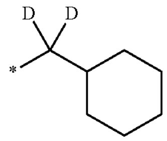
9-621
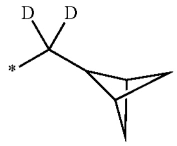
9-622
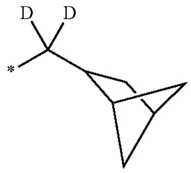
9-623
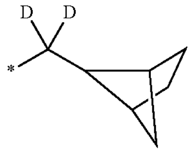
9-624
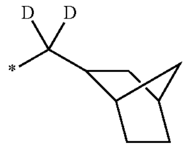
9-625
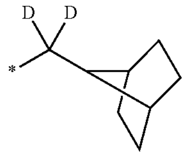
9-626
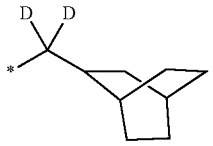
9-627
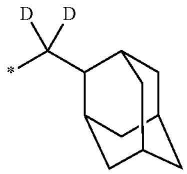

-continued 9-628

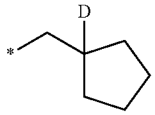

9-629

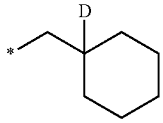

9-630

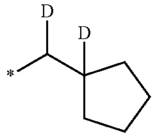

9-631

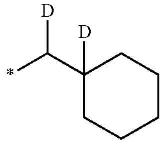

9-632

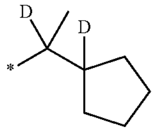

9-633

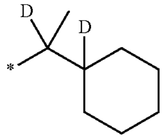

9-634

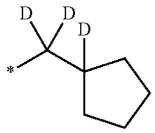

9-635

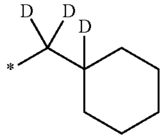

9-636

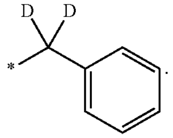

The "group represented by one of Formulae 9-1 to 9-39 in which at least one hydrogen is substituted with —F" and the "group represented by one of Formulae 9-201 to 9-237 in which at least one hydrogen is substituted with —F" may each be, for example, a group represented by one of Formulae 9-701 to 9-710:

9-701

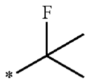

-continued 9-702

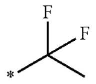

9-703

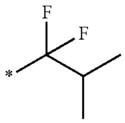

9-704

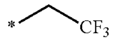

9-705

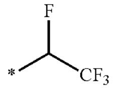

9-706

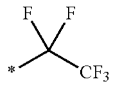

9-707

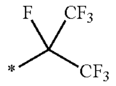

9-708

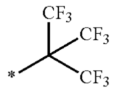

9-709

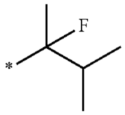

9-710

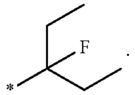

The "group represented by one of Formulae 10-1 to 10-129 in which at least one hydrogen is substituted with deuterium" and the "group represented by one of Formulae 10-201 to 10-350 in which at least one hydrogen is substituted with deuterium" may each be, for example, a group represented by one of Formulae 10-501 to 10-553:

10-501

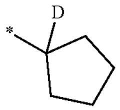

10-502

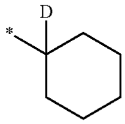

10-503

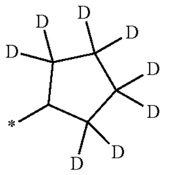

-continued
10-504
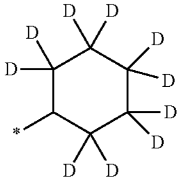
10-505
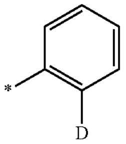
10-506
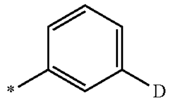
10-507
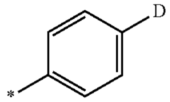
10-508
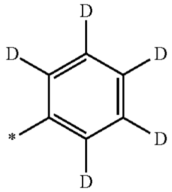
10-509
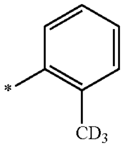
10-510
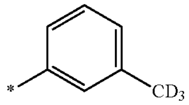
10-511
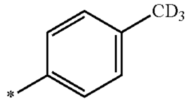
10-512
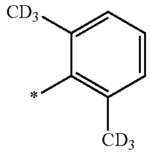
10-513
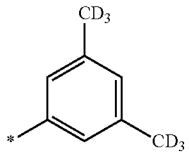
-continued
10-514
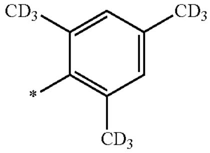
10-515
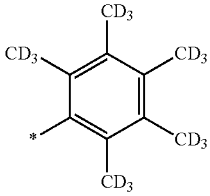
10-516
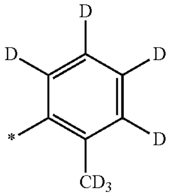
10-517
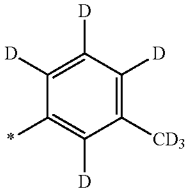
10-518
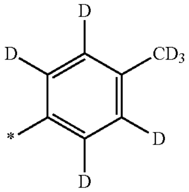
10-519
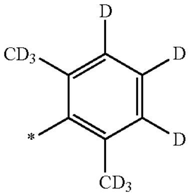
10-520
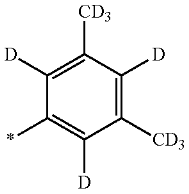
10-521
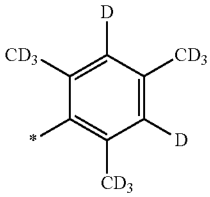

-continued
10-522
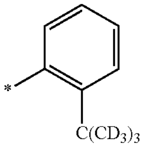
10-523
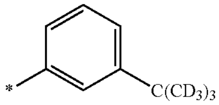
10-524
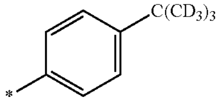
10-525
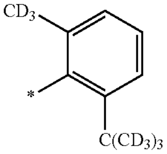
10-526
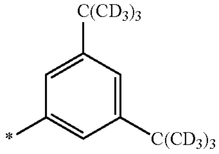
10-527
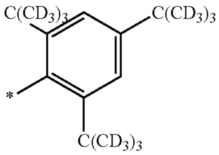
10-528
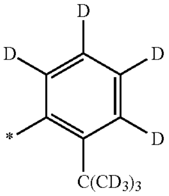
10-529
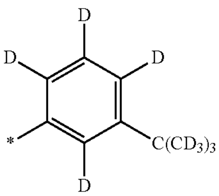
10-530
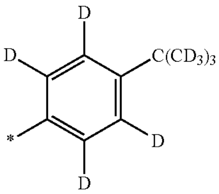
-continued
10-531
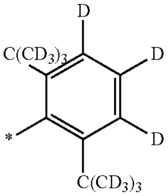
10-532
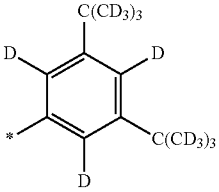
10-533
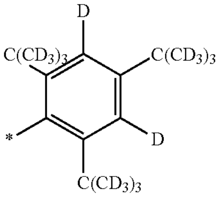
10-534
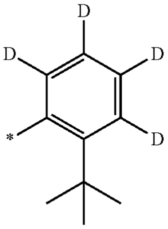
10-535
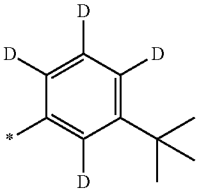
10-536
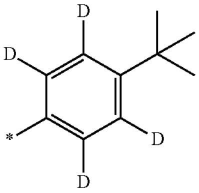
10-537
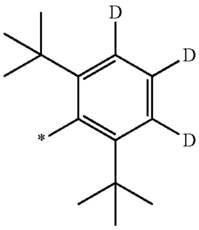

-continued
10-538
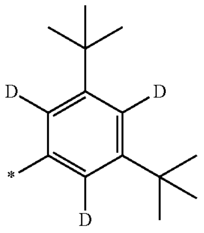
10-540
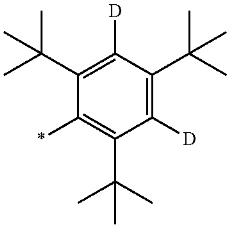
10-541
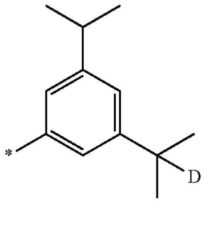
10-542
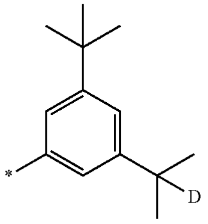
10-543
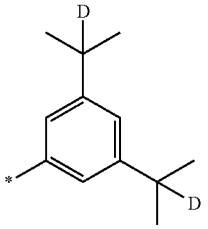
10-544
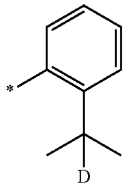
10-545
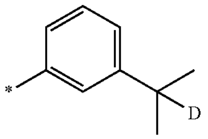
-continued
10-546
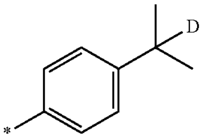
10-547
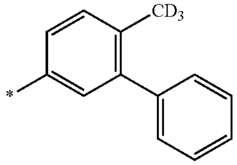
10-548
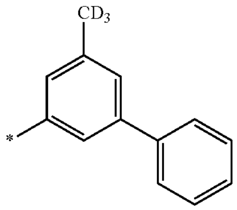
10-549
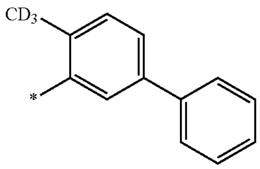
10-550
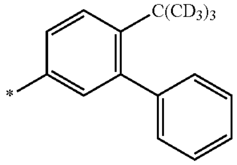
10-551
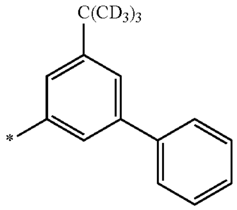
10-552
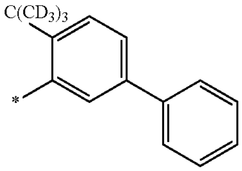
10-553
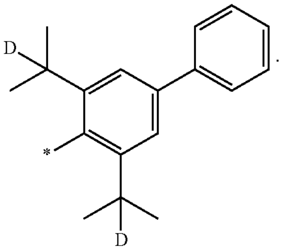
The "group represented by one of Formulae 10-1 to 10-129 in which at least one hydrogen is substituted with —F" and the "group represented by one of Formulae 10-201 to 10-350 in which at least one hydrogen is substituted with —F" may each be, for example, a group represented by one of Formulae 10-601 to 10-617:

10-601

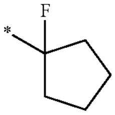

10-602

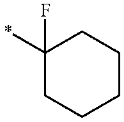

10-603

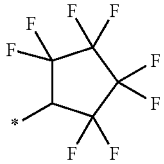

10-604

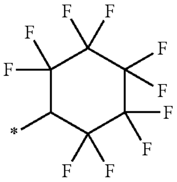

10-605

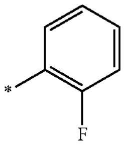

10-606

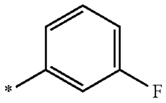

10-607

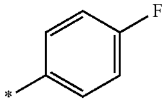

10-608

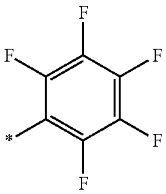

10-609

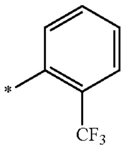

10-610

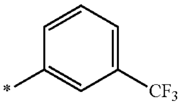

-continued 10-611

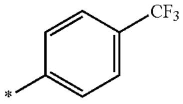

10-612

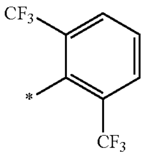

10-613

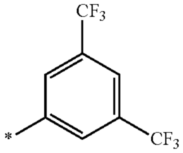

10-614

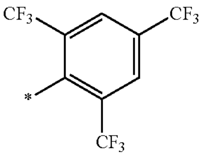

10-615

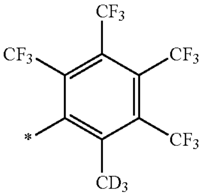

10-616

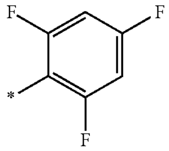

10-617

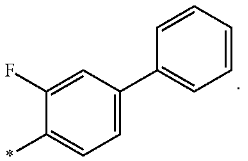

a1 and a2 in Formula 1 each indicates the number of $R_1$ groups and the number of $R_2$ groups, respectively, and are each independently an integer from 0 to 20. For example, a1 and a2 may each independently be 0, 1, 2, or 3.

In Formula 1, the following proviso applies to a1 and a2:

i) a1 is not 0, and at least one of $R_1$ is —Ge($Q_3$)($Q_4$)($Q_5$).

i) a2 is not 0, and at least one of $R_2$ is —Ge($Q_3$)($Q_4$)($Q_5$); or iii) a1 is not 0, and at least one of $R_1$ is —Ge($Q_3$)($Q_4$)($Q_5$), and a2 is not 0, and at least one of $R_2$ is —Ge($Q_3$)($Q_4$)($Q_5$). In other words, the organometallic compound represented by Formula 1 includes at least one group represented by the formula —Ge($Q_3$)($Q_4$)($Q_5$).

In one or more embodiments, a1 in Formula 1 may not be 0, and at least one of $R_1$ may be —Ge($Q_3$)($Q_4$)($Q_5$).

In one or more embodiments, a2 in Formula 1 may not be 0, and at least one of $R_2$ may be —Ge($Q_3$)($Q_4$)($Q_5$).

In one or more embodiments, the organometallic compound represented by Formula 1 may include two groups represented by the formula —Ge($Q_3$)($Q_4$)($Q_5$).

Meanwhile, the number of carbon atoms included in each of $R_{30a}$ and $R_{30b}$ in Formula 1 may each independently be 4 or greater, 5 or greater, or 6 or greater.

In one or more embodiments, $R_{30a}$ in Formula 1 may not be a methyl group.

In one or more embodiments, $R_{30b}$ in Formula 1 may not be a methyl group.

In one or more embodiments, $R_{30a}$ and $R_{30b}$ in Formula 1 may each not be a methyl group, simultaneously.

In one or more embodiments, $R_{30a}$ in Formula 1 may not be a tertiary butyl (tert-butyl) group.

In one or more embodiments, $R_{30b}$ in Formula 1 may not be a tert-butyl group.

In one or more embodiments, $R_{30a}$ and $R_{30b}$ in Formula 1 may not be a tert-butyl group, simultaneously.

In one or more embodiments, the organometallic compound represented by Formula 1 may satisfy one of Condition A1 to Condition A6:

Condition A1

$R_{30a}$ in Formula 1 is a group represented by *—C($R_{31}$)($R_{32}$)($R_{33}$), and each of $R_{31}$ to $R_{33}$ includes one or more carbon atoms;

Condition A2

$R_{30a}$ in Formula 1 is a group represented by *—C($R_{31}$)($R_{32}$)($R_{33}$), and each of $R_{31}$ and $R_{33}$ includes one or more carbon atoms, and $R_{32}$ is hydrogen, deuterium, or —F;

Condition A3

$R_{30a}$ in Formula 1 is a group represented by *—C($R_{31}$)($R_{32}$)($R_{33}$), and each of $R_{31}$ to $R_{33}$ includes at least one carbon atom, wherein at least one of $R_{31}$ to $R_{33}$ includes two or more carbon atoms;

Condition A4

$R_{30a}$ in Formula 1 is a group represented by *—C($R_{31}$)($R_{32}$)($R_{33}$), each of $R_{31}$ and $R_{33}$ includes one or more carbon atoms, wherein at least one of $R_{31}$ and $R_{33}$ includes two or more carbon atoms; and $R_{32}$ is hydrogen, deuterium, or —F;

Condition A5

$R_{30a}$ in Formula 1 is a group represented by *—C($R_{31}$)($R_{32}$)($R_{33}$); and $R_{31}$ to $R_{33}$ are each independently hydrogen, deuterium, or —F, wherein at least one of $R_{31}$ to $R_{33}$ is deuterium or —F;

Condition A6

$R_{30a}$ in Formula 1 is a substituted or unsubstituted $C_3$-$C_{10}$ cycloalkyl group, a substituted or unsubstituted $C_1$-$C_{60}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, or a substituted or unsubstituted monovalent non-aromatic condensed heteropolycyclic group.

In one or more embodiments, the organometallic compound represented by Formula 1 may satisfy one of Condition B1 to Condition B6:

Condition B1

$R_{30b}$ in Formula 1 is a group represented by *—C($R_{34}$)($R_{35}$)($R_{36}$), and each of $R_{34}$ to $R_{36}$ includes one or more carbon atoms;

Condition B2

$R_{30b}$ in Formula 1 is a group represented by *—C($R_{34}$)($R_{35}$)($R_{36}$);

each of $R_{34}$ and $R_{36}$ includes one or more carbon atoms, and $R_{35}$ is hydrogen, deuterium, or —F;

Condition B3

$R_{30b}$ in Formula 1 is a group represented by *—C($R_{34}$)($R_{35}$)($R_{36}$); and each of $R_{34}$ to $R_{36}$ includes one or more carbon atoms, wherein at least one of $R_{34}$ to $R_{36}$ includes two or more carbon atoms;

Condition B4

$R_{30b}$ in Formula 1 is a group represented by *—C($R_{34}$)($R_{35}$)($R_{36}$), each of $R_{34}$ and $R_{36}$ includes one or more carbon atoms, wherein at least one of $R_{34}$ and $R_{36}$ includes two or more carbon atoms, and $R_{35}$ is hydrogen, deuterium, or —F;

Condition B5

$R_{30b}$ in Formula 1 is a group represented by *—C($R_{34}$)($R_{35}$)($R_{36}$), and $R_{34}$ to $R_{36}$ are each independently hydrogen, deuterium, or —F, wherein at least one of $R_{34}$ to $R_{36}$ is deuterium or —F;

Condition B6

$R_{30b}$ in Formula 1 is a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, or a substituted or unsubstituted monovalent non-aromatic condensed heteropolycyclic group.

In one or more embodiments, a group represented by

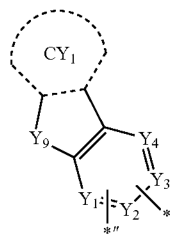

in Formula 1 may be a group represented by one of Formulae CY1(1) to CY1(6):

CY1(1)

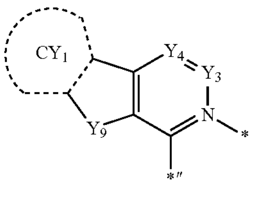

-continued

CY1(2)

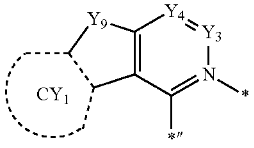

CY1(3)

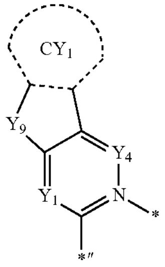

CY1(4)

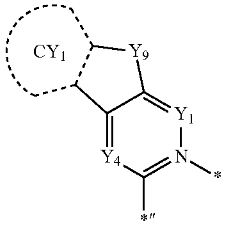

CY1(5)

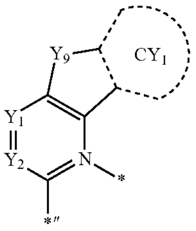

CY1(6)

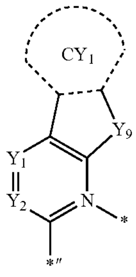

wherein, in Formulae CY1(1) to CY1(6), $Y_9$ and ring $CY_1$ may each be as described herein, $Y_1$ to $Y_4$ may each independently be C or N,

* may indicate a binding site to iridium in Formula 1, and

*" may indicate a binding site to ring $CY_2$ in Formula 1.

For example, $Y_1$ to $Y_4$ in Formulae CY1(1) to CY1(6) may each be C.

In one or more embodiments, a group represented by

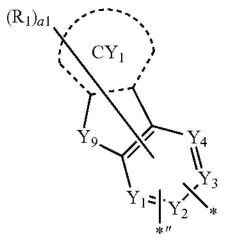

in Formula 1 may be a group represented by one of Formulae CY1-1 to CY1-6:

CY1-1

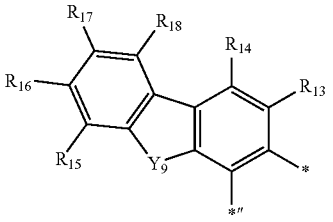

CY1-2

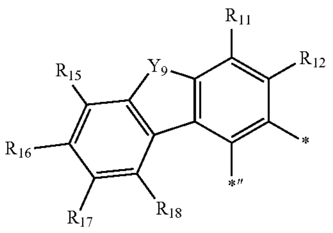

CY1-3

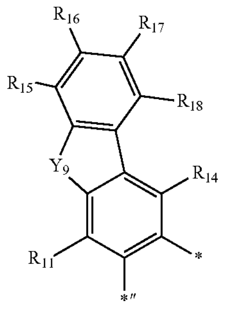

CY1-4

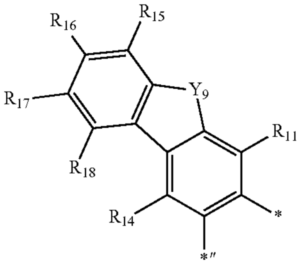

-continued

CY1-5

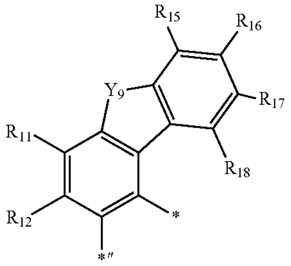

CY1-6

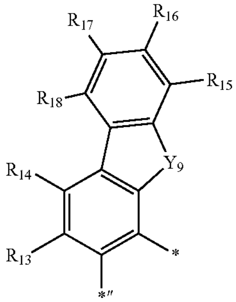

wherein, in Formulae CY1-1 to CY1-6, $Y_9$ may be as described in the present specification, $R_{11}$ to $R_{18}$ may each be as described in connection with $R_1$, $R_{11}$ and $R_{12}$ may optionally be linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $R_{13}$ and $R_{14}$ may optionally be linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_{15}$ to $R_{18}$ may optionally be linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $R_{10a}$ may be as described in connection with $R_1$,

* may indicate a binding site to iridium in Formula 1, and

*" may indicate a binding site to ring $CY_2$ in Formula 1.

For example, at least one of $R_{13}$, $R_{14}$, $R_{15}$, $R_{16}$, $R_{17}$, and $R_{18}$ in Formulae CY1-1 and CY1-6 may be —Ge($Q_3$)($Q_4$)($Q_5$), at least one of $R_{11}$, $R_{12}$, $R_{15}$, $R_{16}$, $R_{17}$, and $R_{18}$ in Formulae CY1-2 and CY1-5 may be —Ge($Q_3$)($Q_4$)($Q_5$), and at least one of $R_{11}$, $R_{14}$, $R_{15}$, $R_{16}$, $R_{17}$, and $R_{18}$ in Formulae CY1-3 and CY1-4 may be —Ge($Q_3$)($Q_4$)($Q_5$).

As another example, $R_{15}$ in Formulae CY1-1 to CY1-6 may not be hydrogen.

In one or more embodiments, a group represented by

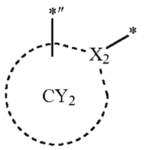

in Formula 1 may be a group represented by one of Formulae CY2(1) to CY2(22) (for example, a group represented by one of Formulae CY2(1) to CY2(21)):

CY2(1)

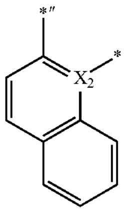

CY2(1)

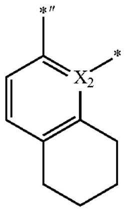

CY2(3)

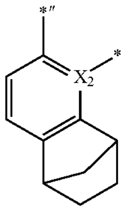

CY2(4)

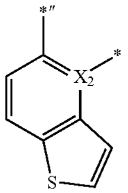

CY2(5)

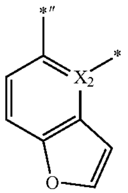

CY2(6)

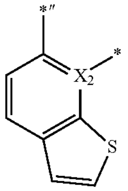

-continued
CY2(7)
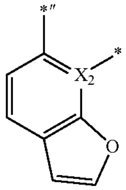
CY2(8)
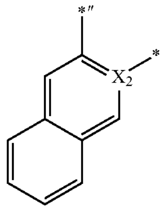
CY2(9)
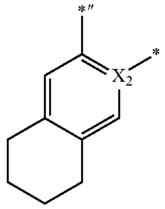
CY2(10)
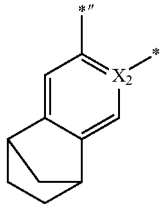
CY2(11)
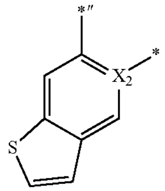
CY2(12)
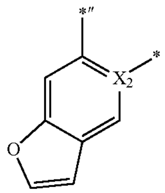
CY2(13)
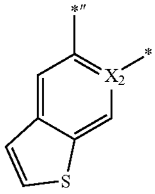
-continued
CY2(14)
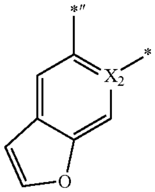
CY2(15)
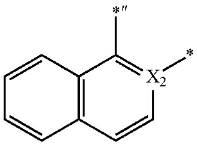
CY2(16)
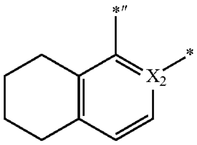
CY2(17)
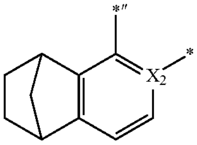
CY2(18)
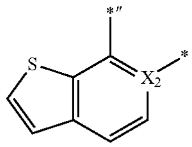
CY2(19)
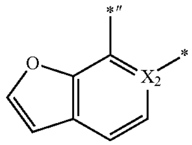
CY2(20)
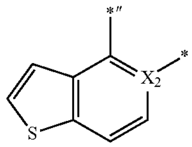
CY2(21)
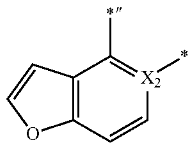
CY2(22)
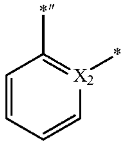
wherein, in Formulae CY2(1) to CY2(22),
$X_2$ may be as described herein,
* may indicate a binding site to iridium in Formula 1, and
*" may indicate a binding site to one of $Y_1$ to $Y_4$ in Formula 1.

In one or more embodiments, a group represented by

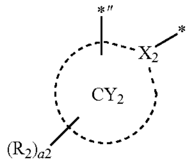

in Formula 1 may be a group represented by one of Formulae CY2-1 to CY2-6:

CY2-1

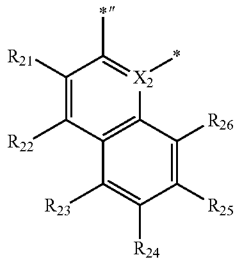

CY2-2

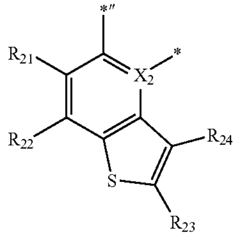

CY2-3

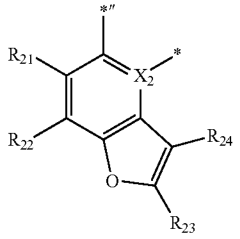

CY2-4

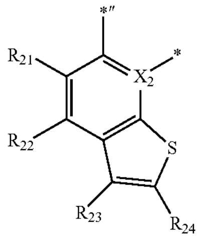

CY2-5

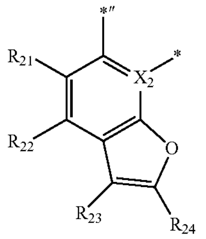

-continued

CY2-6

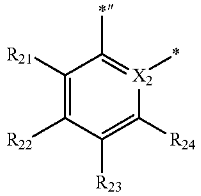

wherein, in Formulae CY2-1 to CY2-6, $X_2$ may be as described herein, $R_{21}$ to $R_{26}$ may each be as described in connection with $R_2$, two or more of $R_{21}$ to $R_{26}$ may optionally be linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $R_{10a}$ a may be as described in connection with $R_1$,

* may indicate a binding site to iridium in Formula 1, and

*" may indicate a binding site to one of $Y_1$ to $Y_4$ in Formula 1.

For example, at least one of $R_{21}$ to $R_{26}$ in Formula CY2-1 may be —Ge($Q_3$)($Q_4$)($Q_5$), and at least one of $R_{21}$ to $R_{24}$ in Formulae CY2-2 to CY2-6 may be —Ge($Q_3$)($Q_4$)($Q_5$).

In one or more embodiments, at least one of $R_{21}$ to $R_{26}$ in Formula CY2-1 may not be hydrogen, and at least one of $R_{21}$ to $R_{24}$ in Formulae CY2-2 to CY2-6 may not be hydrogen.

In one or more embodiments, a group represented by

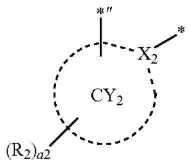

in Formula 1 may be a group represented by one of Formulae CY2-A to CY2-E:

CY2-A

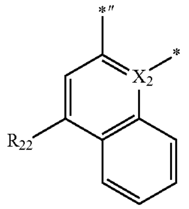

CY2-B

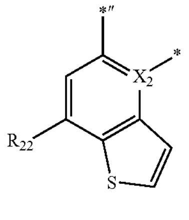

-continued

CY2-C

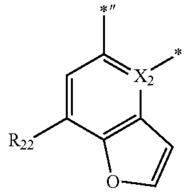

CY2-D

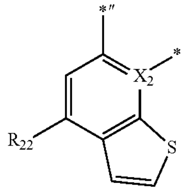

CY2-E

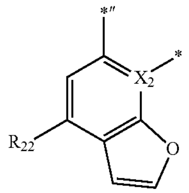

wherein, in Formulae CY2-A to CY2-E, $X_2$ may be as described in the present specification, and $R_{22}$ may be:

a $C_1$-$C_{20}$ alkyl group that is unsubstituted or substituted with at least one of deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, or a combination thereof;

a $C_3$-$C_{10}$ cycloalkyl group, a phenyl group, or a biphenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, or a combination thereof; or —Si($Q_3$)($Q_4$)($Q_5$) or —Ge($Q_3$)($Q_4$)($Q_5$),

* may indicate a binding site to iridium in Formula 1, and

*" may indicate a binding site to one of $Y_1$ to $Y_4$ in Formula 1.

In one or more embodiments, the organometallic compound may be represented by at least one of Formulae 1-1 or 1-2:

Formula 1-1

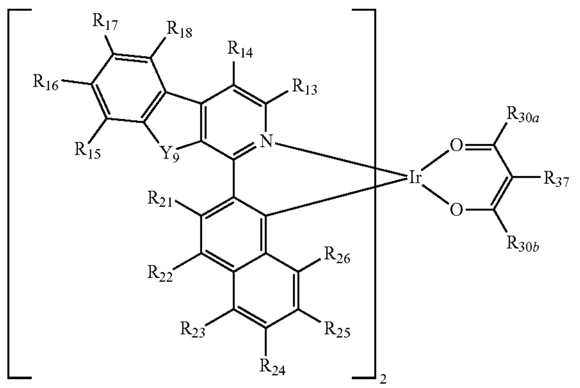

Formula 1-2

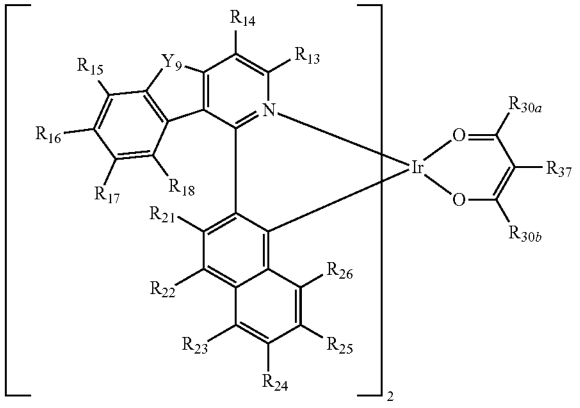

wherein, in Formulae 1-1 and 1-2, $Y_9$, $R_{30a}$, $R_{30b}$, and $R_{37}$ may each be as described in the present specification, $R_{11}$ to $R_{18}$ may each be as described in connection with $R_1$, $R_{21}$ to $R_{26}$ may each be as described in connection with $R_2$, at least one of $R_{13}$, $R_{14}$, $R_{15}$, $R_{16}$, $R_{17}$, $R_{18}$, $R_{21}$, $R_{22}$, $R_{23}$, $R_{24}$, $R_{25}$, and $R_{26}$ in Formula 1-1 may be —Ge($Q_3$)($Q_4$)($Q_5$), at least one of $R_{11}$, $R_{12}$, $R_{15}$, $R_{16}$, $R_{17}$, $R_{18}$, $R_{21}$, $R_{22}$, $R_{23}$, $R_{24}$, $R_{25}$, and $R_{26}$ in Formula 1-2 may be —Ge($Q_3$)($Q_4$)($Q_5$), two or more of $R_{11}$ to $R_{18}$ may optionally be linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_{21}$ to $R_{26}$ may optionally be linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_{30a}$, $R_{30b}$, and $R_{37}$ may optionally be linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, and $R_{10a}$ may be as described in connection with $R_1$ herein.

In one or more embodiments, $R_{37}$ in Formula 1 may be hydrogen or deuterium.

In one or more embodiments, $R_{30a}$ and $R_{30b}$ in Formula 1 may be identical to each other.

In one or more embodiments, $R_{30a}$ and $R_{30b}$ in Formula 1 may be different from each other.

In one or more embodiments, Formula 1 may include at least one deuterium.

In one or more embodiments, Formula 1 may include at least one fluoro group (—F).

In one or more embodiments, at least one of $R_1$(s) in the number of a1 in Formula 1 may include a fluoro group (—F).

In one or more embodiments, $R_1$ in Formula 1 may not include a fluoro group (—F).

In one or more embodiments, at least one of $R_2$ in Formula 1 may include a fluoro group (—F).

In one or more embodiments, $R_2$ in Formula 1 may not include a fluoro group (—F).

In Formulae, i) two or more of a plurality of $R_1$ are optionally be linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, ii) two or more of a plurality of $R_2$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, iii) two or more of $R_1$ and $R_2$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, and/or iv) two or more of $R_{30a}$, $R_{30b}$, and $R_{37}$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$. In some embodiments, two or more of $R_{31}$ to $R_{33}$ may optionally be linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, and/or two or more of $R_{34}$ to $R_{36}$ may optionally be linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$. $R_{10a}$ may be as described in connection with $R_1$.

In one or more embodiments, the organometallic compound represented by Formula 1 may emit a red light or a green light, for example, a red light or a green light having a maximum emission wavelength of about 500 nanometers (nm) or greater, or about 500 nm to about 730 nm.

In one or more embodiments, the organometallic compound represented by Formula 1 may emit a red light, for example, a red light having a maximum emission wavelength of about 580 nm to about 730 nm, or about 600 nm to about 730 nm.

In one or more embodiments, the organometallic compound represented by Formula 1 may emit a light having a maximum emission wavelength of about 525 nm to about 650 nm, about 550 nm to about 650 nm, about 575 nm to about 650 nm, about 600 nm to about 650 nm, about 610 nm to about 645 nm, or about 620 nm to about 645 nm.

In one or more embodiments, the organometallic compound represented by Formula 1 may emit a light having a full width at half maximum (FWHM) of about 25 nm to about 50 nm, about 30 nm to about 45 nm, or about 30 nm to about 43 nm.

In one or more embodiments, the organometallic compound may be at least one of Compounds 1 to 33:

1

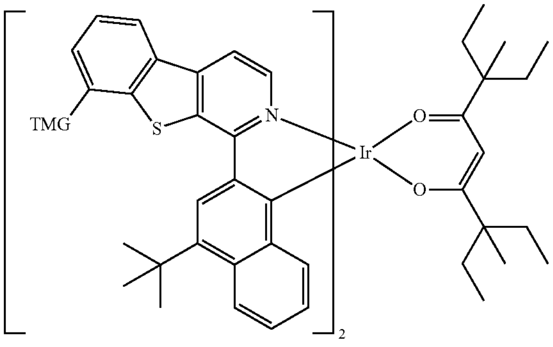

2

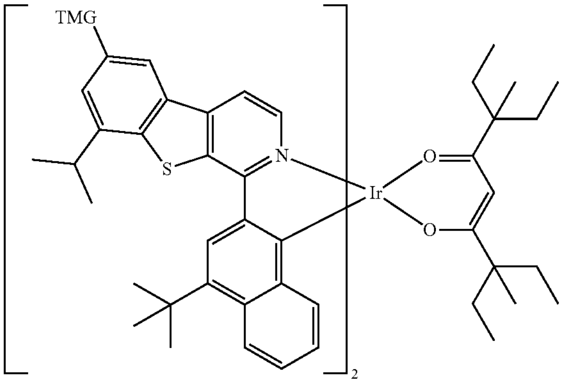

3

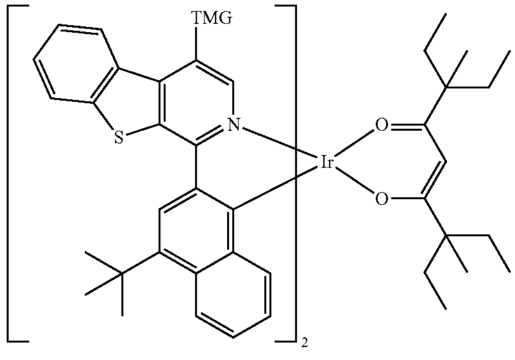

4

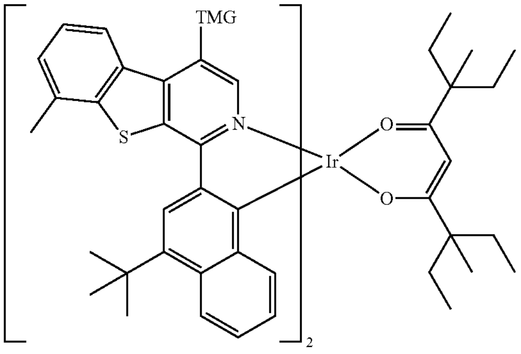

-continued
5
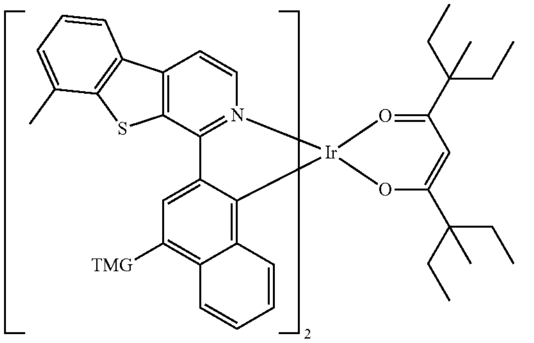
6
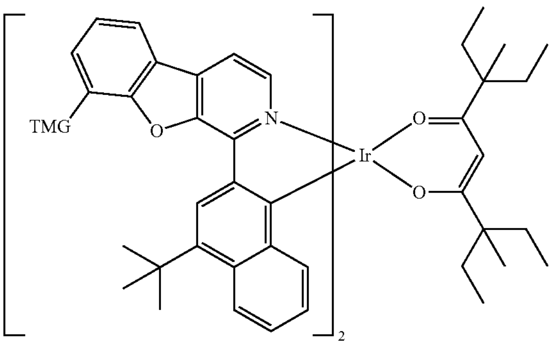
7
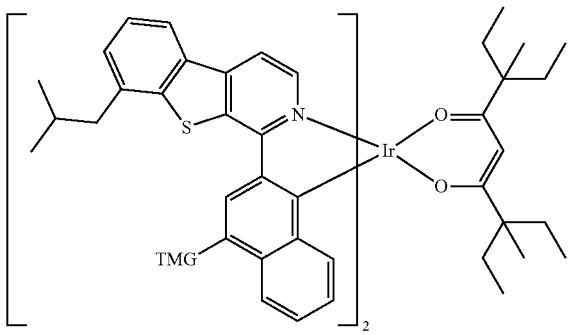
8
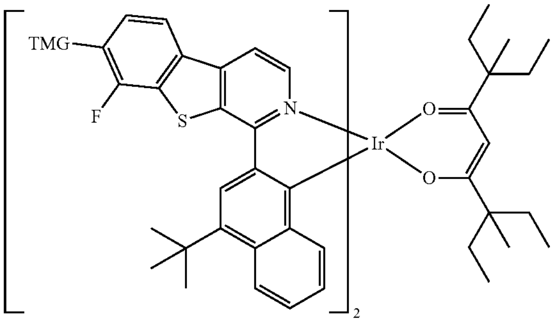
-continued
9
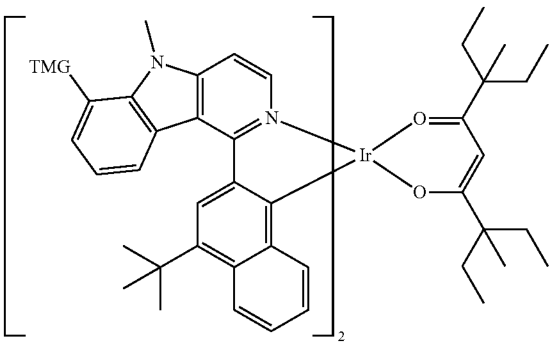
10
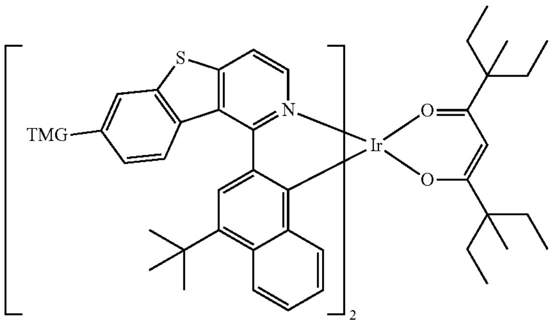
11
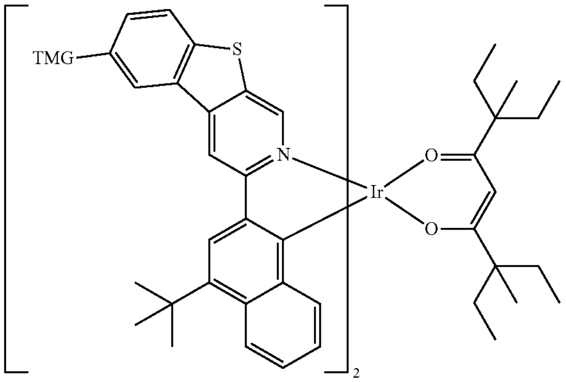
12
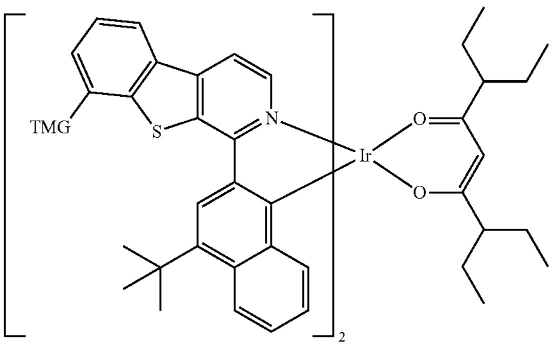

-continued
13
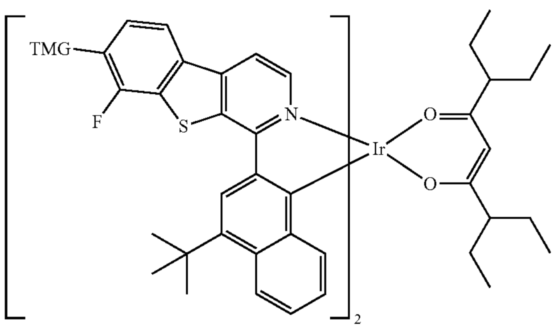
14
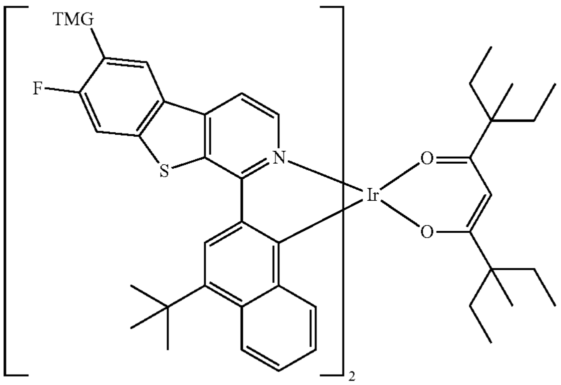
15
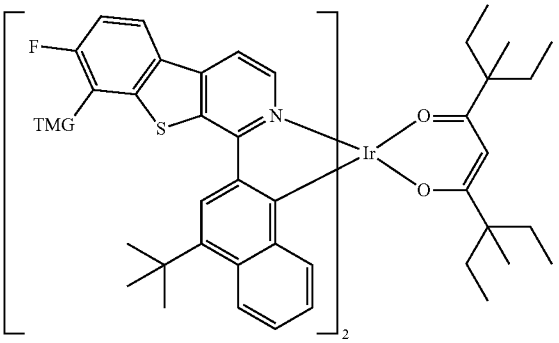
16
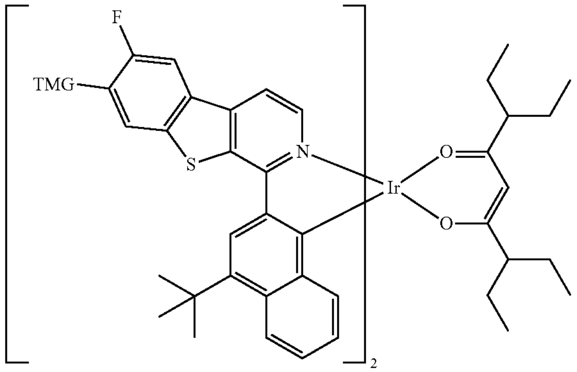
-continued
17
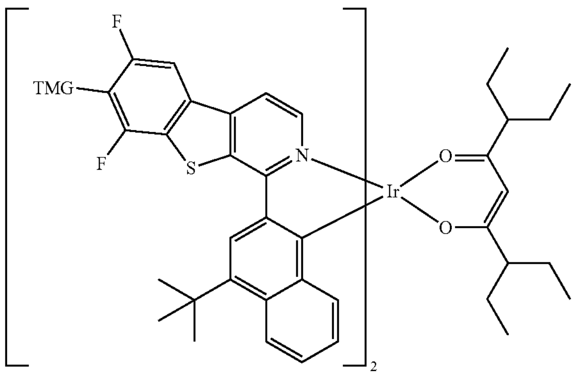
18
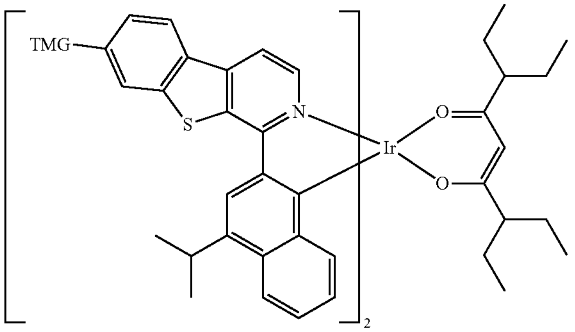
19
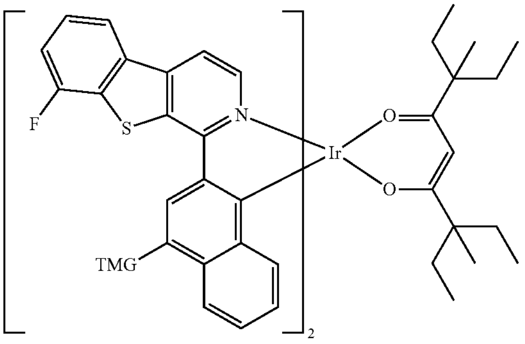
20
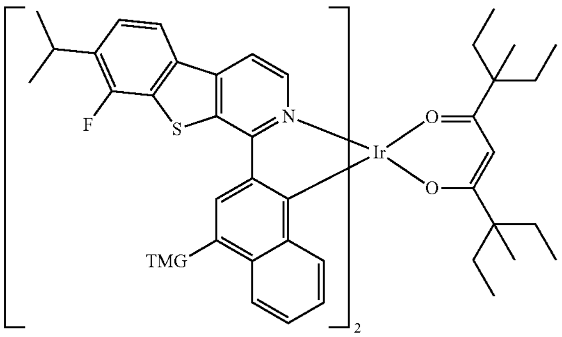

-continued
21
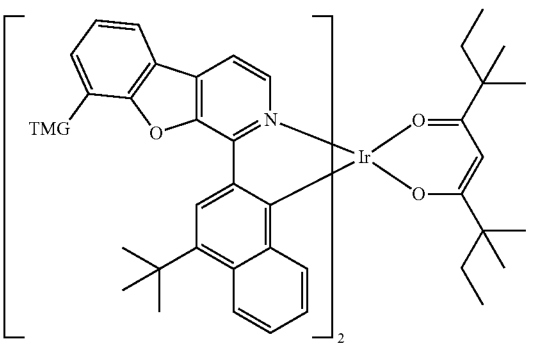
22
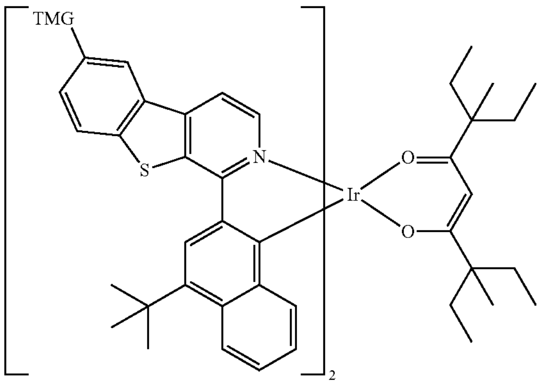
23
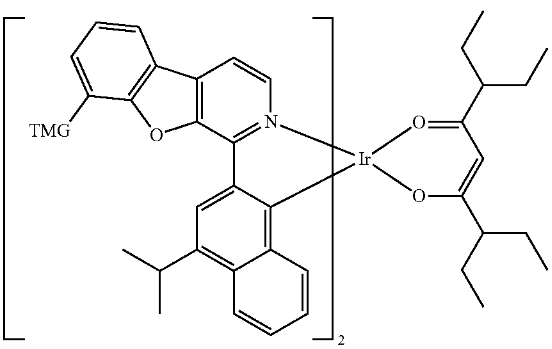
24
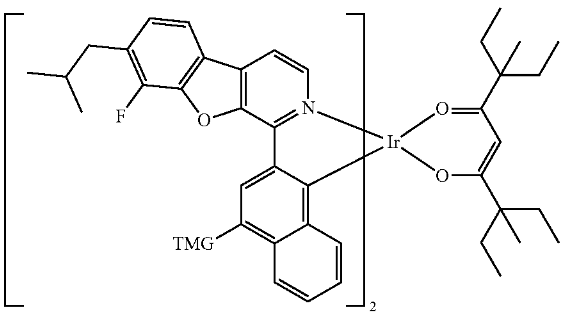
-continued
25
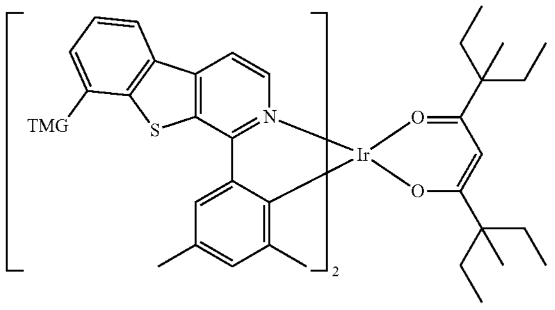
26
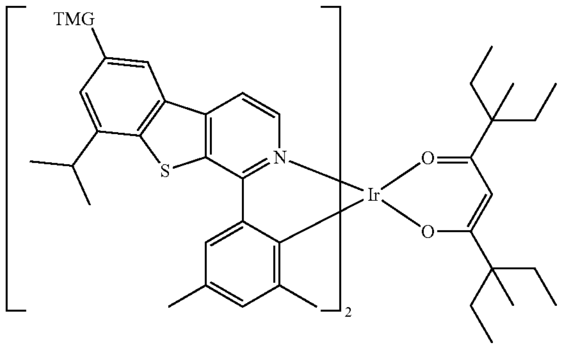
27
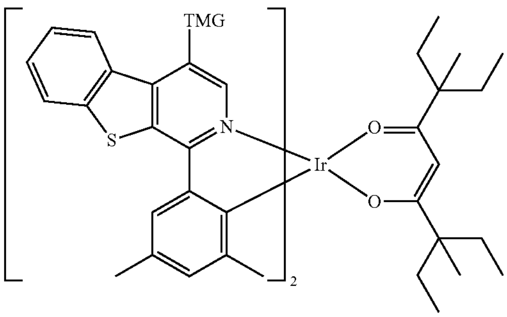
28
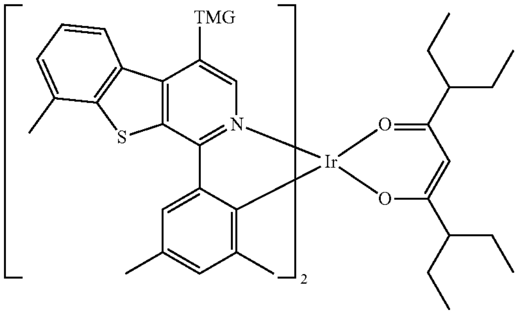

-continued

29

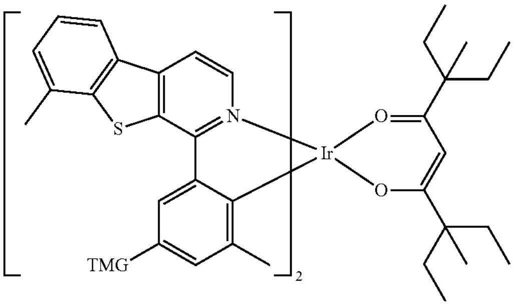

30

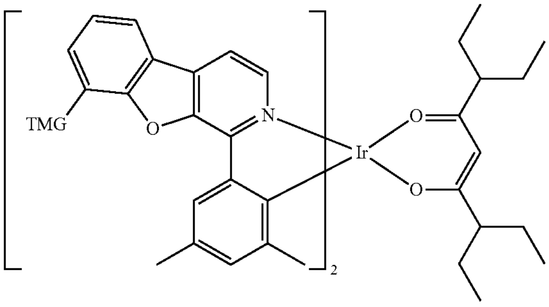

31

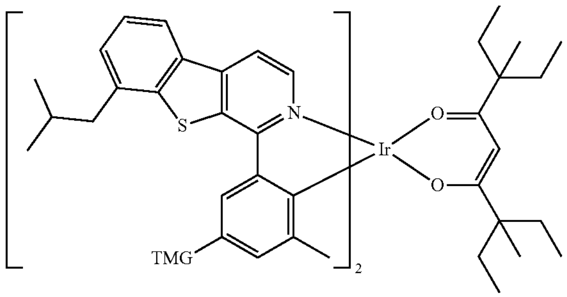

32

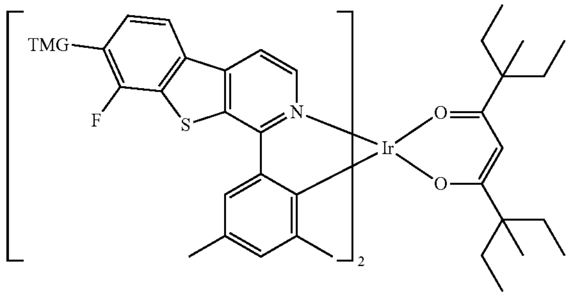

33

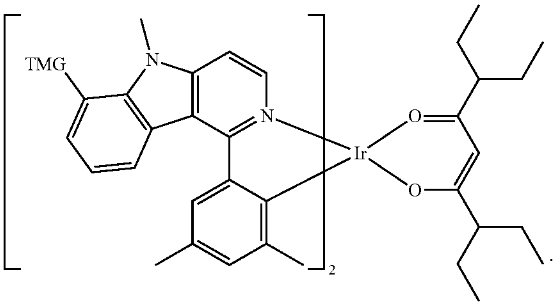

"TMG" in Compounds 1 to 33 may be trimethylgermyl group.

The organometallic compound represented by Formula 1 includes a group represented by

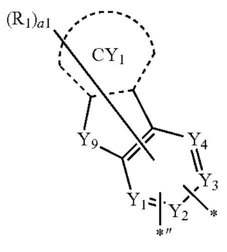

as described herein. In addition, in Formula 1, i) a1 is not 0, and at least one of $R_1$ is —Ge($Q_3$)($Q_4$)($Q_5$).

i) a2 is not 0, and at least one of $R_2$ is —Ge($Q_3$)($Q_4$)($Q_5$); or iii) a1 is not 0, and at least one of $R_1$ is —Ge($Q_3$)($Q_4$)($Q_5$), and a2 is not 0, and at least one of $R_2$ is —Ge($Q_3$)($Q_4$)($Q_5$). Accordingly, due to increase in hyper-conjugation of a pi-bond of a ligand represented by

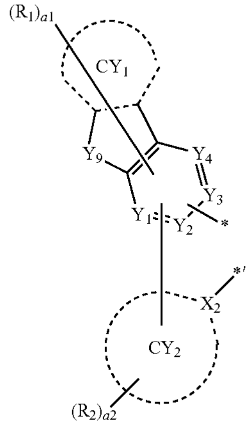

and Ge in a group represented by —Ge($Q_3$)($Q_4$)($Q_5$), the amount of metal to ligand charge transfer may be increased. Accordingly, the PLQY and degree of orientation of the organometallic compound represented by Formula 1 may be increased and non-emission transition may be decreased, thereby increasing out-coupling, which is an external emission efficiency factor. Thus, emission efficiency of an electronic device, for example, a light-emitting device, including the organometallic compound may be improved.

A highest occupied molecular orbital (HOMO) energy level, a lowest unoccupied molecular orbital (LUMO) energy level, and a triplet ($T_1$) energy level of some compounds of the organometallic compound represented by Formula 1 were calculated using a density functional theory (DFT) method of the Gaussian 09 program with the molecular structure optimized at the B3LYP level, and results thereof are shown in Table 1. The energy levels are expressed in electron volts (eV).

TABLE 1

| Compound No. | HOMO (eV) | LUMO (eV) | $T_1$ (eV) |
|---|---|---|---|
| 1 | −5.220 | −2.092 | 1.991 |
| 4 | −5.194 | −2.022 | 1.995 |
| 7 | −5.289 | −2.132 | 2.016 |
| 8 | −5.203 | −2.109 | 1.977 |
| 10 | −5.175 | −1.982 | 1.978 |
| 14 | −5.203 | −2.103 | 1.978 |
| 15 | −5.238 | −2.121 | 1.987 |
| 18 | −5.189 | −2.094 | 1.972 |
| 19 | −5.311 | −2.206 | 2.001 |
| 22 | −5.188 | −2.073 | 1.982 |

From Table 1, it was confirmed that the organometallic compound represented by Formula 1 has suitable electrical characteristics for use as a dopant in an electronic device, for example, a light-emitting device.

For example, in one or more embodiments, an absolute value of a HOMO energy level of the organometallic compound represented by Formula 1 may be about 5.100 eV to about 5.400 eV, for example, about 5.175 eV to about 5.311 eV.

In one or more embodiments, an absolute value of a LUMO energy level of the organometallic compound represented by Formula 1 may be about 1.900 eV to about 2.300 eV, for example, about 1.982 eV to about 2.206 eV.

For example, a $T_1$ energy level of the organometallic compound represented by Formula 1 may be about 1.900 eV to about 2.100 eV, for example, about 1.972 eV to about 2.016 eV.

A method of synthesizing the organometallic compound represented by Formula 1 may be apparent to one of ordinary skill in the art and by referring to Synthesis Examples provided herein.

Therefore, the organometallic compound represented by Formula 1 may be suitable for use as a dopant in an organic layer of an organic light-emitting device, for example, an emission layer in the organic layer. Thus, according to one or more embodiments, there is provided a light-emitting device (for example, an organic light-emitting device) including a first electrode; a second electrode; and an organic layer arranged between the first electrode and the second electrode, wherein the organic layer includes an emission layer, and wherein the organic layer further includes at least one organometallic compound represented by Formula 1.

The light-emitting device has the organic layer including at least one of the organometallic compounds represented by Formula 1 as described herein, and thus, may have excellent driving voltage, excellent external quantum efficiency, FWHM of a relatively narrow EL spectrum emission peak, and excellent lifespan characteristics.

The organometallic compound represented by Formula 1 may be used between a pair of electrodes of the light-emitting device. For example, the emission layer may include at least one of the organometallic compounds represented by Formula 1. For example, the organometallic compound may serve as a dopant and the emission layer may further include a host (in other words, an amount (for example, a weight) of the at least one organometallic compound represented by Formula 1 in the emission layer may be less than an amount (for example, a weight) of the host in the emission layer). For example, an amount of the host in the emission layer may be greater than an amount of the at least one organometallic compound represented by Formula 1 in the emission layer.

The emission layer (or the light-emitting device including the emission layer) including the at least one organometallic compound represented by Formula 1 may emit a red light or a green light, for example, a red light or a green light having a maximum emission wavelength of about 500 nm or greater, for example, about 500 nm to about 730 nm. For example, the emission layer may emit a red light, for example, a red light having a maximum emission wavelength of about 580 nm to about 730 nm, or about 600 nm to about 730 nm.

In one or more embodiments, the emission layer (or the light-emitting device including the emission layer) including the at least one organometallic compound represented by Formula 1 may emit a light having a maximum emission wavelength of about 525 nm to about 650 nm, about 550 nm to about 650 nm, about 575 nm to about 650 nm, about 600 nm to about 650 nm, about 610 nm to about 645 nm, or about 620 nm to about 645 nm.

In one or more embodiments, the emission layer (or the light-emitting device including the emission layer) including the at least one organometallic compound represented by Formula 1 may emit a light having FWHM of about 25 nm to about 50 nm, about 30 nm to about 45 nm, or about 30 nm to about 43 nm.

The maximum emission wavelength and FWHM may be evaluated from an EL spectrum of the light-emitting device.

In one or more embodiments, the emission layer (or the light-emitting device including the emission layer) including the at least one organometallic compound represented by Formula 1 may emit a red light.

The wording "(organic layer) includes at least one organometallic compound(s)" used herein may be to mean that the (organic layer) may include one kind of organometallic compound represented by Formula 1 or two or more different kinds of organometallic compound, each represented by Formula 1.

For example, the organic layer may include Compound 1 only as the organometallic compound. In this regard, Compound 1 may be present in the emission layer of the light-emitting device. Alternatively, the organic layer may include Compound 1 and Compound 2 as the organometallic compound. At this time, Compound 1 and Compound 2 may be present in an identical layer (for example, both Compound 1 and Compound 2 may be present in the emission layer).

The first electrode may be an anode, which is a hole injection electrode, and the second electrode may be a cathode, which is an electron injection electrode. Alternatively, the first electrode may be a cathode, which is an electron injection electrode, and the second electrode may be an anode, which is a hole injection electrode.

For example, in the light-emitting device, the first electrode may be an anode, the second electrode may be a cathode, the organic layer may further include a hole transport region arranged between the first electrode and the emission layer and an electron transport region arranged between the emission layer and the second electrode, the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" as used herein refers to a single layer and/or a plurality of layers arranged between the first electrode and the second electrode of the light-emitting device. The "organic layer" may include not only organic compounds but also may include organometallic complexes including metals.

The FIGURE is a schematic cross-sectional view of an organic light-emitting device 10 which is a light-emitting device, according to one or more embodiments. Hereinafter, the structure and manufacturing method of the organic light-emitting device 10 according to one or more embodiments will be described in further detail with reference to the FIGURE. The organic light-emitting device 10 has a structure in which a first electrode 11, an organic layer 15, and a second electrode 19 are sequentially stacked in this stated order.

A substrate may be additionally disposed under the first electrode 11 or on the second electrode 19. For use as the substrate, any substrate that is used in organic light-emitting devices available in the art may be used, and for example, a glass substrate or a transparent plastic substrate, each having excellent mechanical strength, thermal stability, transparency, surface smoothness, ease of handling, and/or water resistance, may be used.

The first electrode 11 may be, for example, formed by depositing or sputtering a material for forming the first electrode 11 on the substrate. The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may include indium tin oxide (ITO), indium zinc oxide (IZO), tin oxide ($SnO_2$), zinc oxide (ZnO), or a combination thereof. Alternatively, the material for forming the first electrode 11 may include magnesium (Mg), aluminum (Al), silver (Ag), aluminum-lithium (Al—Li), calcium (Ca), magnesium-indium (Mg—In), magnesium-silver (Mg—Ag), or a combination thereof.

The first electrode 11 may have a single-layered structure or a multi-layered structure including two or more layers. For example, the first electrode 11 may have a three-layered structure of ITO/Ag/ITO.

The organic layer 15 is disposed on the first electrode 11.

The organic layer 15 may include a hole transport region, an emission layer, an electron transport region, or a combination thereof.

The hole transport region may be arranged between the first electrode 11 and the emission layer.

The hole transport region may include a hole injection layer, a hole transport layer, an electron blocking layer, a buffer layer, or a combination thereof.

The hole transport region may include a hole injection layer only or a hole transport layer only. Alternatively, the hole transport region may have a hole injection layer/hole transport layer structure or a hole injection layer/hole transport layer/electron blocking layer structure, wherein, for each structure, respective layer are sequentially stacked in this stated order from the first electrode 11.

When the hole transport region includes a hole injection layer, the hole injection layer may be formed on the first electrode 11 by using various methods, such as vacuum deposition, spin coating, casting, Langmuir-Blodgett (LB) deposition, or the like.

When the hole injection layer is formed by vacuum deposition, the deposition conditions may vary depending on a material that is used to form the hole injection layer, and the structure and thermal characteristics of the hole injection layer. For example, the deposition conditions may include a deposition temperature of about 100° C. to about 500° C., a vacuum degree in a range of about $10^{-8}$ torr to about $10^{-3}$ torr, and a deposition rate of about 0.01 angstroms per second (Å/sec) to about 100 Å/sec.

When the hole injection layer is formed by spin coating, the coating conditions may vary depending on a material that is used to form the hole injection layer, and the structure and thermal characteristics of the hole injection layer. For example, the coating conditions may include a coating speed of about 2,000 revolutions per minute (rpm) to about 5,000 rpm and a heat treatment of about 80° C. to about 200° C. for removing a solvent after coating.

Conditions for forming the hole transport layer and the electron blocking layer may be similar to or the same as the conditions for forming the hole injection layer.

The hole transport region may include at least one of 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), N,N'-di(1-naphthyl)-N,N'-diphenylbenzidine (NPB), p-NPB, N,N'-bis(3-methylphenyl)-N,N'-diphenyl-[1,1-biphenyl]-4,4'-diamine (TPD), spiro-TPD, spiro-NPB, methylated NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, a compound represented by Formula 202, or a combination thereof, but embodiments are not limited thereto:

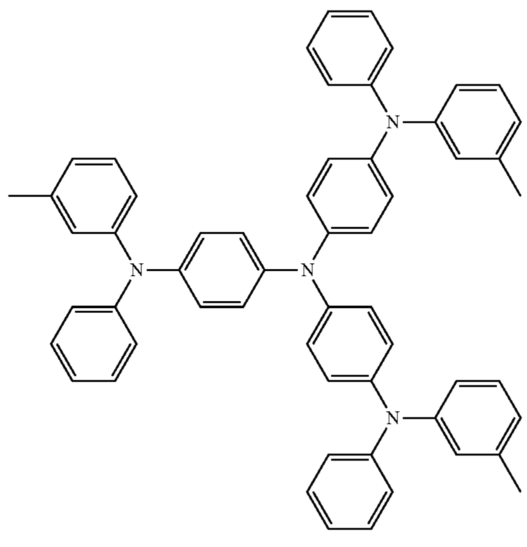

m-MTDATA

-continued
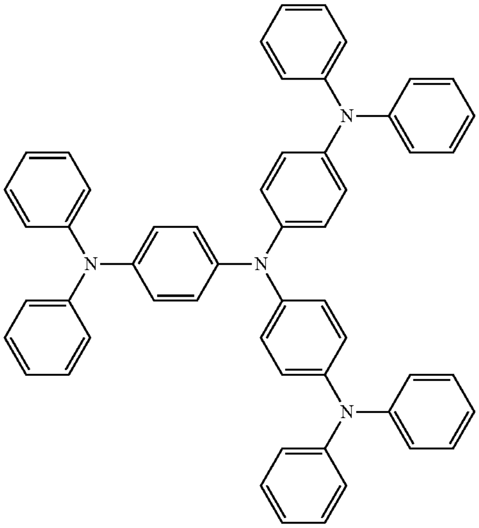
TDATA
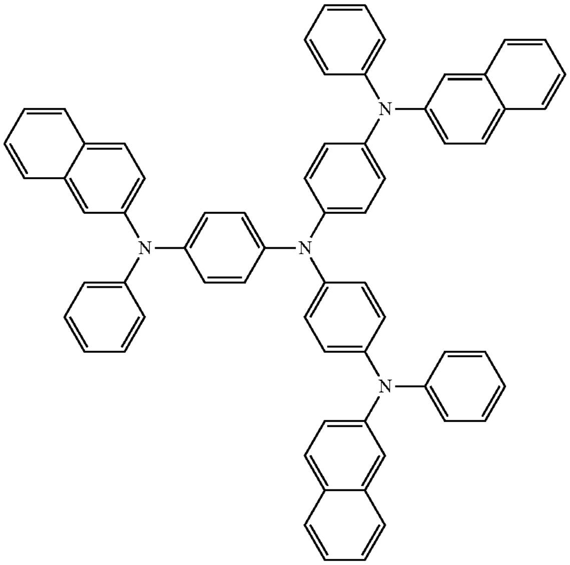
2-TNATA
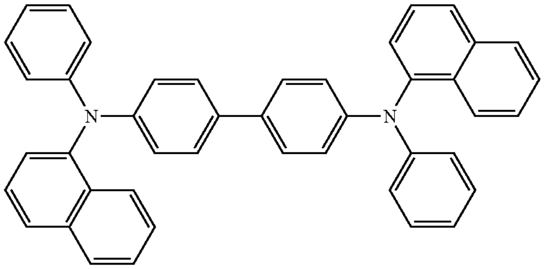
NPB
-continued
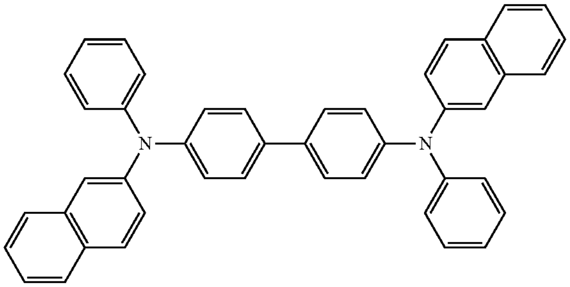
β-NPB
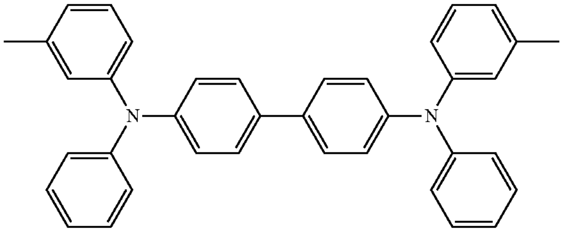
TPD
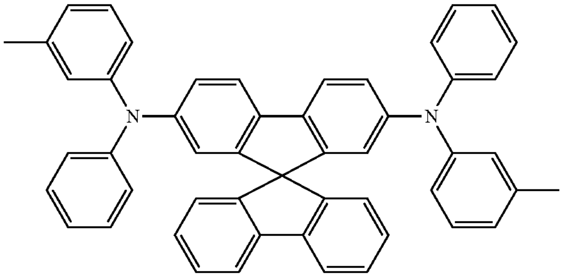
Spiro-TPD
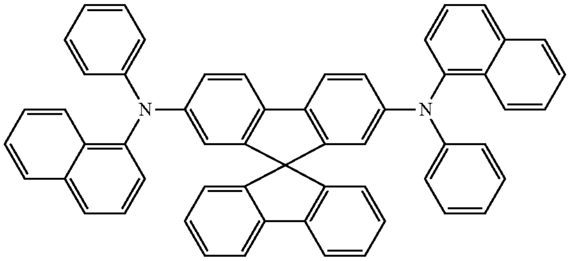
Spiro-NPB
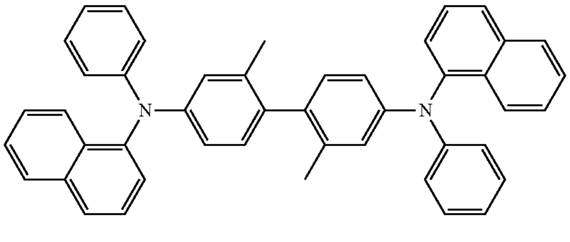
methylated NPB -continued

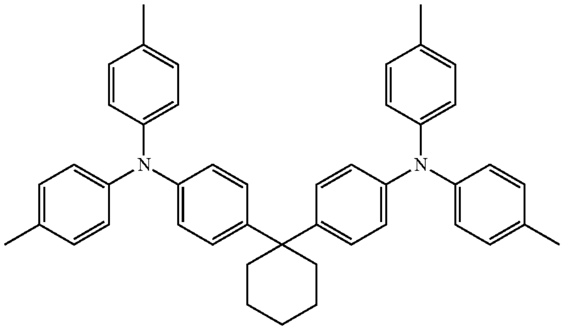

TAPC

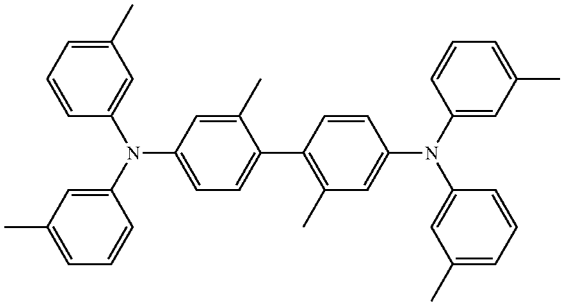

HMTPD

Formula 201

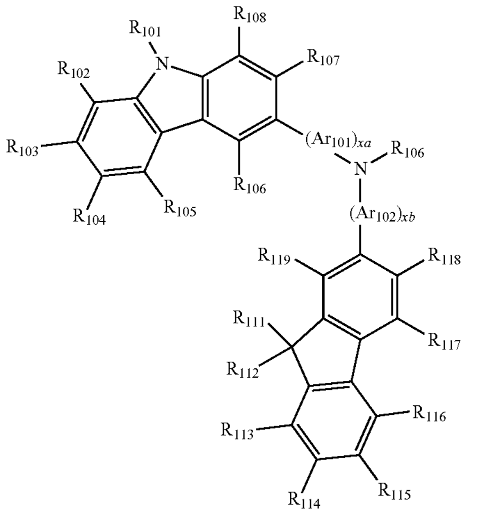

Formula 202

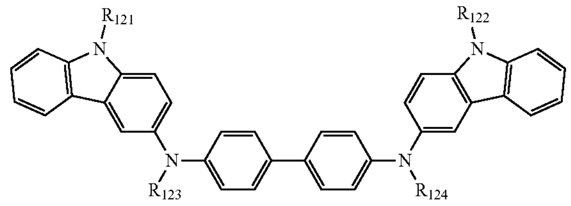

wherein, in Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_7$-$C_0$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_7$-$C_0$ aryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof.

In Formula 201, xa and xb may each independently be an integer from 0 to 5, or may each independently be 0, 1, or 2. For example, xa may be 1, and xb may be 0.

In Formulae 201 and 202, $R_{101}$ to $R_{108}$, $R_{111}$ to $R_{119}$, and $R_{121}$ to $R_{124}$ may each independently be:

- hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, etc.), a $C_1$-$C_{10}$ alkoxy group (for example, a methoxy group, an ethoxy group, a propoxy group, a butoxy group, a pentoxy group, etc.), or a $C_1$-$C_{10}$ alkylthio group;
- a $C_1$-$C_{10}$ alkyl group, a $C_1$-$C_{10}$ alkoxy group, or a $C_1$-$C_{10}$ alkylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or
- a phenyl group, a naphthyl group, an anthracenyl group, a fluorenyl group, or a pyrenyl group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_1$-$C_{10}$ alkylthio group, or a combination thereof.

$R_{109}$ in Formula 201 may be a phenyl group, a naphthyl group, an anthracenyl group, or a pyridinyl group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a naphthyl group, an anthracenyl group, a pyridinyl group, or a combination thereof.

In one or more embodiments, a compound represented by Formula 201 may be represented by Formula 201A:
Formula 201A
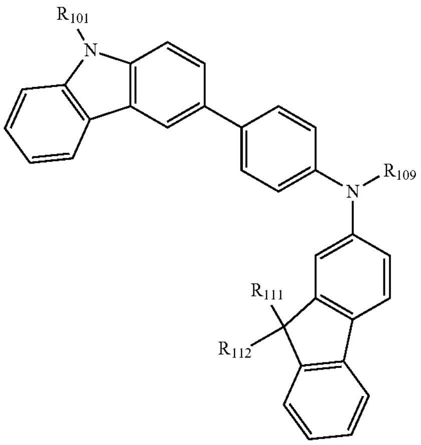
wherein, in Formula 201A, $R_{101}$, $R_{111}$, $R_{112}$, and $R_{109}$ may each be as described herein.
For example, the hole transport region may include one of Compounds HT1 to HT21, or a combination thereof, but embodiments are not limited thereto:
HT1
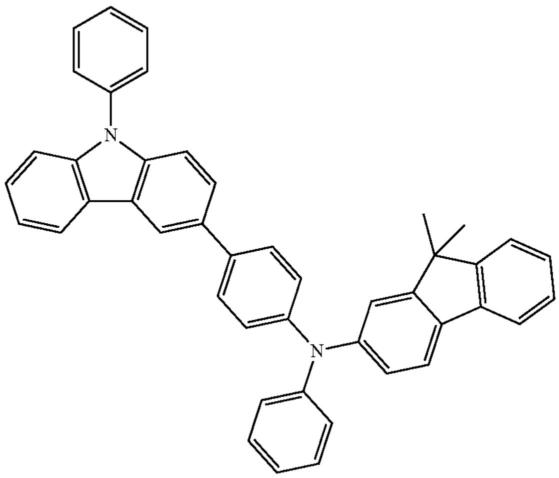
-continued
HT2
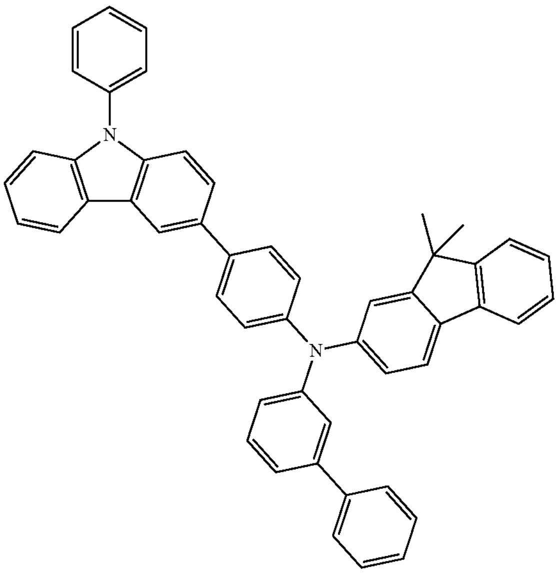
HT3
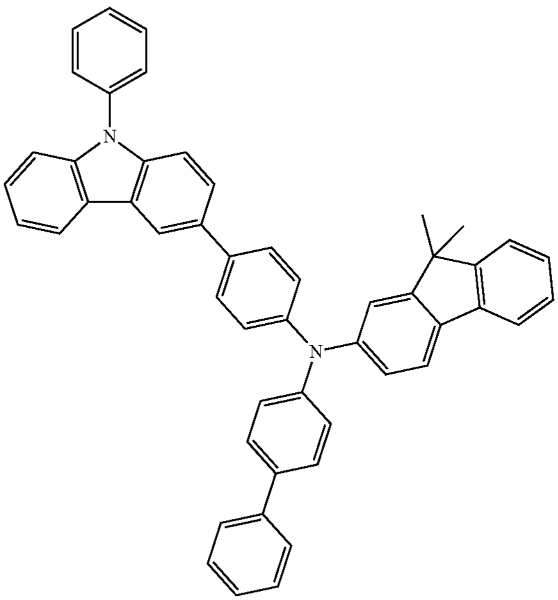

-continued
HT4
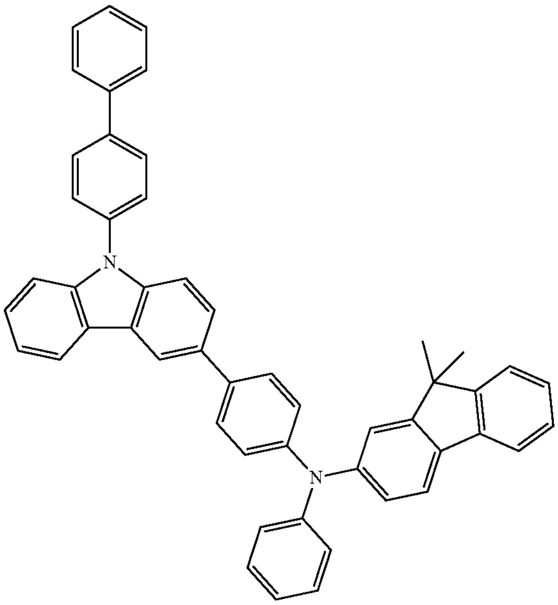
HT5
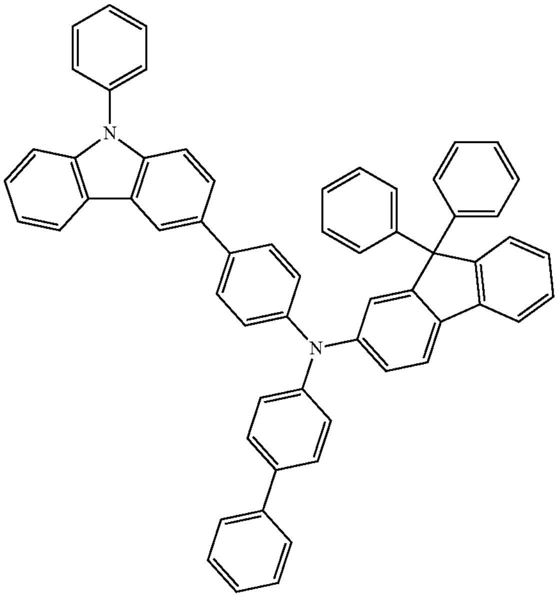
-continued
HT6
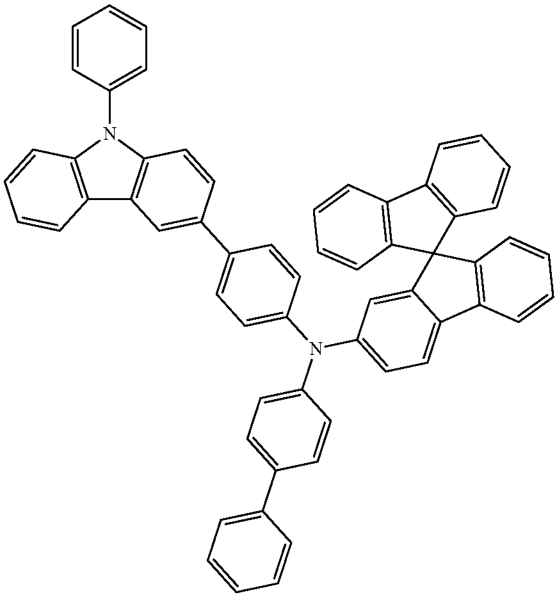
HT7
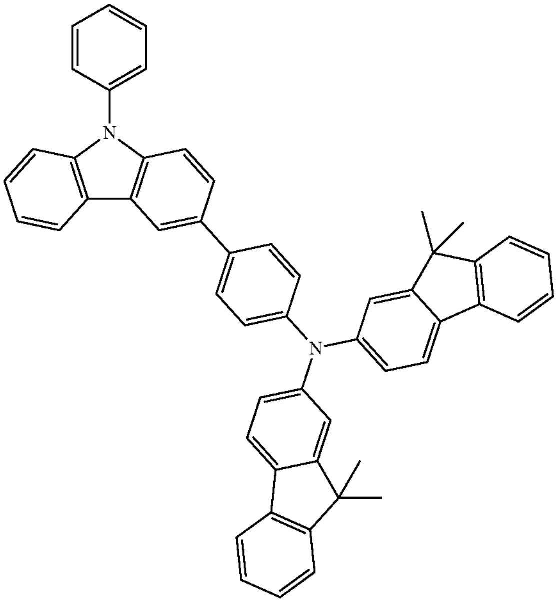

-continued
HT8
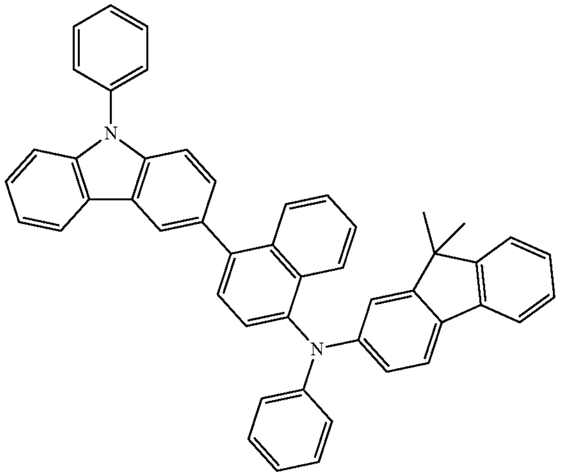
HT9
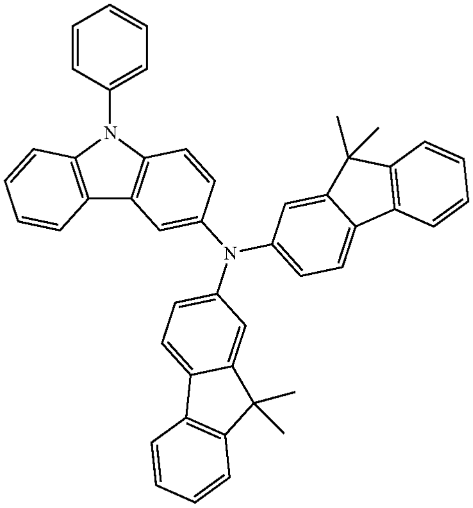
HT10
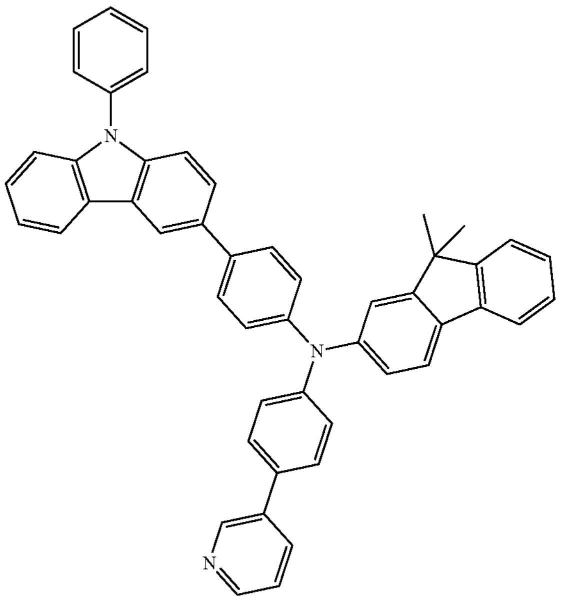
-continued
HT11
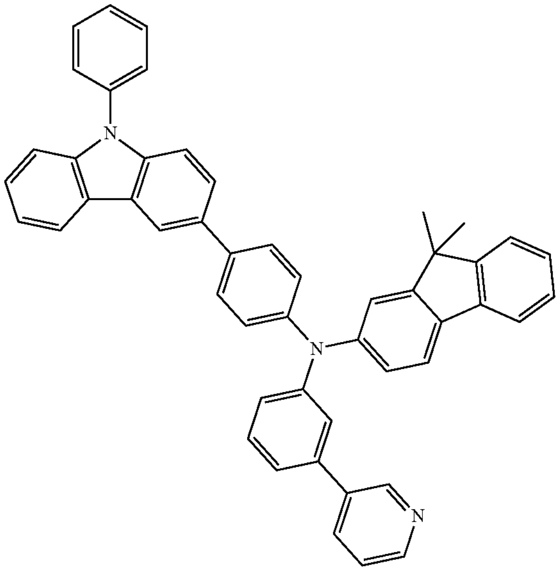
HT12
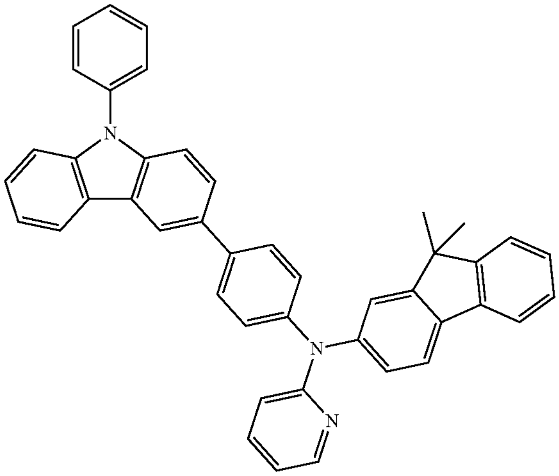
HT13
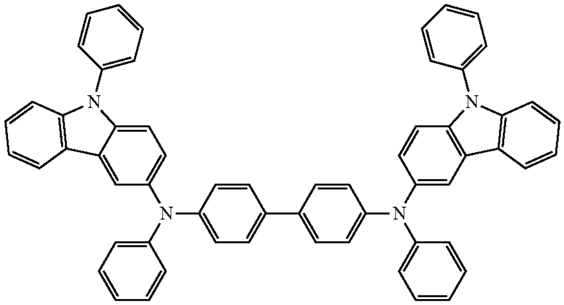

-continued
HT14
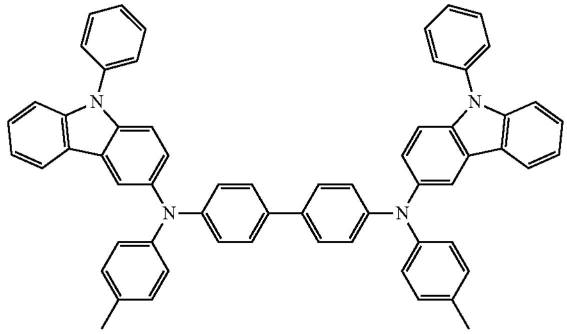
HT15
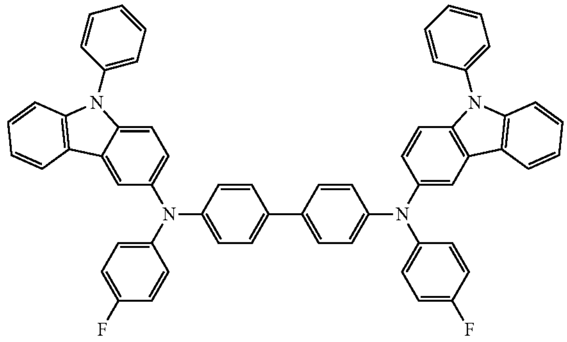
HT16
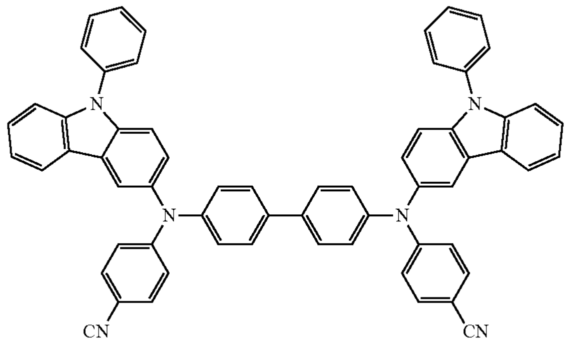
HT17
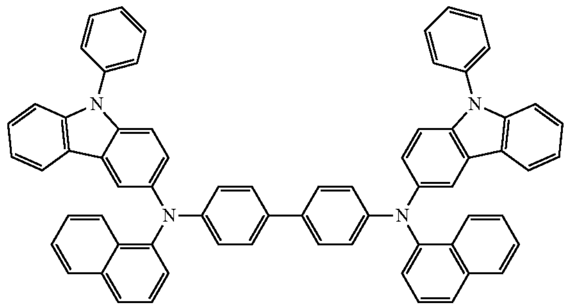
-continued
HT18
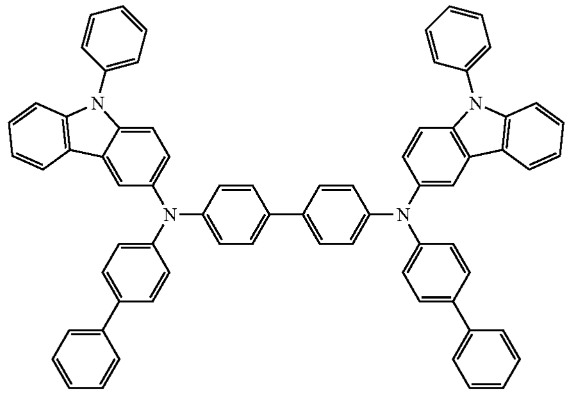
HT19
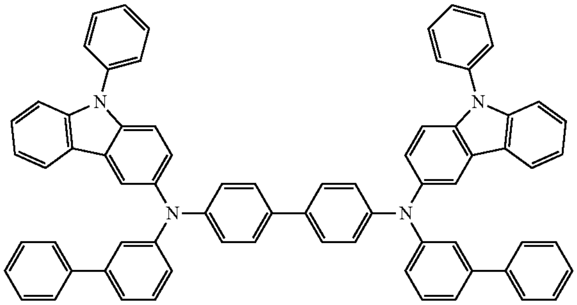
HT20
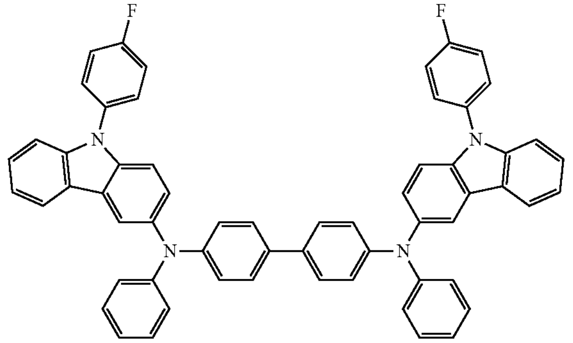
HT21
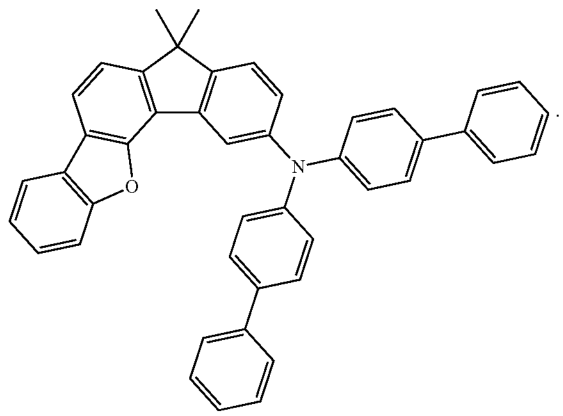
A thickness of the hole transport region may be about 100 Å to about 10,000 Å, for example, about 100 Å to about 1,000 Å. When the hole transport region includes a hole injection layer, a hole transport layer, an electron blocking layer, or a combination thereof, a thickness of the hole injection layer may be about 100 Å to about 10,000 Å, for example, about 100 Å to about 1,000 Å, and a thickness of the hole transport layer may be about 50 Å to about 2,000 Å, for example, about 100 Å to about 1,500 Å. Without wishing to be bound to theory, when thicknesses of the hole transport region, the hole injection layer, and the hole transport layer are within the ranges as described herein, satisfactory hole transporting characteristics may be obtained without a substantial increase in driving voltage.

The hole transport region may further include, in addition to the materials as described herein, a charge-generation material for improving conductive properties. The charge-generation material may be homogeneously or non-homogeneously dispersed in the hole transport region.

The charge-generation material may be, for example, a p-dopant. The p-dopant may include a quinone derivative, a metal oxide, a cyano group-containing compound, or a combination thereof. For example, the p-dopant may include a quinone derivative such as tetracyanoquinodimethane (TCNQ), 2,3,5,6-tetrafluoro-tetracyano-1,4-benzoquinonedimethane (F4-TCNQ), 1,3,4,5,7,8-hexafluorotetracyanonaphthoquinodimethane (F6-TCNNQ), or the like; a metal oxide, such as a tungsten oxide, a molybdenum oxide, or the like; a cyano group-containing compound, such as Compound HT-D1 or the like; or a combination thereof, but embodiments are not limited thereto.

HT-D1

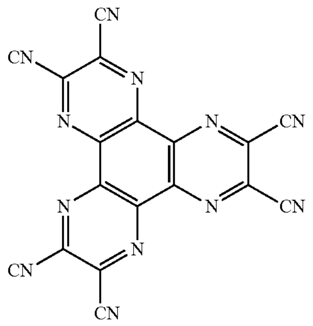

F4-TCNQ

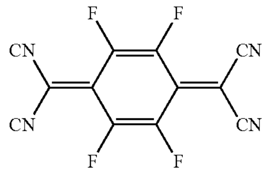

F6-TCNNQ

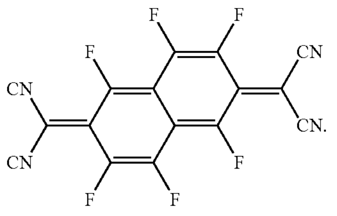

The hole transport region may further include a buffer layer.

The buffer layer may compensate for an optical resonance distance according to a wavelength of light emitted from the emission layer, thereby increasing the efficiency.

Meanwhile, when the hole transport region includes an electron blocking layer, a material for forming the electron blocking layer may include a material that may be used in the hole transport region as described herein, a host material as described herein, or a combination thereof. For example, when the hole transport region includes an electron blocking layer, mCP, Compound HT21 described herein, or a combination thereof may be used as the material for forming the electron blocking layer.

The emission layer may be formed on the hole transport region by using various methods, such as vacuum deposition, spin coating, casting, or LB deposition. When the emission layer is formed by vacuum deposition or spin coating, the deposition or coating conditions may be similar to those applied in forming the hole injection layer although the deposition or coating conditions may vary according to a material that is used.

The emission layer may include a host and a dopant, and the dopant may include at least one of the organometallic compounds represented by Formula 1 as described herein.

In one or more embodiments, the host may include at least one of 1,3,5-tri(1-phenyl-1H-benzo[d]imidazol-2-yl)benzene (TPBi), 3-tert-butyl-9,10-di(naphth-2-yl)anthracene (TBADN), 9,10-di(naphthalen-2-yl)anthracene (ADN) (also referred to as "DNA"), 4,4'-bis(N-carbazolyl)-1,1'-biphenyl (CBP), 4,4'-bis(9-carbazolyl)-2,2'-dimethylbiphenyl (CDBP), 1,3,5-tris(carbazol-9-yl)benzene (TCP), 1,3-bis(N-carbazolyl)benzene (mCP), Compound H50, Compound H51, Compound H52, or a combination thereof, but embodiments are not limited thereto:

TPBi

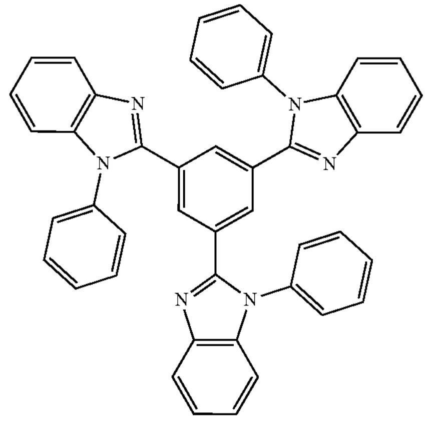

TBADN

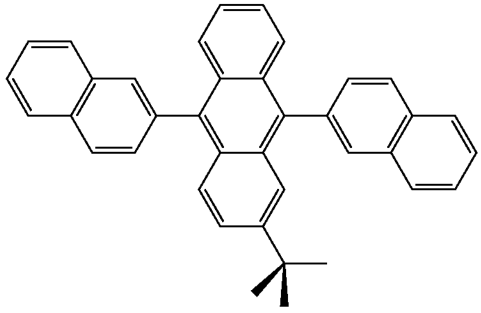

-continued

ADN

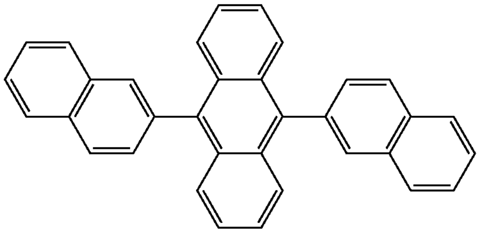

CBP

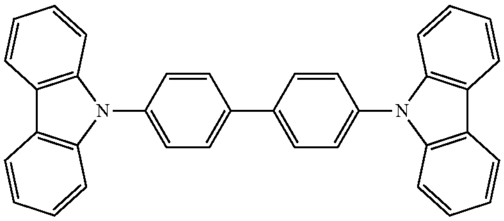

CDBP

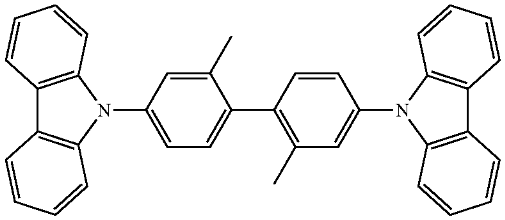

TCP

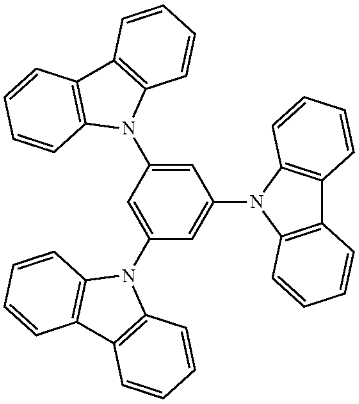

mCP

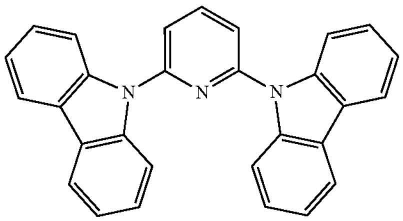

H50

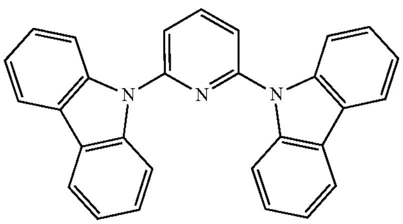

-continued

H51

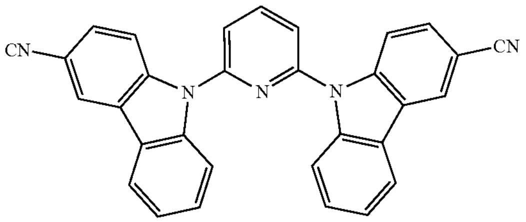

H52

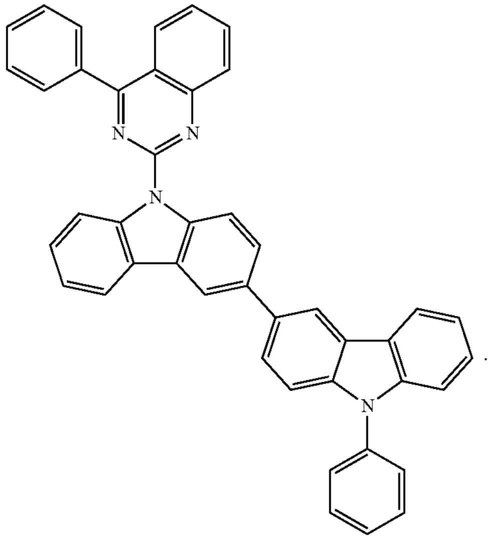

When the organic light-emitting device is a full-color organic light-emitting device, the emission layer may be patterned into a red emission layer, a green emission layer, and/or a blue emission layer. Alternatively, due to a stacked structure including a red emission layer, a green emission layer, and/or a blue emission layer, the emission layer may emit a white light, and various modifications are possible.

When the emission layer includes a host and a dopant, an amount of a dopant may be about 0.01 parts by weight to about 15 parts by weight based on 100 parts by weight of the host.

A thickness of the emission layer may be about 100 Å to about 1,000 Å, for example, about 200 Å to about 600 Å. Without wishing to be bound to theory, when the thickness of the emission layer is within the range, excellent light-emission characteristics may be obtained without a substantial increase in driving voltage.

Next, the electron transport region may be disposed on the emission layer.

The electron transport region may include a hole blocking layer, an electron transport layer, an electron injection layer, or a combination thereof.

For example, the electron transport region may have a hole blocking layer/electron transport layer/electron injection layer structure or an electron transport layer/electron injection layer structure. The electron transport layer may have a single-layered structure or a multi-layered structure including two or more different materials.

The conditions for forming a hole blocking layer, an electron transport layer, and an electron injection layer of the electron transport region may be similar to the conditions for forming the hole injection layer.

When the electron transport region includes a hole blocking layer, the hole blocking layer may include, for example, at least one of 2,9-dimethyl-4,7-diphenyl-1,10-phenanthroline (BCP), 4,7-diphenyl-1,10-phenanthroline (Bphen), bis(2-methyl-8-quinolinolato-N1,O8)-(1,1'-biphenyl-4-olato) aluminum (BAlq), or a combination thereof, but embodiments are not limited thereto:

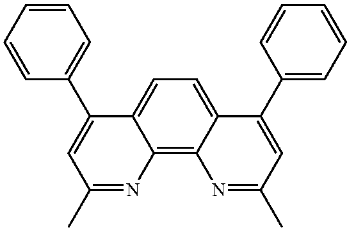

BCP

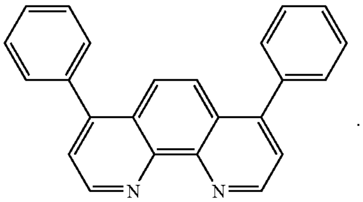

Bphen

Alternatively, the hole blocking layer may include the host, a material for forming the electron transport layer, a material for forming the electron injection layer, or a combination thereof.

A thickness of the hole blocking layer may be about 20 Å to about 1,000 Å, for example, about 30 Å to about 600 Å. Without wishing to be bound to theory, when the thickness of the hole blocking layer is within the range, excellent hole blocking characteristics may be obtained without a substantial increase in driving voltage.

The electron transport layer may include 2,9-dimethyl-4,7-diphenyl-1,10-phenanthroline (BCP), 4,7-diphenyl-1,10-phenanthroline (Bphen), 1,3,5-tri(1-phenyl-1H-benzo[d]imidazol-2-yl)benzene (TPBi), tris(8-hydroxy-quinolinato) aluminum ($Alq_3$), bis(2-methyl-8-quinolinolato-N1,O8)-(1,1'-biphenyl-4-olato)aluminum (BAlq), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), or a combination thereof, but embodiments are not limited thereto:

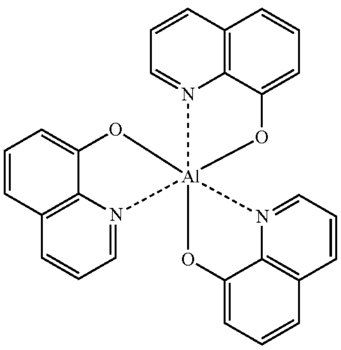

$Alq_3$

-continued

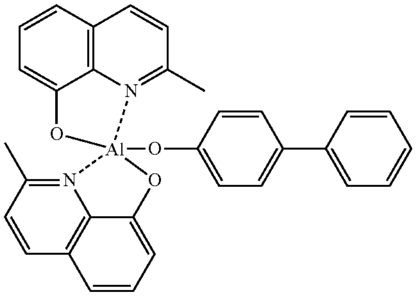

BAlq

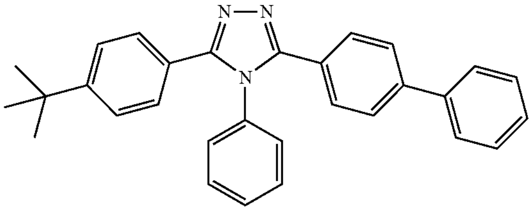

TAZ

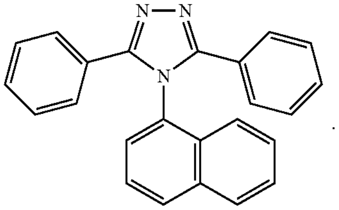

NTAZ

Alternatively, the electron transport layer may include at least one of Compounds ET1 to ET25, or a combination thereof, but embodiments are not limited thereto:

ET1

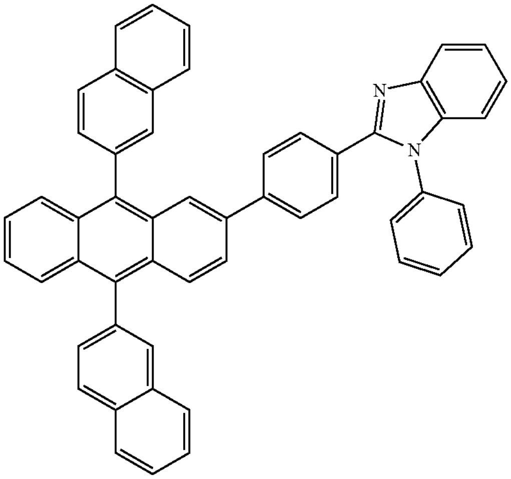

-continued
ET2
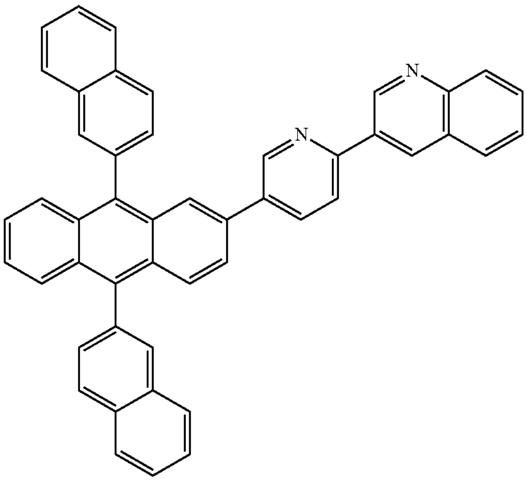
ET3
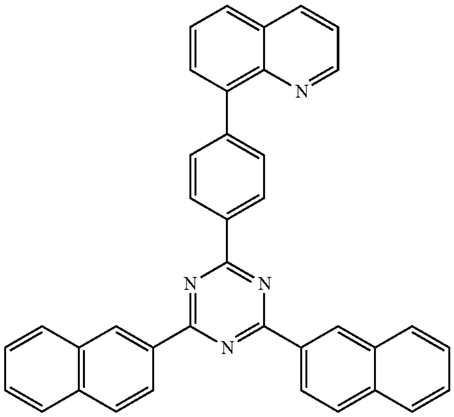
ET4
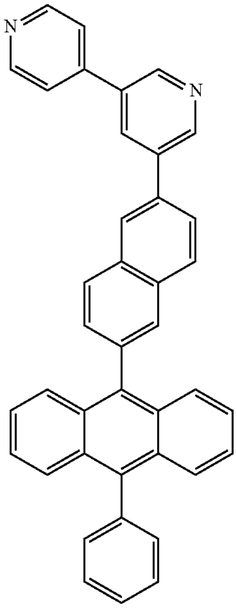
-continued
ET5
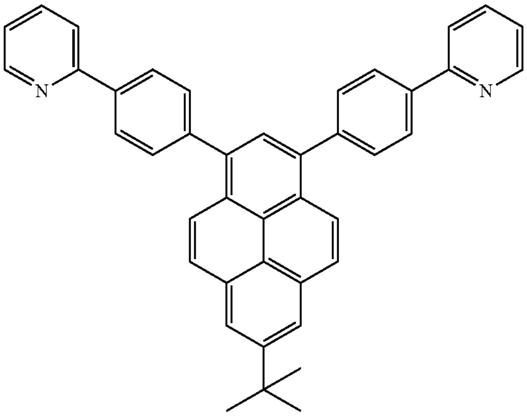
ET6
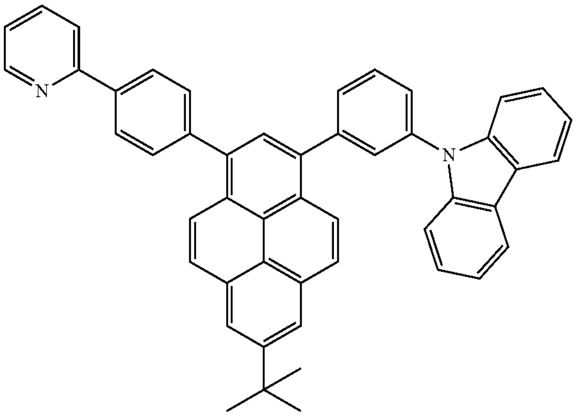
ET7
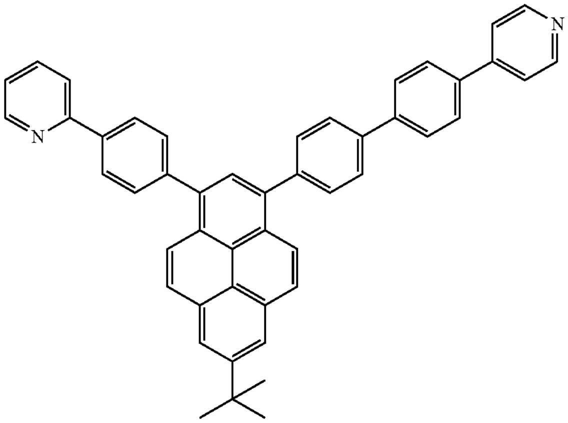

-continued
ET8
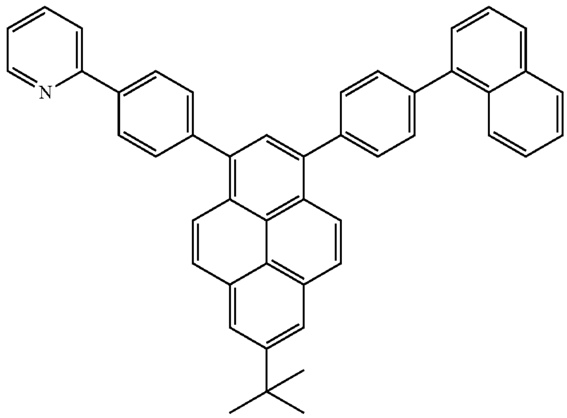
ET9
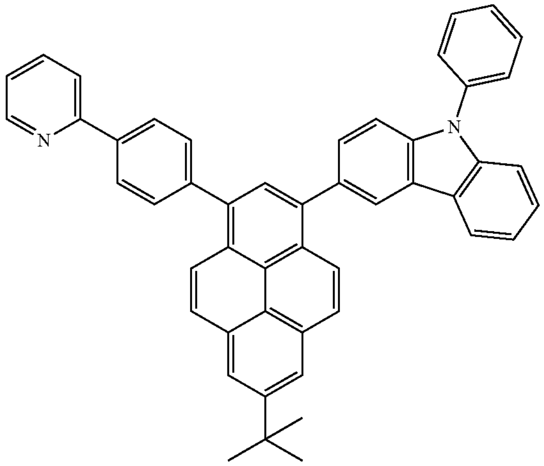
ET10
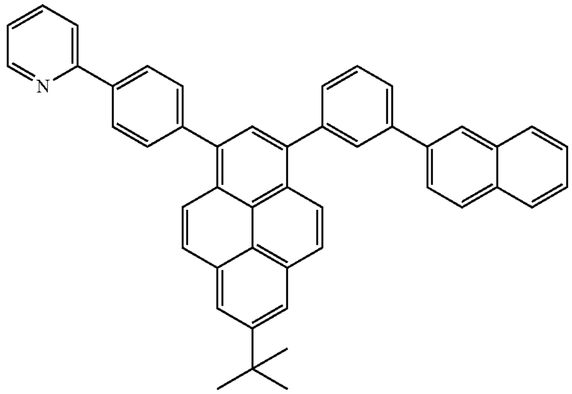
ET11
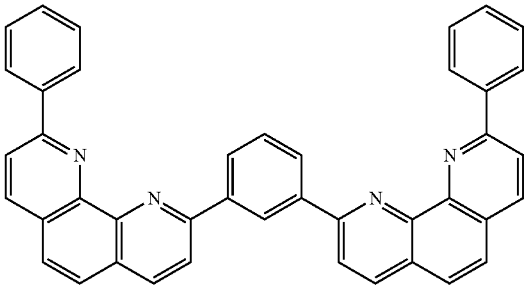
-continued
ET12
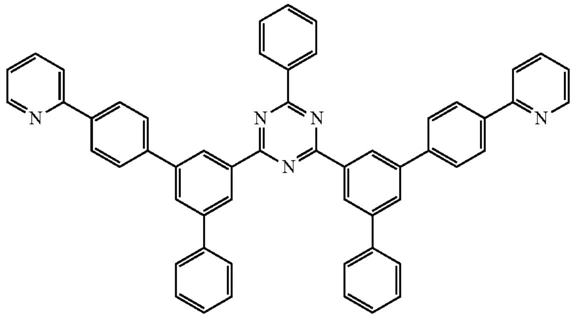
ET13
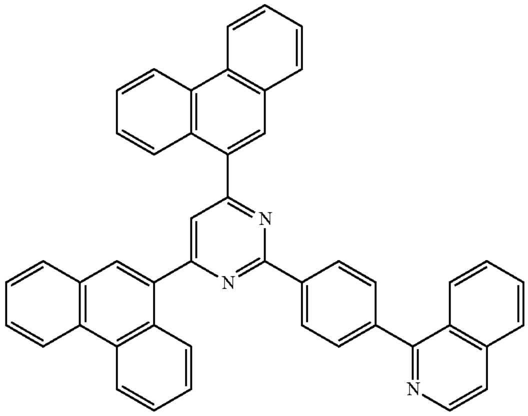
ET14
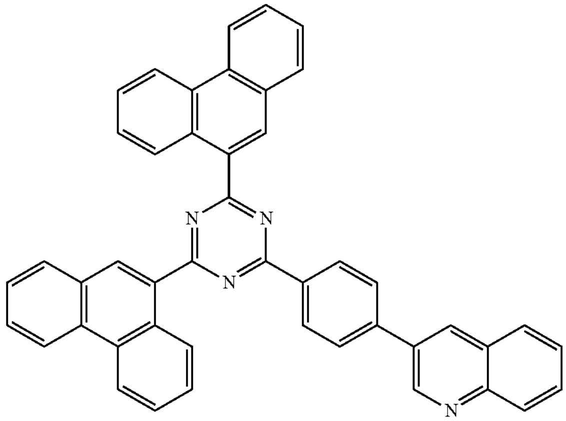
ET15
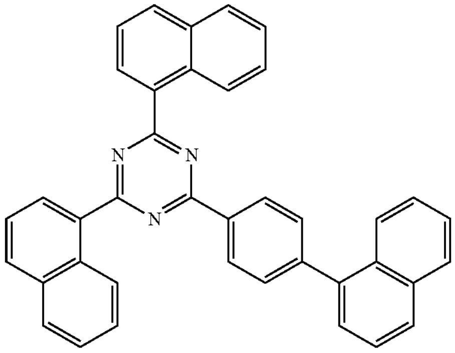

-continued
ET16
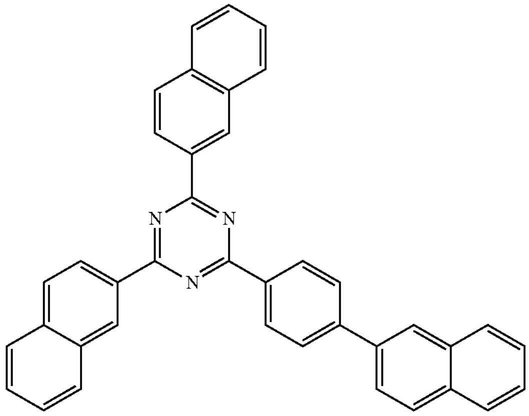
ET17
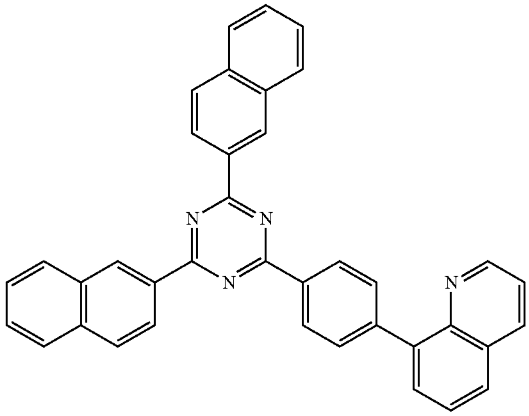
ET18
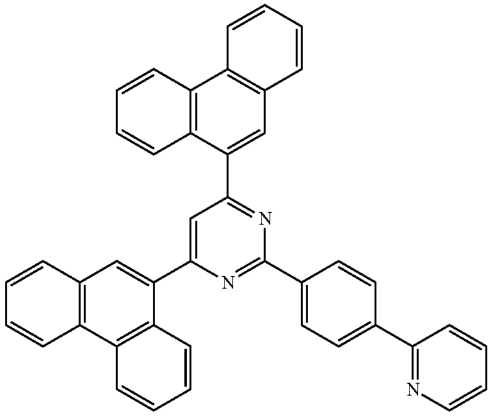
-continued
ET19
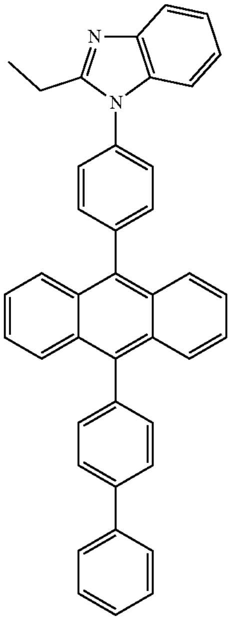
ET20
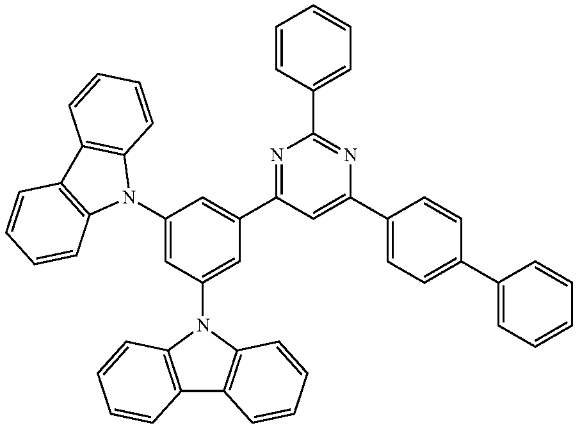
ET21
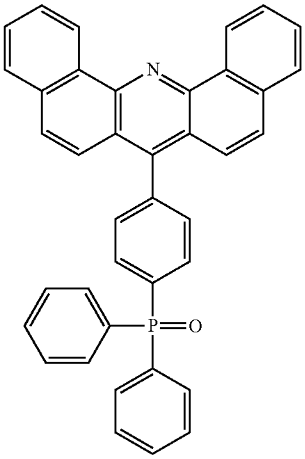

-continued

ET22

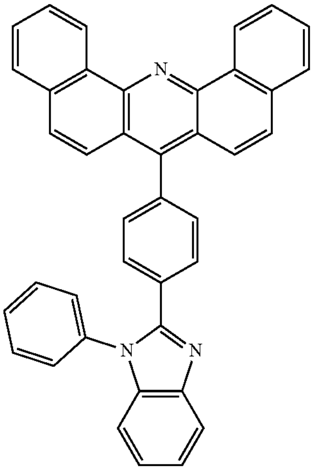

ET23

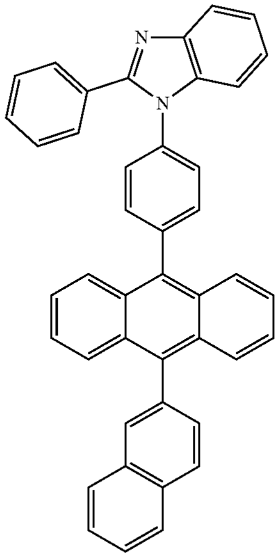

ET24

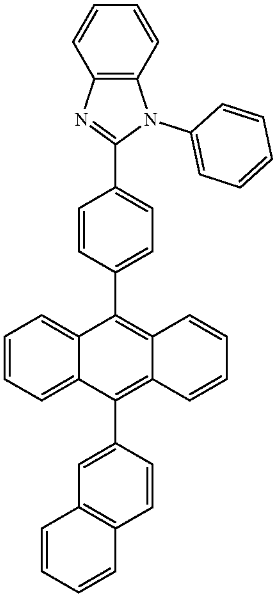

-continued

ET25

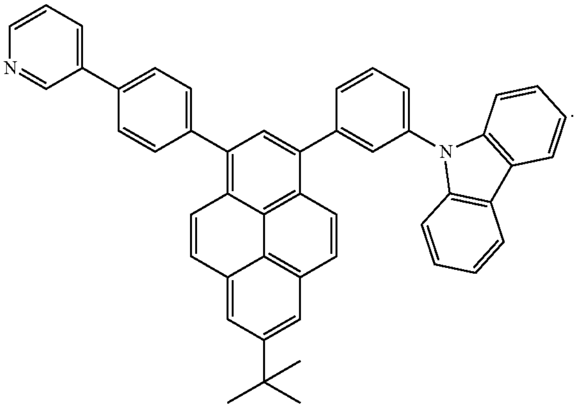

A thickness of the electron transport layer may be about 100 Å to about 1,000 Å, for example, about 150 Å to about 500 Å. Without wishing to be bound to theory, when the thickness of the electron transport layer is within the range, excellent electron transporting characteristics may be obtained without a substantial increase in driving voltage.

The electron transport layer may include, in addition to the materials described herein, a metal-containing material.

The metal-containing material may include a Li complex. The Li complex may include, for example, Compound ET-D1 or ET-D2, but embodiments are not limited thereto:

ET-D1

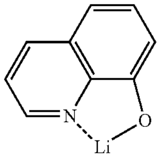

ET-D2

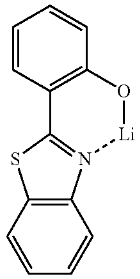

In one or more embodiments, the electron transport region may include an electron injection layer that facilitates electron injection from the second electrode 19.

The electron injection layer may include at least one of LiF, NaCl, CsF, $Li_2O$, BaO, or a combination thereof.

A thickness of the electron injection layer may be about 1 Å to about 100 Å, for example, about 3 Å to about 90 Å. Without wishing to be bound to theory, when the thickness of the electron injection layer is within the range described above, satisfactory electron injection characteristics may be obtained without a substantial increase in driving voltage.

The second electrode 19 is disposed on the organic layer 15. The second electrode 19 may be a cathode. A material for forming the second electrode 19 may be metal, an alloy, an electrically conductive compound, or a combination thereof, which have a relatively low work function. Examples of the material for forming the second electrode 19 may include lithium (Li), magnesium (Mg), aluminum (Al), silver (Ag), aluminum-lithium (Al—Li), calcium (Ca), magnesium-indium (Mg—In), and magnesium-silver (Mg—Ag). Alternatively, to obtain a top-emission type light-emitting device, various modifications are possible, and for example, a transmissive electrode formed using ITO or IZO may be used as the second electrode 19.

Hereinbefore, the light-emitting device has been described in further detail with reference to the FIGURE, but the embodiments are not limited thereto.

According to one or more embodiments, the light-emitting device may be included in an electronic apparatus. Therefore, also provided is an electronic apparatus including the light-emitting device. The electronic apparatus may include, for example, a display, lighting, a sensor, or the like, but embodiments are not limited thereto.

According to one or more embodiments, there is provided a diagnostic composition including at least one organometallic compound represented by Formula 1.

The organometallic compound represented by Formula 1 provides a high emission efficiency, and thus, the diagnostic composition including the at least one organometallic compound may have a high diagnostic efficiency.

The diagnostic composition may be used in various applications including a diagnosis kit, a diagnosis reagent, a biosensor, a biomarker, or the like, but embodiments are not limited thereto.

The term "$C_1$-$C_{60}$ alkyl group" as used herein refers to a linear or branched saturated aliphatic hydrocarbon monovalent group having 1 to 60 carbon atoms, and the term "$C_1$-$C_{60}$ alkylene group, as used herein refers to a divalent group having the same structure as the $C_1$-$C_{60}$ alkyl group.

Non-limiting examples of the $C_1$-$C_{60}$ alkyl group, the $C_1$-$C_{20}$ alkyl group, and/or the $C_1$-$C_{10}$ alkyl group may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, or a tert-decyl group, each unsubstituted or substituted with at least one of a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or the like, or a combination thereof. For example, Formula 9-33 is a branched $C_6$ alkyl group, for example, a tert-butyl group that is substituted with two methyl groups.

The term "$C_1$-$C_{60}$ alkoxy group" as used herein refers to a monovalent group having the formula of —$OA_{101}$ (where $A_{101}$ is the $C_1$-$C_{60}$ alkyl group).

Non-limiting examples of the $C_1$-$C_{60}$ alkoxy group, the $C_1$-$C_{20}$ alkoxy group, or the $C_1$-$C_{10}$ alkoxy group as used herein may include a methoxy group, an ethoxy group, a propoxy group, a butoxy group, a pentoxy group, or the like.

The term "$C_2$-$C_{60}$ alkenyl group" as used herein has a structure including at least one carbon-carbon double bond in the middle or at the terminus of the $C_2$-$C_{60}$ alkyl group, and non-limiting examples thereof include an ethenyl group, a propenyl group, a butenyl group, or the like. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein has a structure including at least one carbon-carbon triple bond in the middle or at the terminus of the $C_2$-$C_{60}$ alkyl group, and non-limiting examples thereof include an ethynyl group, a propynyl group, or the like.

The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the term "$C_3$-$C_{10}$ cycloalkylene group" as used herein refers to a divalent group having the same structure as the $C_3$-$C_{10}$ cycloalkyl group.

Non-limiting examples of the $C_3$-$C_{10}$ cycloalkyl group may include a cyclopropyl group, a cyclobutyl group, a cyclopentyl group, a cyclohexyl group, a cycloheptyl group, a cyclooctyl group, an adamantanyl group, a norbornanyl group (a bicyclo[2.2.1]heptyl group), a bicyclo[1.1.1]pentyl group, a bicyclo[2.1.1]hexyl group, a bicyclo[2.2.2]octyl group, or the like.

The term "$C_1$-$C_{10}$ heterocycloalkyl group" as used herein refers to a monovalent saturated cyclic group that includes at least one heteroatom selected from N, O, P, Si, S, Se, Ge, and B as a ring-forming atom, and 1 to 10 carbon atoms as ring-forming atoms, and the term "$C_1$-$C_{10}$ heterocycloalkylene group" as used herein refers to a divalent group having the same structure as the $C_1$-$C_{10}$ heterocycloalkyl group.

Non-limiting examples of the $C_1$-$C_{10}$ heterocycloalkyl group may include a silolanyl group, a silinanyl group, tetrahydrofuranyl group, a tetrahydro-2H-pyranyl group, a tetrahydrothiophenyl group, or the like.

The term "$C_3$-$C_{10}$ cycloalkenyl group" as used herein refers to a monovalent monocyclic group including 3 to 10 carbon atoms, at least one carbon-carbon double bond in its ring, and no aromaticity, and non-limiting examples thereof include a cyclopentenyl group, a cyclohexenyl group, a cycloheptenyl group, or the like. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, S, Se, Ge, and B as a ring-forming atom, 1 to 10 carbon atoms as ring-forming atoms, and at least one double bond in its ring. Non-limiting examples of the $C_1$-$C_{10}$ heterocycloalkenyl group include a 2,3-dihydrofuranyl group, a 2,3-dihydrothiophenyl group, or the like. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group that includes a carbocyclic aromatic system having 6 to 60 carbon atoms, and the term "$C_6$-$C_{60}$ arylene group" as used herein refers to a divalent group that includes a carbocyclic aromatic system having 6 to 60 carbon atoms. Non-limiting examples of the $C_6$-$C_{60}$ aryl group may include a phenyl group, a naphthyl group, an anthracenyl group, a phenanthrenyl group, a pyrenyl group, a chrysenyl group, or the like. When the $C_6$-$C_{60}$ aryl group and the $C_6$-$C_{60}$ arylene group each include at least two rings, the at least two rings may be fused to each other.

The term "$C_7$-$C_0$ alkyl aryl group" as used herein refers to a $C_6$-$C_{60}$ aryl group that is substituted with at least one $C_1$-$C_{60}$ alkyl group.

The term "$C_7$-$C_0$ aryl alkyl group" as used herein refers to a $C_1$-$C_{60}$ alkyl group that is substituted with at least one $C_6$-$C_{60}$ aryl group.

The term "$C_1$-$C_{60}$ heteroaryl group" as used herein refers to a monovalent group having at least one heteroatom selected from N, O, P, Si, S, Se, Ge, and B as a ring-forming atom and a cyclic aromatic system having 1 to 60 carbon atoms, and the term "$C_1$-$C_{60}$ heteroarylene group" as used herein refers to a divalent group having at least one heteroatom selected from N, O, P, Si, S, Se, Ge, and B as a ring-forming atom and a cyclic aromatic system having 1 to 60 carbon atoms. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, an isoquinolinyl group, or the like. When the $C_1$-$C_{60}$ heteroaryl group and the $C_1$-$C_{60}$ heteroarylene group each include at least two rings, the at least two rings may be fused to each other.

The term "$C_2$-$C_{60}$ alkyl heteroaryl group" as used herein refers to a $C_1$-$C_{60}$ heteroaryl group that is substituted with at least one $C_1$-$C_{60}$ alkyl group.

The term "$C_2$-$C_{60}$ heteroaryl alkyl group" as used herein refers to a $C_1$-$C_{60}$ alkyl group that is substituted with at least one $C_1$-$C_{60}$ heteroaryl group.

The term "$C_6$-$C_{60}$ aryloxy group" as used herein indicates —$OA_{102}$ (wherein $A_{102}$ is the $C_6$-$C_{60}$ aryl group), the term "$C_6$-$C_{60}$ arylthio group" as used herein indicates —$SA_{103}$ (wherein $A_{103}$ is the $C_6$-$C_{60}$ aryl group), and the term "$C_1$-$C_{60}$ alkylthio group" as used herein indicates —$SA_{104}$ (wherein $A_{104}$ is the $C_1$-$C_{60}$ alkyl group).

The term "$C_1$-$C_{60}$ heteroaryloxy group" as used herein indicates —$OA_{102'}$ (wherein $A_{102'}$ is the $C_1$-$C_{60}$ heteroaryl group), and the term "$C_1$-$C_{60}$ heteroarylthio group" as used herein indicates —$SA_{103'}$ (wherein $A_{103'}$ is the $C_1$-$C_{60}$ heteroaryl group).

The term "monovalent non-aromatic condensed polycyclic group" as used herein refers to a monovalent group having two or more rings condensed with each other, only carbon atoms (for example, having 8 to 60 carbon atoms) as ring-forming atoms, and no aromaticity in its molecular structure. Non-limiting examples of the monovalent non-aromatic condensed polycyclic group may include a fluorenyl group or the like. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group having two or more rings condensed with each other, a heteroatom selected from N, O, P, Si, S, Se, Ge, and B, other than carbon atoms as a ring-forming atom, and no aromaticity in its molecular structure. Non-limiting examples of the monovalent non-aromatic condensed heteropolycyclic group may include a carbazolyl group or the like. The term "divalent non-aromatic condensed heteropolycyclic group" as used herein refers to a divalent group having the same structure as a monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group. Non-limiting examples of the "$C_5$-$C_{30}$ carbocyclic group (unsubstituted or substituted with at least one $R_{10a}$)" may include an adamantane group, a norbornane group (a bicyclo[2.2.1]heptane group), a norbornene group, a bicyclo[1.1.1]pentane group, a bicyclo[2.1.1]hexane group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a fluorene group, or the like (each unsubstituted or substituted with at least one $R_{10a}$).

The term "$C_1$-$C_{30}$ heterocyclic group" as used herein refers to a saturated or unsaturated cyclic group having, as a ring-forming atom, at least one heteroatom selected from N, O, P, Si, Se, Ge, B, and S, other than 1 to 30 carbon atoms. The $C_1$-$C_{30}$ heterocyclic group may be a monocyclic group or a polycyclic group. Non-limiting examples of the "$C_1$-$C_{30}$ heterocyclic group (unsubstituted or substituted with at least one $R_{10a}$)" may include a thiophene group, a furan group, a pyrrole group, a silole group, a borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluoren-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, or the like (each unsubstituted or substituted with at least one $R_{10a}$).

The terms "fluorinated $C_1$-$C_{60}$ alkyl group (or fluorinated $C_1$-$C_{20}$ alkyl group or the like)," "fluorinated $C_3$-$C_{10}$ cycloalkyl group," "fluorinated $C_1$-$C_{10}$ heterocycloalkyl group," and "fluorinated phenyl group" as used herein respectively refer to a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the term "fluorinated $C_1$ alkyl group (that is, fluorinated methyl group)" includes —$CF_3$, —$CF_2H$, and —$CFH_2$. The terms "fluorinated $C_1$-$C_{60}$ alkyl group (or fluorinated $C_1$-$C_{20}$ alkyl group or the like)," "fluorinated $C_3$-$C_{10}$ cycloalkyl group," "fluorinated $C_1$-$C_{10}$ heterocycloalkyl group," or "fluorinated phenyl group" as used herein may respectively refer to, i) a fully fluorinated $C_1$-$C_{60}$ alkyl group (or a fully fluorinated $C_1$-$C_{20}$ alkyl group or the like), a fully fluorinated $C_3$-$C_{10}$ cycloalkyl group, a fully fluorinated $C_1$-$C_{10}$ heterocycloalkyl group, or a fully fluorinated a phenyl group, wherein, in each group, all hydrogen atoms included therein are substituted with a fluoro group, or ii) a partially fluorinated $C_1$-$C_{60}$ alkyl group (or a partially fluorinated $C_1$-$C_{20}$ alkyl group or the like), a partially fluorinated $C_3$-$C_{10}$ cycloalkyl group, a partially fluorinated $C_1$-$C_{10}$ heterocycloalkyl group, or a partially fluorinated phenyl group, wherein, in each group, at least one but not all of the hydrogen atoms included therein are substituted with a fluoro group.

The terms "deuterated $C_1$-$C_{60}$ alkyl group (or deuterated $C_1$-$C_{20}$ alkyl group or the like)," "deuterated $C_3$-$C_{10}$ cycloalkyl group," "deuterated $C_1$-$C_{10}$ heterocycloalkyl group," and "deuterated phenyl group" as used herein respectively refer to a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, a deuterated methyl group)" may include —$CD_3$, —$CD_2H$, and —$CDH_2$, and examples of the "deuterated $C_3$-$C_{10}$ cycloalkyl group" are, for example, Formula 10-501 and the like. The "deuterated $C_1$-$C_{60}$ alkyl group (or deuterated $C_1$-$C_{20}$ alkyl group or the like)," "deuterated $C_3$-$C_{10}$ cycloalkyl group," "deuterated $C_1$-$C_{10}$ heterocycloalkyl group," or "deuterated phenyl group" may respectively refer to i) a fully deuterated $C_1$-$C_{60}$ alkyl group (or a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, wherein, in each group, all hydrogen atoms included therein are substituted with deuterium, or ii) a partially deuterated $C_1$-$C_{60}$ alkyl group (or a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, wherein, in each group, at least one but not all of the hydrogen atoms included therein are substituted with deuterium.

The term "($C_1$-$C_{20}$ alkyl) 'X' group" as used herein refers to an 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group that is substituted with at least one $C_1$-$C_{20}$ alkyl group, and the term "($C_1$-$C_{20}$ alkyl)phenyl group" as used herein refers to a phenyl group that is substituted with at least one $C_1$-$C_{20}$ alkyl group. Examples of the term "($C_1$ alkyl)phenyl group" include a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" respectively refer to hetero rings having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group," in which, in each group, at least one carbon selected from ring-forming carbons is substituted with nitrogen.

Substituents of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$heterocycloalkenyl group, the substituted $C_6$-$C_{60}$ aryl group, the substituted $C_7$-$C_{60}$ alkyl aryl group, the substituted $C_7$-$C_0$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may each independently be:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_0$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or a combination thereof.

$Q_1$ to $Q_9$, $Q_{11}$ to $Q_{19}$, $Q_{21}$ to $Q_{29}$, and $Q_{31}$ to $Q_{39}$ as used herein may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_0$ alkyl aryl group, a substituted or unsubstituted $C_7$-$C_0$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

Hereinafter, a compound and an organic light-emitting device according to one or more exemplary embodiments will be described in further detail with reference to Synthesis Examples and Examples, but embodiments are not limited thereto. The wording "B was used instead of A" used in describing Synthesis Examples means that an amount of B used was identical to an amount of A used based on molar equivalence.

EXAMPLES

Synthesis Example 1 (Compound 1)

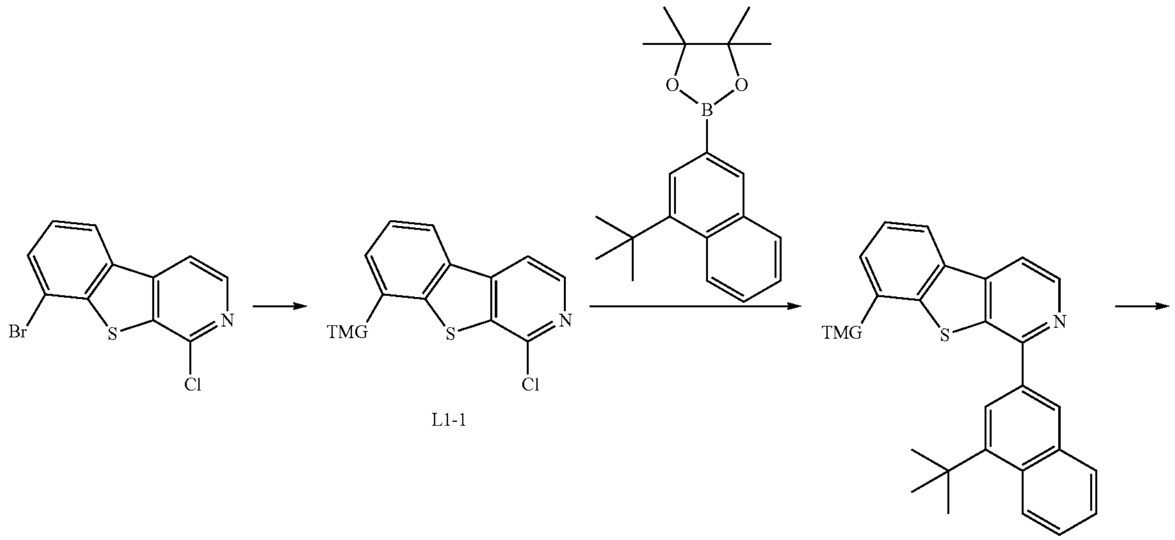

L1-1

L1

-continued

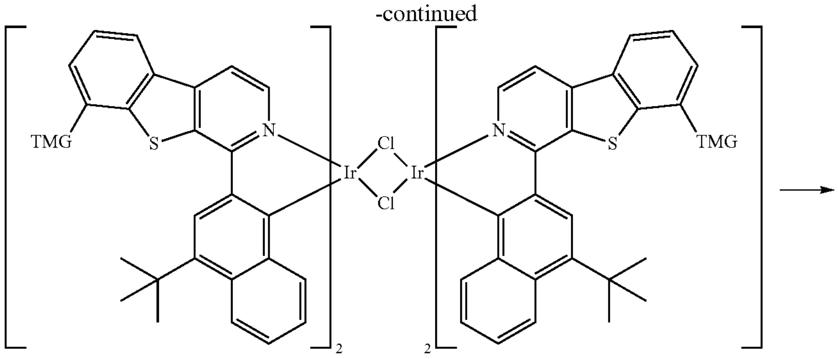

L1 Dimer

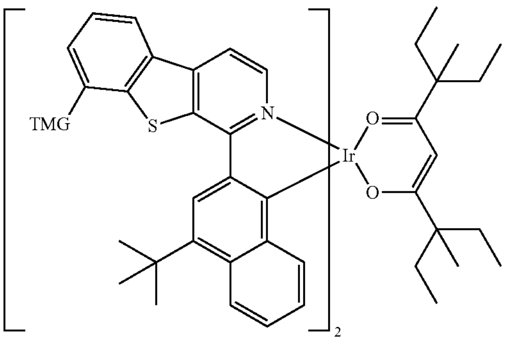

1

Synthesis of Intermediate L1-1

1.5 grams (g) (5.0 millimoles (mmol)) of 8-bromo-1-chlorobenzo[4,5]thieno[2,3-c]pyridine was mixed with 20 milliliters (mL) of anhydrous tetrahydrofuran (THF) and 40 mL of diethyl ether, and then 3.4 mL (5.5 mmol) of butyl lithium (BuLi, as a 1.6 Molar (M) solution in hexane) was slowly added thereto at −78° C. After about an hour, 0.8 mL (6.5 mmol) of chlorotrimethylgermane was slowly added dropwise thereto, followed by stirring at room temperature for 12 hours. After completion of the reaction, an organic layer was obtained by extraction with 40 mL of deionized (DI) water and ethyl acetate, the organic layer was separated and dried using anhydrous magnesium sulfate, the organic layer was isolated by filtration, and the solvent was removed from the product under a reduced pressure. The resultant product was further purified by liquid chromatography to obtain 1.4 g of Intermediate L1-1 (yield of 92%).

Liquid chromatography-mass spectrometry (LC-MS): m/z=337 $(M+H)^+$.

Synthesis of Intermediate L1

1.51 g (4.5 mmol) of Intermediate L1-1 was dissolved in 60 mL of 1,4-dioxane and 15 mL of DI water, 1.7 g (5.4 mmol) of 2-(4-(tert-butyl)naphthalen-2-yl)-4,4,5,5-tetramethyl-1,3,2-dioxaborolane, 0.4 g (0.35 mmol) of tetrakis (triphenylphosphine)palladium(0) ($Pd(PPh_3)_4$), and 1.7 g (12.5 mmol) of $K_2CO_3$ were added thereto, followed by heating at reflux while stirring for 24 hours. After completion of the reaction, the reaction contents were allowed to cool to room temperature, an organic layer was obtained by extraction with ethyl acetate and DI water, the organic layer was separated and dried using anhydrous magnesium sulfate, the product was filtered, and the solvents were removed under a reduced pressure. The resultant product was further purified by liquid chromatography to obtain 1.8 g of Intermediate L1 (yield of 83%).

LC-MS: m/z=485 $(M+H)^+$.

Synthesis of Intermediate L1 Dimer 1.0 g (2.1 mmol) of Intermediate L1 and 0.34 g (1.0 mmol) of iridium chloride hydrate were mixed with 60 mL of ethoxyethanol and 15 mL of DI water, followed by heating at reflux while stirring for 24 hours. When the reaction was completed, the temperature was allowed to lower to room temperature, and a solid material formed therefrom was filtered and washed sufficiently with DI water, methanol, and hexane, in this stated order. The obtained solid was dried in a vacuum oven to obtain 1.1 g of Intermediate L1 Dimer.

Synthesis of Compound 1

1.0 g (0.42 mmol) of Intermediate L1 Dimer, 0.25 g (1.1 mmol) of 3,7-diethyl-3,7-dimethylnonane-4,6-dione, and 0.15 g (1.1 mmol) of $K_2CO_3$ were mixed with 50 mL of ethoxyethanol, followed by stirring at room temperature for 24 hours to proceed a reaction. When the reaction was completed, a solid was produced by adding DI water, the solid was filtered, and the resulting product was further purified by liquid chromatography to obtain 0.8 g of Compound 1 (yield of 76%).

LC-MS: m/z=1399 $(M+H)^+$.

Synthesis Example 2 (Compound 7)
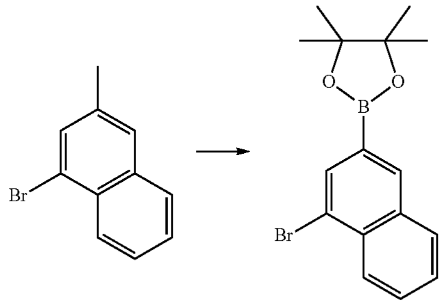
L7-2
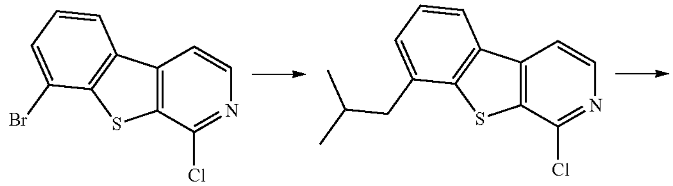
L7-3
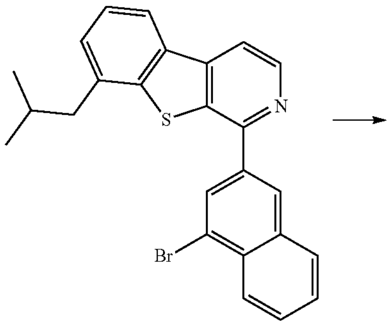
L7-1
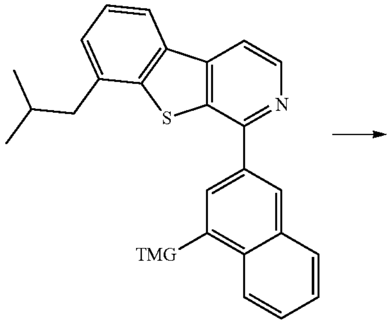
L7
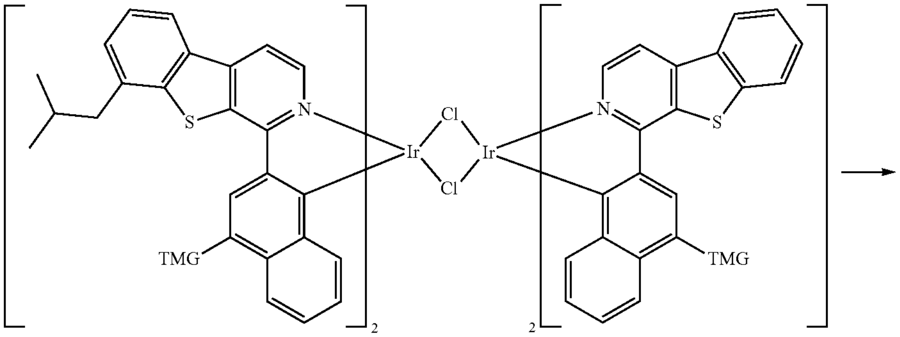
L7 Dimer -continued

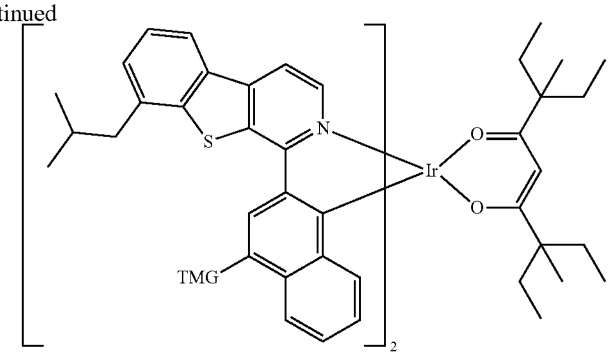

7

Synthesis of Intermediate L7-3

1.0 g (3.3 mmol) of 8-bromo-1-chlorobenzo[4,5]thieno[2,3-c]pyridine was dissolved in 40 mL of THF and 10 mL of DI water, and 0.4 g (3.9 mmol) of isobutyl boronic acid, 0.07 g (0.33 mmol) of palladium(II) acetate ($Pd(OAc)_2$), 0.27 g (0.66 mmol) of 2-dicyclohexylphosphino-2',6'-dimethoxybiphenyl (S-phos), 1.2 g (8.3 mmol) of $K_2CO_3$ were added thereto, followed by heating at refluxing while stirring for 24 hours. After completion of the reaction, an organic layer was obtained by extraction with ethyl acetate and DI water, the organic layer was dried using anhydrous magnesium sulfate, the product was filtered, and the solvent was removed under a reduced pressure. The resultant product was further purified by liquid chromatography to obtain 0.65 g of Intermediate L7-3 (yield of 71%).

LC-MS: m/z=277 $(M+H)^+$.

Synthesis of Intermediate L7-2

2.5 g (7.4 mmol) of 1-bromo-3-iodonaphthalene was mixed with 60 mL of anhydrous THF, and then 4.8 mL (7.4 mmol) of BuLi (1.6 M solution in hexane) was slowly added thereto at −78° C. After about an hour, 1.8 mL (8.9 mmol) of 2-isopropoxy-4,4,5,5-tetramethyl-1,3,2-dioxaborolane was slowly added dropwise thereto, and the reaction mixture was stirred at room temperature for 14 hours. After completion of the reaction, an organic layer was obtained by extraction with 50 mL of DI water and ethyl acetate, the organic layer was dried using anhydrous magnesium sulfate, the product was filtered, and the solvent was removed under a reduced pressure. The resultant product was further purified by liquid chromatography to obtain 2.2 g of Intermediate L7-2 (yield of 90%).

LC-MS: m/z=334 $(M+H)^+$.

Synthesis of Intermediate L7-1

0.6 g (2.2 mmol) of Intermediate L7-3 was dissolved in 40 mL of THF and 15 mL of DI water, and 0.9 g (2.6 mmol) of 2-(4-bromonaphthalen-2-yl)-4,4,5,5-tetramethyl-1,3,2-dioxaborolane (Intermediate L7-2), 0.18 g (0.15 mmol) of $Pd(PPh_3)_4$, and 0.35 g (5.5 mmol) of $K_2CO_3$ were added thereto, followed by heating at reflux while stirring for 24 hours. After completion of the reaction, an organic layer was obtained by extraction with ethyl acetate and DI water, the organic layer was dried using anhydrous magnesium sulfate, the product was filtered, and the solvent was removed under a reduced pressure.

The resultant product was further purified by liquid chromatography to obtain 0.8 g of Intermediate L1 (yield of 84%).

LC-MS: m/z=447 $(M+H)^+$.

Synthesis of Intermediate L7

0.8 g (1.8 mmol) of Intermediate L7-1 was mixed with 40 mL of anhydrous THF, and 1.2 ml (2.0 mmol) of BuLi (1.6 M solution in hexane) was slowly added thereto at −78° C. After about an hour, 0.3 mL (2.7 mmol) of chlorotrimethylgermane was slowly added dropwise thereto, followed by stirring at room temperature for 16 hours. After completion of the reaction, an organic layer was obtained by extraction with 20 mL of DI water and ethyl acetate, the organic layer was dried using anhydrous magnesium sulfate, the product was filtered, and the solvent was removed under a reduced pressure. The resultant product was further purified by liquid chromatography to obtain 0.5 g of Intermediate L7 (yield of 54%).

LC-MS: m/z=485 $(M+H)^+$.

Synthesis of Intermediate L7 Dimer

Intermediate L7 Dimer was obtained in a similar manner as used to obtain Intermediate L1 Dimer of Synthesis Example 1, except that Intermediate L7 was used instead of Intermediate L1.

Synthesis of Compound 7

0.25 g of Compound 7 (yield of 42%) was obtained in a similar manner as used to obtain Compound 1 of Synthesis Example 1, except that Intermediate L7 Dimer was used instead of Intermediate L1 Dimer.

LC-MS: m/z=1399 $(M+H)^+$.

Synthesis Example 3 (Compound 14)

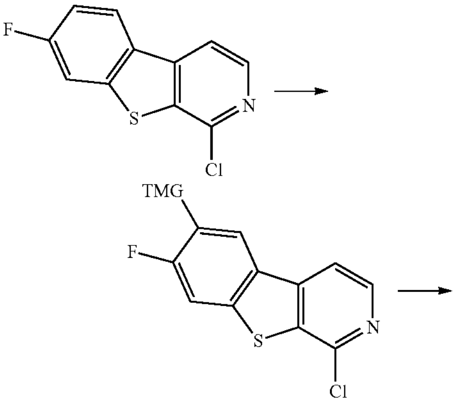

L14-1

-continued

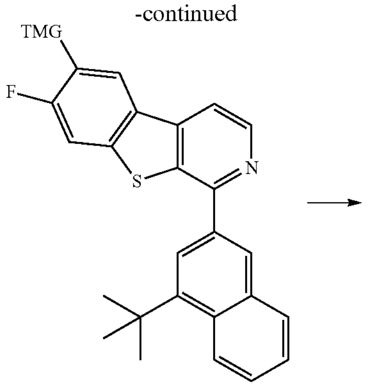

L14

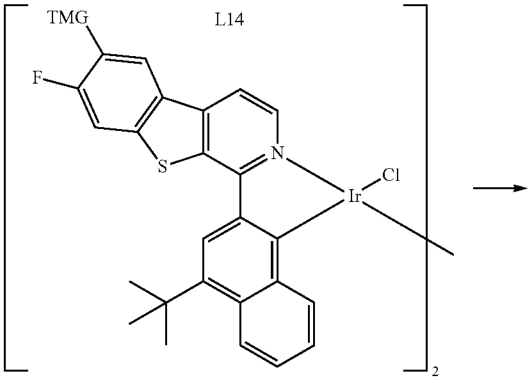

L14 Dimer

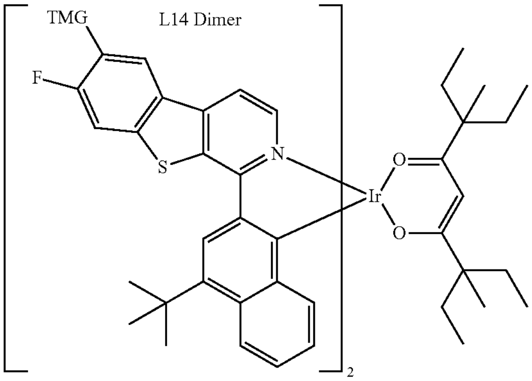

14

Synthesis of Intermediate L14-1

1-chloro-7-fluorobenzo[4,5]thieno[2,3-c]pyridine (1.81 g, 7.62 mmol) was dissolved in 30 mL of THF, followed by stirring at −78° C. n-BuLi (1.6 M solution in hexane) (5.23 ml, 8.38 mmol) was added dropwise thereto for 30 minutes, followed by stirring at −78° C. for an hour. Trimethylgermyl chloride (1.13 ml, 9.14 mmol) was added dropwise thereto for 30 minutes, and then the temperature was slowly raised to room temperature. An organic layer was extracted using ethyl acetate, anhydrous magnesium sulfate was added thereto to remove moisture, the product was filtered, and the solvent was removed under a reduced pressure. The product was further purified by column chromatography using ethyl acetate and hexane as eluents (1:5, v/v) to obtain 1.20 g of Intermediate L14-1 (yield of 44%).

LC-MS: m/z=355 $(M+H)^+$.

Synthesis of Intermediate L14

1-chloro-7-fluoro-6-(trimethylgermyl)benzo[4,5]thieno[2,3-c]pyridine (Intermediate L14-1) (0.92 g, 2.59 mmol), 2-(4-(tert-butyl)naphthalen-2-yl)-4,4,5,5-tetramethyl-1,3,2-dioxaborolane (0.84 g, 2.72 mmol), $Pd(PPh_3)_4$ (0.15 g, 0.13 mmol), and $K_2CO_3$ (0.72 g, 5.18 mmol) were mixed with 20 mL of THF and 5 mL of DI water, followed by stirring while heating at reflux for 18 hours. After the temperature was allowed to lower to room temperature, an organic layer was extracted using methylene chloride, anhydrous magnesium sulfate ($MgSO_4$) was added thereto to remove moisture, and a residue was obtained by removing the solvent under a reduced pressure. The product was further purified by column chromatography using ethyl acetate and hexane as eluents (1:5, v/v) to obtain 1.20 g of Intermediate L14 (yield of 92%).

LC-MS: m/z=503 $(M+H)^+$.

Synthesis of Intermediate L14 Dimer

Intermediate L14 (1.24 g, 2.47 mmol) and iridium chloride hydrate (0.43 g, 1.22 mmol) were mixed with 20 mL of 2-ethoxyethanol and 5 mL of DI water, followed by stirring while heating at reflux for 24 hours to proceed a reaction, and then the temperature was allowed to lower to room temperature. A solid thus produced therefrom was separated by filtration, washed sufficiently with DI water, methanol, and hexane in this stated order, and then dried in a vacuum oven to obtain Intermediate L14 Dimer (1.0 g, yield of 67%).

Synthesis of Compound 14

Intermediate L14 Dimer (1.0 g, 0.42 mmol), 3,7-diethyl-3,7-dimethylnonane-4,6-dione (0.24 g, 1.0 mmol), and $K_2CO_3$ (0.14 g, 0.1 mmol) were mixed with 20 mL of 2-ethoxyethanol, followed by stirring for 24 hours to proceed a reaction. A solid was obtained by filtering the mixture and washed with methanol and hexane. The product was purified by column chromatography using dichloromethane and n-hexane as eluents (1:1, v/v) to obtain Compound 14 (1.0 g, yield of 83%). Compound 14 was identified by LC-MS.

LC-MS: m/z=1435 $(M+H)^+$.

Synthesis Example 4 (Compound 15)

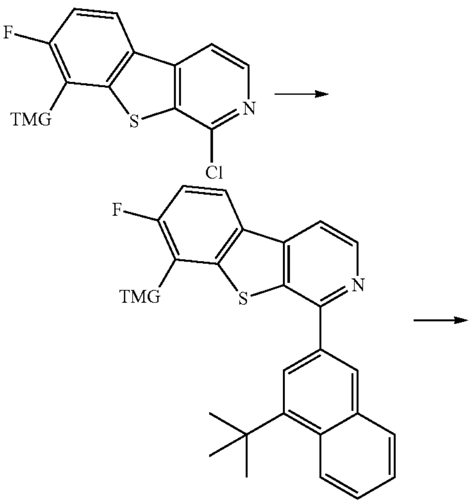

L15

-continued

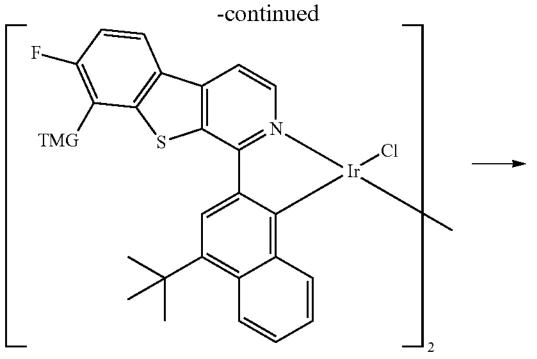

L15 Dimer

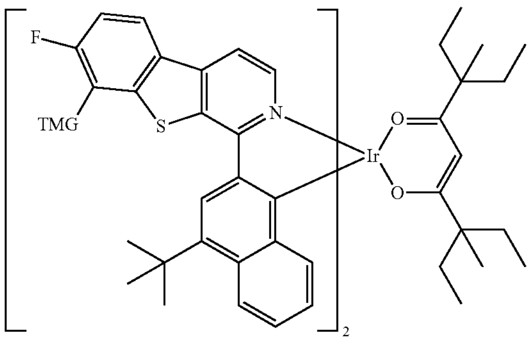

15

Synthesis of Intermediate L15

1-chloro-7-fluoro-8-(trimethylgermyl)benzo[4,5]thieno[2,3-c]pyridine (Intermediate L15-1) (0.92 g, 2.59 mmol), 2-(4-(tert-butyl)naphthalen-2-yl)-4,4,5,5-tetramethyl-1,3,2-dioxaborolane (0.84 g, 2.72 mmol), $Pd(PPh_3)_4$ (0.15 g, 0.13 mmol), and $K_2CO_3$ (0.72 g, 5.18 mmol) were mixed with 20 mL of THF and 5 mL of DI water, followed by stirring while heating at reflux for 18 hours. After the temperature was allowed to lower to room temperature, an organic layer was extracted using methylene chloride, anhydrous magnesium sulfate ($MgSO_4$) was added thereto to remove moisture, the product was filtered, and a residue was obtained by removing the solvent under a reduced pressure. The product was further purified by column chromatography using ethyl acetate and hexane as eluents (1:5, v/v) to obtain 1.20 g of Compound L15 (yield of 92%).

LC-MS: m/z=503 $(M+H)^+$.

Synthesis of Intermediate L15 Dimer

Intermediate L15 (1.24 g, 2.47 mmol) and iridium chloride hydrate (0.43 g, 1.22 mmol) were mixed with 20 mL of 2-ethoxyethanol and 5 mL of DI water, followed by stirring while heating at reflux for 24 hours to proceed a reaction, and then the temperature was allowed to lower to room temperature. A solid thus produced therefrom was separated by filtration, washed sufficiently with DI water, methanol, and hexane in this stated order, and then dried in a vacuum oven to obtain Intermediate L15 Dimer (1.0 g, yield of 67%).

Synthesis of Compound 15

Intermediate L15 Dimer (1.0 g, 0.42 mmol), 3,7-diethyl-3,7-dimethylnonane-4,6-dione (0.24 g, 1.0 mmol), and $K_2CO_3$ (0.14 g, 0.1 mmol) were mixed with 20 mL of 2-ethoxyethanol, followed by stirring for 24 hours to proceed a reaction. A solid was obtained by filtering the mixture and washed with methanol and hexane. The product was further purified by column chromatography using dichloromethane and n-hexane (1:1, v/v) to obtain Compound 15 (1.0 g, yield of 83%). Compound 15 was identified by LC-MS.

LC-MS: m/z=1435 $(M+H)^+$.

Synthesis Example 5 (Compound 22)

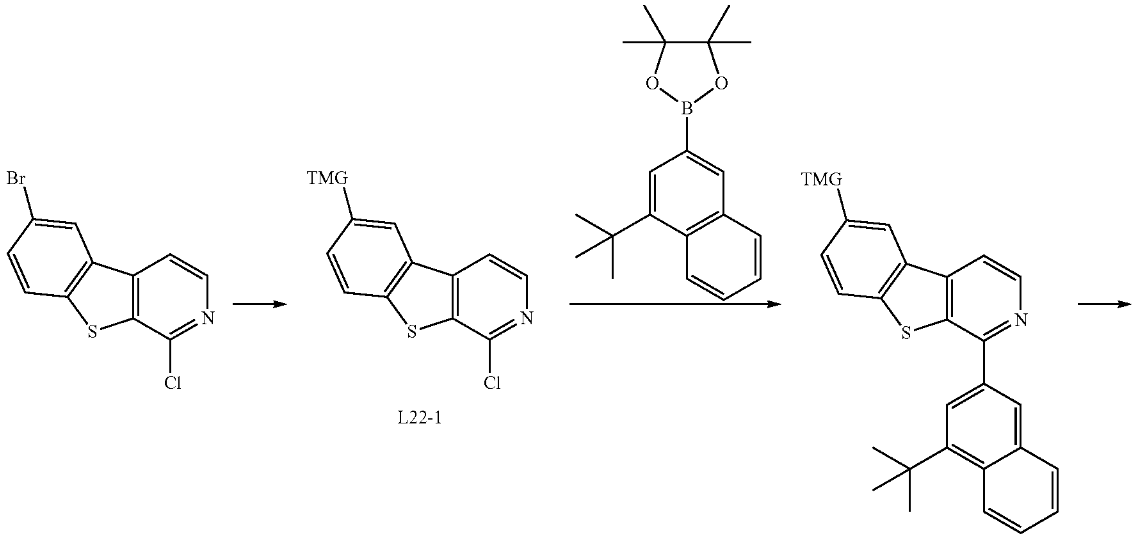

L22-1

L22

-continued

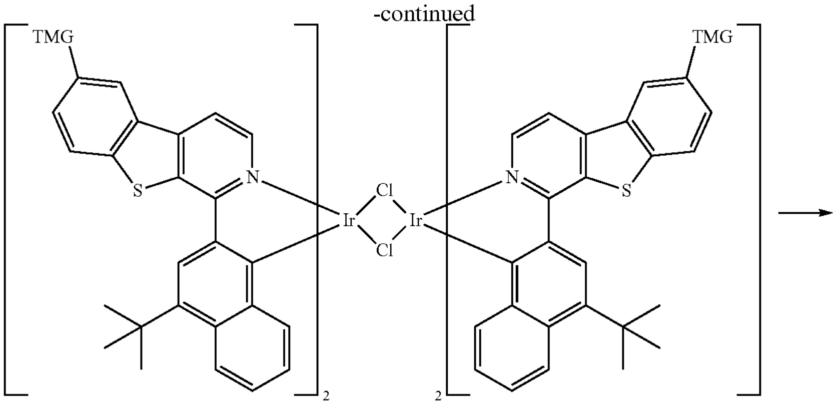

L22 Dimer

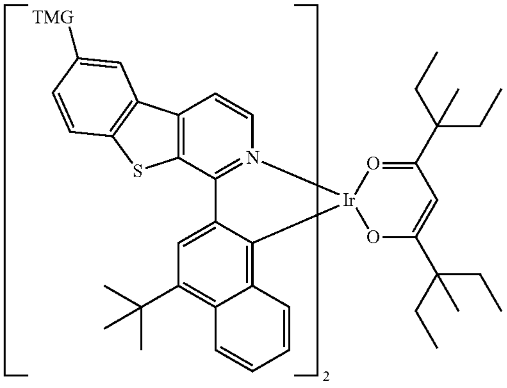

22

Synthesis of Intermediate L22

Intermediate L22 was obtained in a similar manner as was used to obtain Intermediate L1 of Synthesis Example 1, except that 6-bromo-1-chlorobenzo[4,5]thieno[2,3-c]pyridine was used instead of Intermediate 8-bromo-1-chlorobenzo[4,5]thieno[2,3-c]pyridine.

LC-MS: m/z=485 $(M+H)^+$.

Synthesis of Intermediate L22 Dimer

Intermediate L22 Dimer was obtained in a similar manner as was used to obtain Intermediate L1 Dimer of Synthesis Example 1, except that Intermediate L22 was used instead of Intermediate L1.

Synthesis of Compound 22

0.61 g of Compound 22 (yield of 51%) was obtained in a similar manner as was used to obtain Compound 1 of Synthesis Example 1, except that Intermediate L22 Dimer was used instead of Intermediate L1 Dimer.

LC-MS: m/z=1399 $(M+H)^+$.

Evaluation Example 1: Evaluation of Photoluminescence Quantum Yields (PLQY)

Compound H52 and Compound 1 were co-deposited under vacuum ($10^{-7}$ torr) at a weight ratio of 98:2 to produce a film having a thickness of 40 nm.

The PLQY in film was evaluated using a Hamamatsu Photonics absolute PL quantum yield measurement system equipped with a xenon light source, a monochromator, a photonic multichannel analyzer, and an integrating sphere and employing PLQY measurement software (Hamamatsu Photonics, Ltd., Shizuoka, Japan) to identify the PLQY in film of Compound 1. The results are shown in Table 2.

The PLQY measurement was performed on each of Compounds 7, 14, 15, 22, A, B1, and B2, and the results are shown in Table 2.

TABLE 2

| Compound No. | PLQY in film (%) |
|---|---|
| 1 | 91 |
| 7 | 92 |
| 14 | 92 |
| 15 | 92 |
| 22 | 91 |
| A | 88 |
| B1 | 83 |
| B2 | 90 |

TABLE 2-continued
| Compound No. | PLQY in film (%) |
|---|---|
| 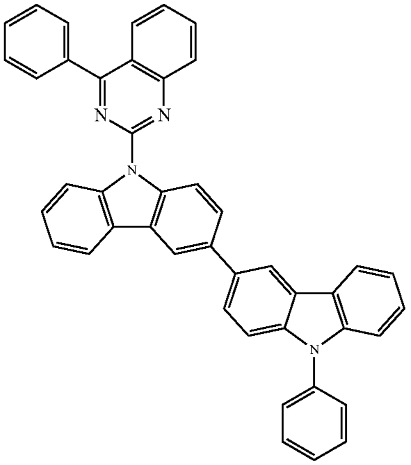 H52 | |
| 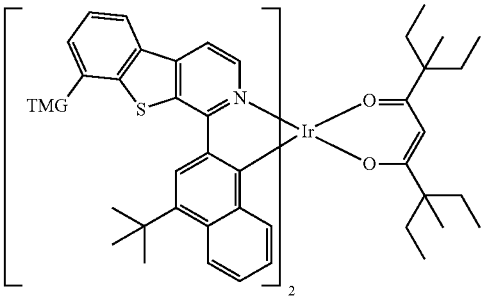 1 | |
| 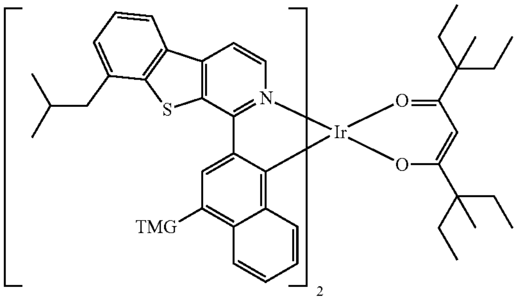 7 | |
| 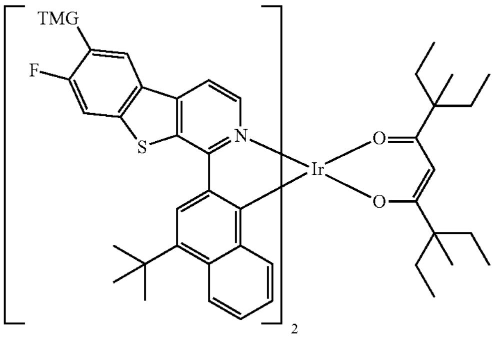 14 | |
TABLE 2-continued
| Compound No. | PLQY in film (%) |
|---|---|
| 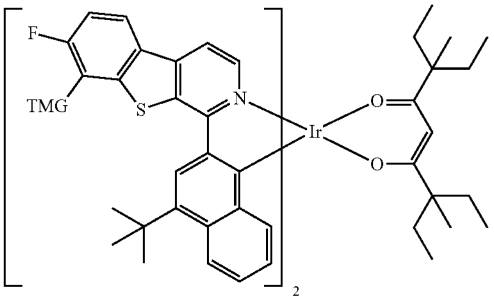 15 | |
| 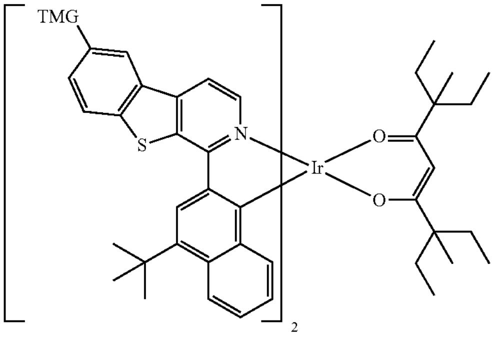 22 | |
| 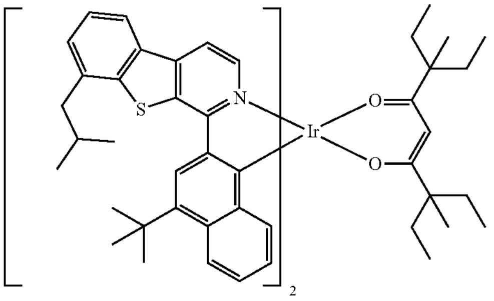 A | |
| 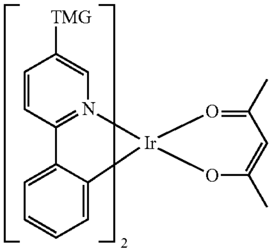 B1 | |

TABLE 2-continued

| Compound No. | PLQY in film (%) |
|---|---|
| 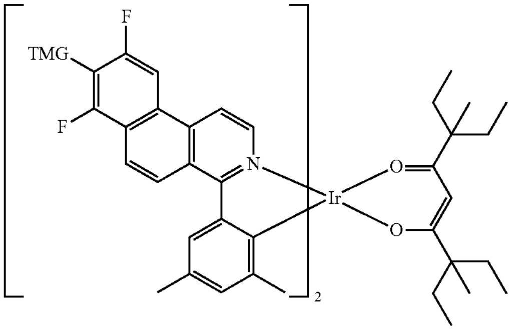 B2 | |

From Table 2, it was determined that Compounds 1, 7, 14, 15, and 22 had superior PLQY characteristics compared to those of Compounds A, B1, and B2.

Evaluation Example 2: Evaluation of Horizontal Orientation Ratio (Optical Orientation Ratio)

In a vacuum deposition apparatus having a vacuum degree of $1\times10^{-7}$ torr, Compound H52 and Compound 1 were co-deposited at a weight ratio of 98:2 on a fused silica layer (having a thickness of 1 mm) to form a film having a thickness of 40 nm, and then sealed with glass and glue under a nitrogen atmosphere.

Meanwhile, an angle-dependent PL measurement apparatus having the same structure as that shown in FIG. 3 of Korean Patent Application Publication No. 2013-0150834 was prepared. Detailed specifications are as follows:

Excitation light wavelength: 325 nm

Source of excitation light: He—Cd laser of Melles Griot Inc.

Excitation light irradiation member: Optical fiber having a diameter of 1 mm of Thorlabs Inc.

Semi-cylindrical prism: Fused silica having a diameter of 100 mm and a length of 30 mm Emitted light detection member: Photomultiplier tube of Acton Inc.

Polarizer mounted on emitted light detection member: Linear polarizer of Thorlabs Inc.

Recorder: SpectraSense of Acton Inc.

Incidence angle of excitation light: θP=45°, θH=$0^0$

Distance from a sample to the emitted light detection member (or a radius of a movement path of the emitted light detection member): 900 mm Subsequently, the film was fixed on a semi-cylindrical lens and 325 nm laser was irradiated thereto to emit a light. The emitted light passed through a polarization film, and then, to measure a p-polarized photoluminescence intensity with respect to light at a Max wavelength of a spectrum in a range of 90 degrees to 0 degree, the semi-cylindrical lens, on which the sample was fixed, was rotated by 1 degree with respect to an axis of the semi-cylindrical lens by using a charge-coupled device (CCD).

The p-polarized photoluminescence intensity (a first p-polarized photoluminescence intensity) in a case where each compound was vertically aligned and the p-polarized photoluminescence intensity (a second p-polarized photoluminescence intensity) in a case where each compound was horizontally aligned were each calculated within a range of 0 degree to 90 degrees. The p-polarized photoluminescence intensity obtained by multiplying the first p-polarized photoluminescence intensity and the second p-polarized photoluminescence intensity respectively by a weight value were obtained to obtain a weight value corresponding to the measured p-polarized photoluminescence intensity. Then, the horizontal orientation ratio of each compound shown in Table 3 was measured and the results are shown in Table 3. The angle-dependent photoluminescence spectra were analyzed using a classical dipole model that regards light emitted from excitons as dissipated power from an oscillating dipole, and the horizontal orientation ratio for Compound 1 was evaluated.

This was performed on each of Compounds 7, 14, 15, 22, A, B1, and B2, and the results are shown in Table 3.

TABLE 3

| Co-deposition material | Horizontal orientation ratio (optical orientation ratio) (%) |
|---|---|
| H52 : Compound 1 (2 wt %) | 92 |
| H52 : Compound 7 (2 wt %) | 92 |
| H52 : Compound 14 (2 wt %) | 94 |
| H52 : Compound 15 (2 wt %) | 93 |
| H52 : Compound 22 (2 wt %) | 94 |
| H52 : Compound A (2 wt %) | 89 |
| H52 : Compound B1 (2 wt %) | 80 |
| H52 : Compound B2 (2 wt %) | 91 |

From Table 3, it was determined that Compounds 1, 7, 14, 15, and 22 had superior horizontal orientation ratio characteristics compared to those of Compounds A, B1, and B2.

Example 1

A glass substrate on which an ITO as an anode was patterned was cut to a size of 50 millimeters (mm)×50 mm×0.5 mm, sonicated with isopropyl alcohol and DI water each for 5 minutes, and then cleaned by irradiation of ultraviolet rays and exposure of ozone thereto for 30 minutes each. The resultant glass substrate was loaded onto a vacuum deposition apparatus.

HT3 and F6-TCNNQ were vacuum-co-deposited on the ITO anode at a weight ratio of 98:2 to form a hole injection layer having a thickness of 100 Å, HT3 was vacuum-deposited on the hole injection layer to form a hole transport layer having a thickness of 1,350 Å, and then, HT21 was vacuum-deposited on the hole transport layer to form an electron blocking layer having a thickness of 300 Å.

Subsequently, H52 (host) and Compound 1 (dopant) were co-deposited at a weight ratio of 98:2 on the electron blocking layer to form an emission layer having a thickness of 400 Å.

Afterwards, ET3 and ET-D1 were co-deposited at a volume ratio of 50:50 on the emission layer to form an electron transport layer having a thickness of 350 Å, ET-D1 was vacuum-deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device having a structure of ITO (1,500 Å)/HT3+F6-TCNNQ (2 wt %) (100 Å)/HT3 (1,350 Å)/HT21 (300 Å)/H52+Compound 1 (2 wt %) (400 Å)/ET3+ET-D1 (50%) (350 Å)/ET-D1 (10 Å)/Al (1,000 Å).

HT3

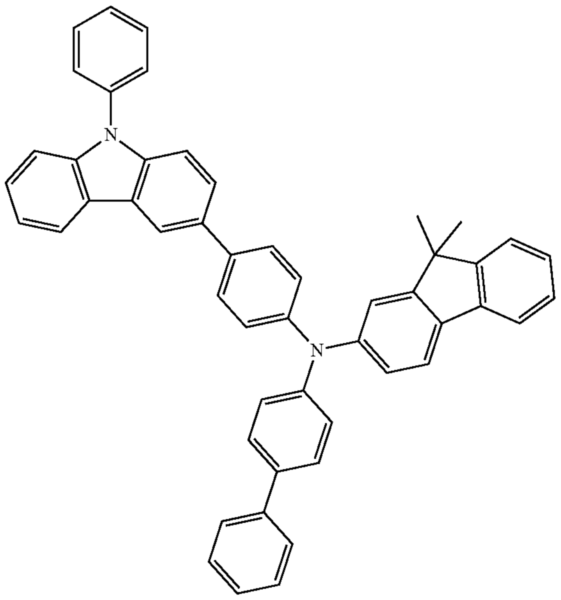

F6-TCNNQ

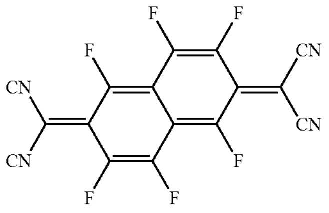

HT21

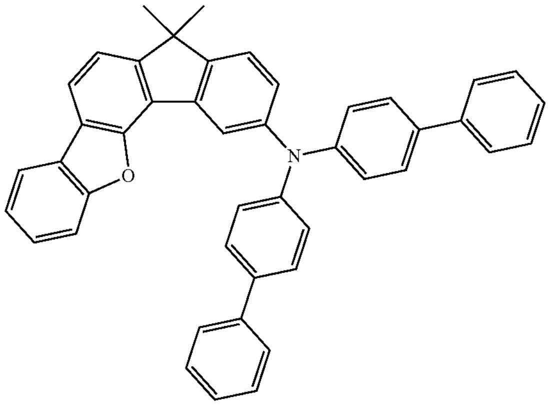

-continued

H52

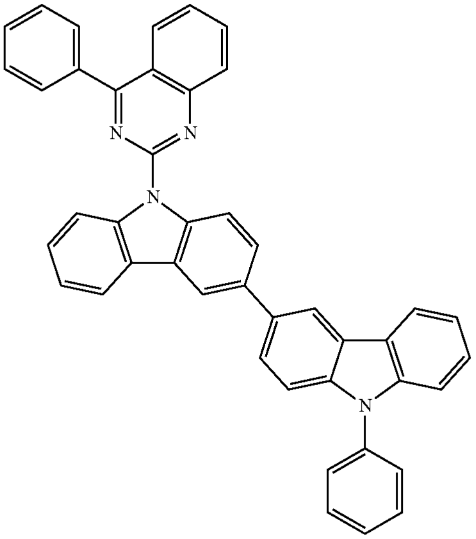

ET3

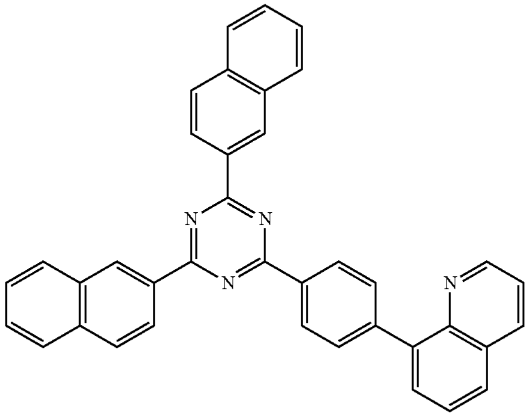

ET-D1

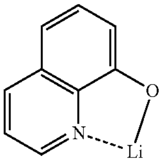

Examples 2 to 5 and Comparative Examples A, B1, and B2

Organic light-emitting devices were manufactured in a similar manner as was used in Example 1, except that compounds shown in Table 4 were each used instead of Compound 1 as a dopant in forming the emission layer.

Evaluation Example 3: Evaluation of Device Characteristics

The driving voltage (V), current density ($mA/cm^2$), maximum value of external quantum efficiency (Max EQE, relative %), FWHM (nm) of an emission peak of an EL spectrum, maximum emission wavelength (nm), and lifespan ($LT_{97}$, relative %) of the organic light-emitting devices manufactured according to Examples 1 to 5 and Comparative Examples A, B1, and B2 were evaluated. The results are shown in Table 4. As an evaluation device, a current-voltmeter (Keithley 2400) and a luminance meter (Minolta Cs-1000A) were used, and the lifespan ($LT_{97}$) (at 3,500 candela per square meter (cd/$m^2$) was evaluated as the time (hours, hr) taken for luminance to reach 97% relative to 100% of the initial luminance.

TABLE 4

| | Compound No. as a dopant in emission layer | Driving voltage (V) | Current density (mA/$cm^2$) | Max EQE (relative %) | FWHM (nm) | Maximum emission wavelength (nm) | $LT_{97}$ (relative %) |
|---|---|---|---|---|---|---|---|
| Example 1 | 1 | 4.1 | 10 | 28 | 34 | 626 | 115 |
| Example 2 | 7 | 4.2 | 10 | 27 | 35 | 622 | 120 |
| Example 3 | 14 | 4.0 | 10 | 30 | 34 | 625 | 150 |
| Example 4 | 15 | 4.0 | 10 | 29 | 34 | 624 | 170 |
| Example 5 | 22 | 4.3 | 10 | 29 | 33 | 623 | 150 |
| Comparative Example A | A | 4.3 | 10 | 25 | 35 | 626 | 100 |
| Comparative Example B1 | B1 | 4.5 | 10 | 21 | 71 | 535 | 150 |
| Comparative Example B2 | B2 | 4.3 | 10 | 26 | 51 | 626 | 110 |

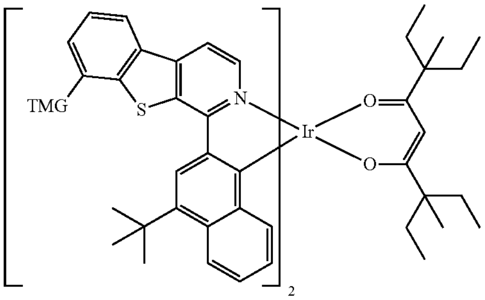

1

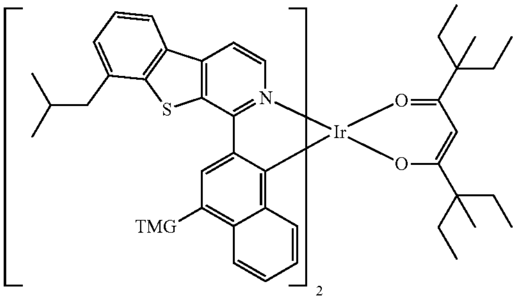

7

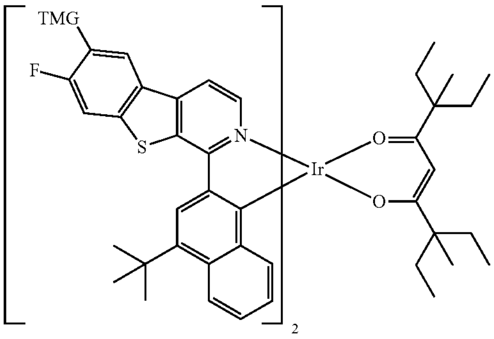

14

TABLE 4-continued
| Compound No. as a dopant in emission layer | Driving voltage (V) | Current density ($mA/cm^2$) | Max EQE (relative %) | FWHM (nm) | Maximum emission wavelength (nm) | $LT_{97}$ (relative %) |
|---|---|---|---|---|---|---|
| 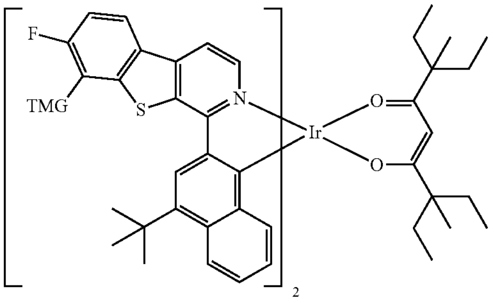 15 | | | | | | |
| 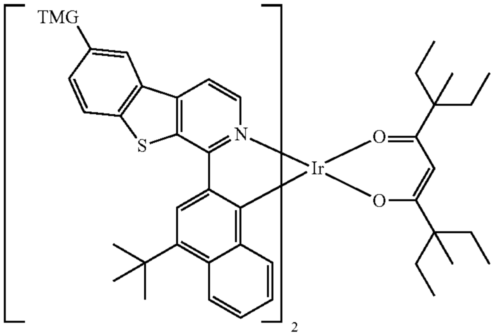 22 | | | | | | |
| 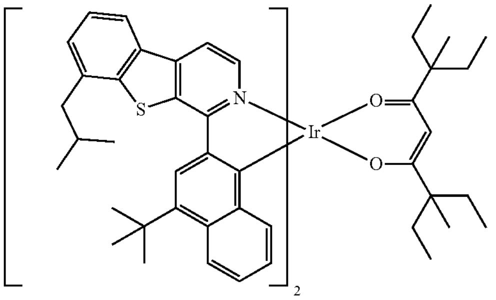 A | | | | | | |
| 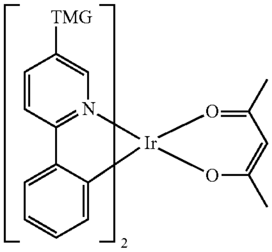 B1 | | | | | | |

TABLE 4-continued

| Compound No. as a dopant in emission layer | Driving voltage (V) | Current density (mA/cm$^2$) | Max EQE (relative %) | FWHM (nm) | Maximum emission wavelength (nm) | $LT_{97}$ (relative %) |
|---|---|---|---|---|---|---|
| 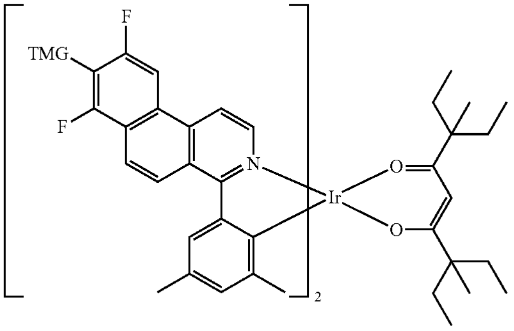 B2 | | | | | | |

From Table 4, it was determined that the organic light-emitting devices of Examples 1 to 5 had improved driving voltages, improved external quantum efficiencies, and improved lifespan characteristics compared to those of the organic light-emitting devices of Comparative Examples A, B1, and B2, and at the same time, emitted a light having a relatively small or narrow FWHM.

The organometallic compound has excellent thermal stability and electrical characteristics. Accordingly, an electronic device, for example, a light-emitting device, including at least one of the organometallic compounds may have improved driving voltage, improved external quantum efficiency, and improved lifespan characteristics, and may emit a light having a relatively small or narrow FWHM.

It should be understood that exemplary embodiments described herein should be considered in a descriptive sense only and not for purposes of limitation. Descriptions of features or aspects within each exemplary embodiment should typically be considered as available for other similar features or aspects in other embodiments. While one or more exemplary embodiments have been described with reference to the FIGURE, it will be understood by those of ordinary skill in the art that various changes in form and details may be made therein without departing from the spirit and scope as defined by the following claims.

What is claimed is:

1. An organometallic compound represented by Formula 1:

Formula 1

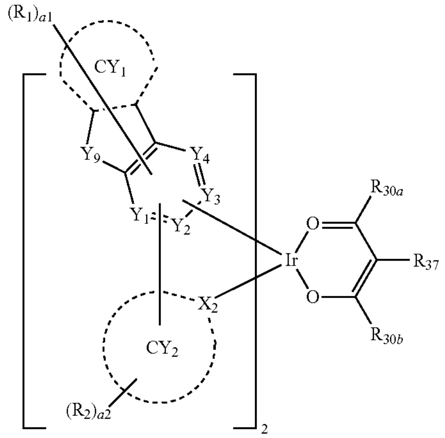

wherein a group represented by

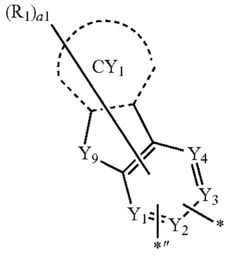

in Formula 1 is a group represented by one of Formulae CY1-1 to CY1-6:

CY1-1

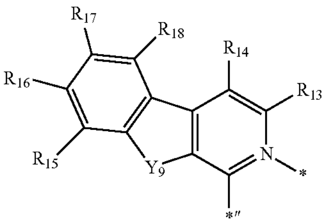

CY1-2

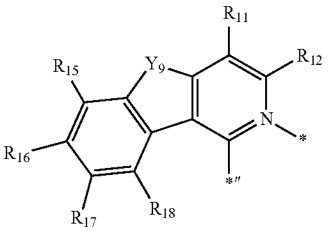

-continued

CY1-3

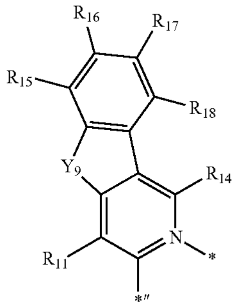

CY1-4

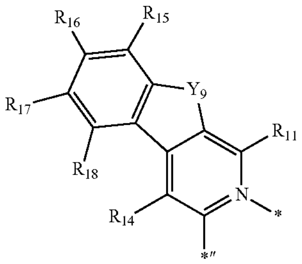

CY1-5

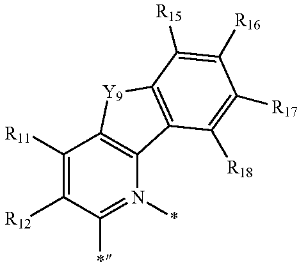

CY1-6

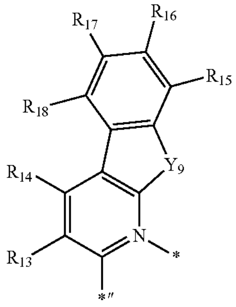

wherein, in Formulae CY1-1 to CY1-6, $Y_9$ is O, S, $N(R_{19})$, $C(R_{19a})(R_{19b})$, or $Si(R_{19a})(R_{19b})$,

* indicates a binding site to iridium in Formula 1, and

*" indicates a binding site to ring $CY_2$ in Formula 1, wherein a group represented by

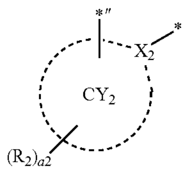

in Formula 1 is a group represented by one of Formulae CY2-1 and CY2-6:

CY2-1

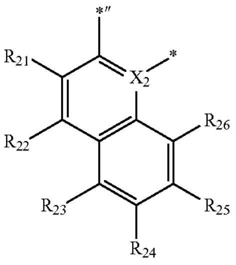

CY2-6

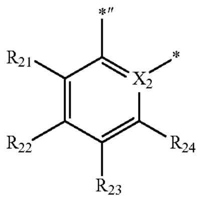

wherein, in Formulae CY2-1 and CY2-6, $X_2$ is C,

* indicates a binding site to iridium in Formula 1, and

*" indicates a binding site to one of $Y_1$ to $Y_4$ in Formula 1, wherein, in Formulae 1, CY1-1 to CY1-6, CY2-1 and CY2-6, $R_{11}$ to $R_{18}$, $R_{19}$, $R_{19a}$, $R_{19b}$, $R_{21}$ to $R_{26}$, $R_{30a}$, $R_{30b}$, and $R_{37}$ are each independently:

hydrogen, deuterium, —F, or a cyano group;

a $C_1$-$C_{20}$ alkyl group that is unsubstituted or substituted with at least one of deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, or a combination thereof;

a $C_3$-$C_{10}$ cycloalkyl group, a phenyl group, a biphenyl group, a naphthyl group, a pyridinyl group, a fluorenyl group, a carbazolyl group, a dibenzofuranyl group, or a dibenzothiophenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl) biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or a combination thereof; or $—Si(Q_3)(Q_4)(Q_5)$ or $—Ge(Q_3)(Q_4)(Q_5)$, $Q_3$ to $Q_5$ are each independently:

deuterium, —F, $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, $—CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, a phenyl group, or a combination thereof, and with the proviso that:

i) at least one of $R_{15}$, $R_{16}$, or $R_{17}$ in Formulae CY1-1 to CY1-6 is —Ge($Q_3$)($Q_4$)($Q_5$);

ii) $R_{22}$ in Formulae CY2-1 and CY2-6 is —Ge($Q_3$)($Q_4$)($Q_5$); or iii) at least one of $R_{15}$, $R_{16}$, or $R_{17}$ in Formulae CY1-1 to CY1-6 is —Ge($Q_3$)($Q_4$)($Q_5$), and $R_{22}$ in Formulae CY2-1 and CY2-6 is —Ge($Q_3$)($Q_4$)($Q_5$).

2. The organometallic compound of claim 1, wherein one of Condition A1 to Condition A5 is satisfied:

Condition A1

$R_{30a}$ in Formula 1 is a group represented by *—C($R_{31}$)($R_{32}$)($R_{33}$), and each of $R_{31}$ to $R_{33}$ comprises one or more carbon atoms;

Condition A2

$R_{30a}$ in Formula 1 is a group represented by *—C($R_{31}$)($R_{32}$)($R_{33}$), each of $R_{31}$ and $R_{33}$ comprises one or more carbon atoms, and $R_{32}$ is hydrogen, deuterium, or —F;

Condition A3

$R_{30a}$ in Formula 1 is a group represented by *—C($R_{31}$)($R_{32}$)($R_{33}$), and each of $R_{31}$ to $R_{33}$ comprises at least one carbon atom, wherein at least one of $R_{31}$ to $R_{33}$ comprises two or more carbon atoms;

Condition A4

$R_{30a}$ in Formula 1 is a group represented by *—C($R_{31}$)($R_{32}$)($R_{33}$), each of $R_{31}$ and $R_{33}$ comprises one or more carbon atoms, wherein at least one of $R_{31}$ and $R_{33}$ comprises two or more carbon atoms, and $R_{32}$ is hydrogen, deuterium, or —F;

Condition A5

$R_{30a}$ in Formula 1 is a group represented by *—C($R_{31}$)($R_{32}$)($R_{33}$), and $R_{31}$ to $R_{33}$ are each independently hydrogen, deuterium, or —F, wherein at least one of $R_{31}$ to $R_{33}$ is deuterium or —F, wherein * indicates a binding site to a neighboring atom in Formula 1.

3. The organometallic compound of claim 1, wherein one of Condition B1 to Condition B5 is satisfied:

Condition B1

$R_{30b}$ in Formula 1 is a group represented by *—C($R_{34}$)($R_{35}$)($R_{36}$), and each of $R_{34}$ to $R_{36}$ comprises one or more carbon atoms;

Condition B2

$R_{30b}$ in Formula 1 is a group represented by *—C($R_{34}$)($R_{35}$)($R_{36}$), each of $R_{34}$ and $R_{36}$ comprises one or more carbon atoms, and $R_{35}$ is hydrogen, deuterium, or —F;

Condition B3

$R_{30b}$ in Formula 1 is a group represented by *—C($R_{34}$)($R_{35}$)($R_{36}$), and each of $R_{34}$ to $R_{36}$ comprises one or more carbon atoms, wherein at least one of $R_{34}$ to $R_{36}$ comprises two or more carbon atoms;

Condition B4

$R_{30b}$ in Formula 1 is a group represented by *—C($R_{34}$)($R_{35}$)($R_{36}$), each of $R_{34}$ and $R_{36}$ comprises one or more carbon atoms, wherein at least one of $R_{34}$ and $R_{36}$ comprises two or more carbon atoms, and $R_{35}$ is hydrogen, deuterium, or —F;

Condition B5

$R_{30b}$ in Formula 1 is a group represented by *—C($R_{34}$)($R_{35}$)($R_{36}$), and $R_{34}$ to $R_{36}$ are each independently hydrogen, deuterium, or —F, wherein at least one of $R_{34}$ to $R_{36}$ is deuterium or —F, wherein * indicates a binding site to a neighboring atom in Formula 1.

4. The organometallic compound of claim 1, wherein at least one of $R_{15}$, $R_{16}$, or $R_{17}$ in Formulae CY1-1 to CY1-6 is —Ge($Q_3$)($Q_4$)($Q_5$).

5. The organometallic compound of claim 1, wherein $R_{22}$ in Formulae CY2-1 and CY2-6 is —Ge($Q_3$)($Q_4$)($Q_5$).

6. The organometallic compound of claim 1, wherein the organometallic compound is at least one of Compounds 1, 2, 5 to 26 or 29 to 33:

1

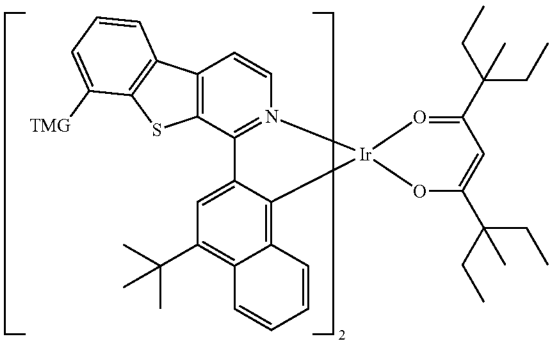

2

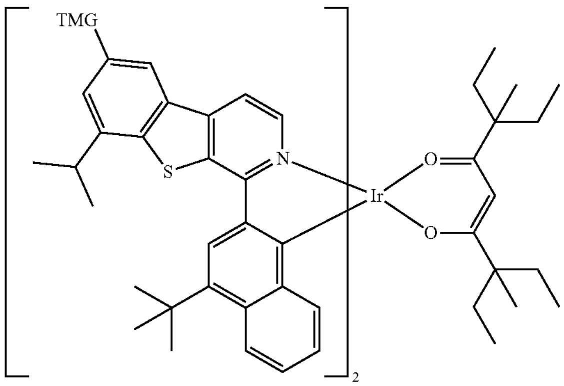

-continued
5
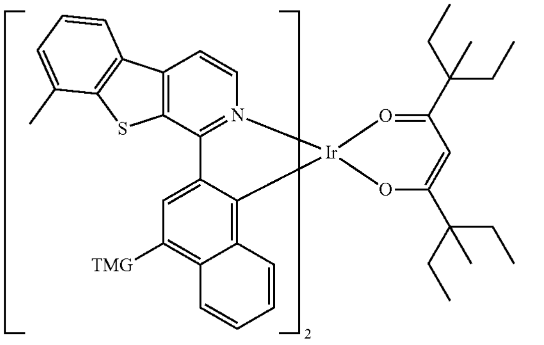
6
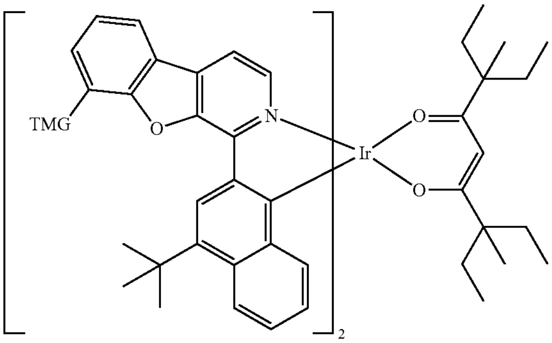
7
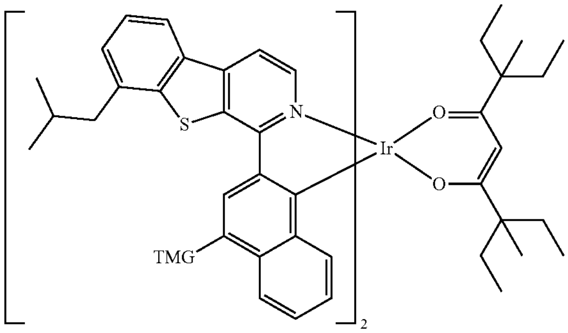
8
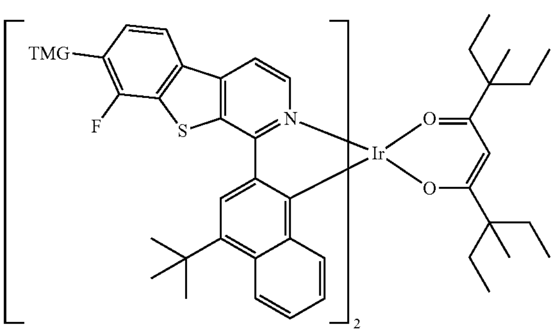
-continued
9
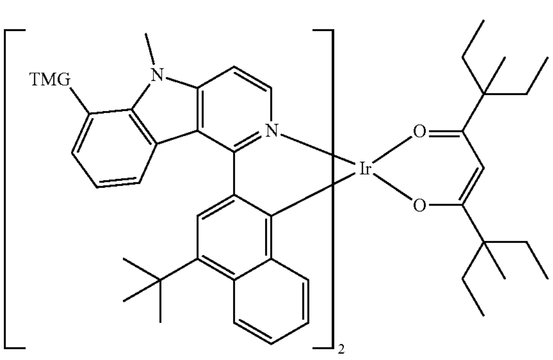
10
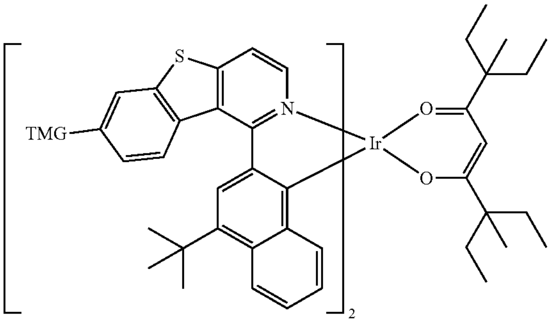
11
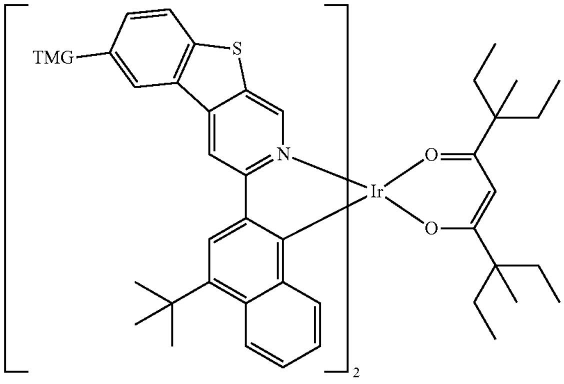
12
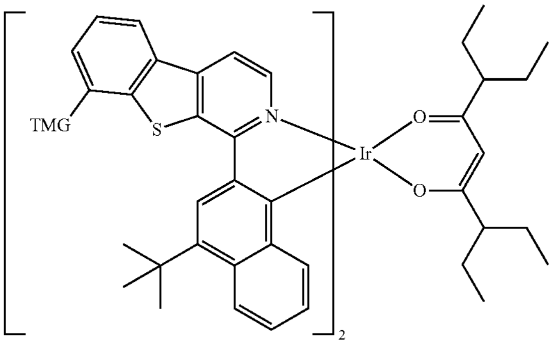

-continued
13
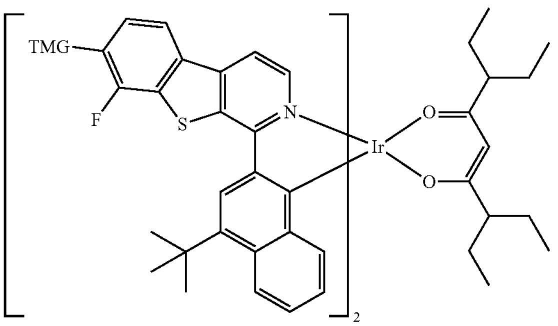
14
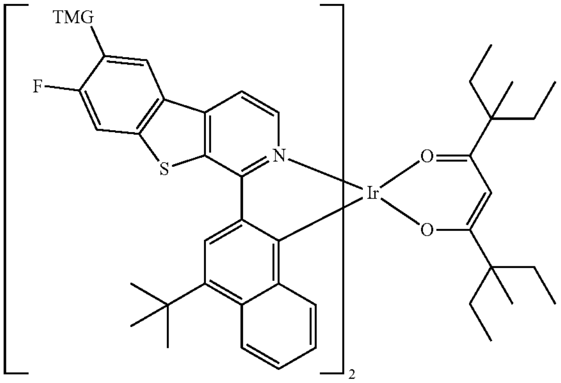
15
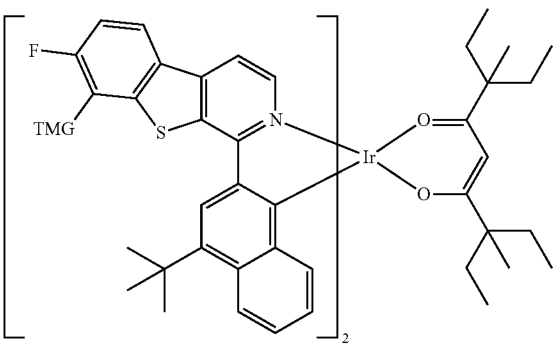
16
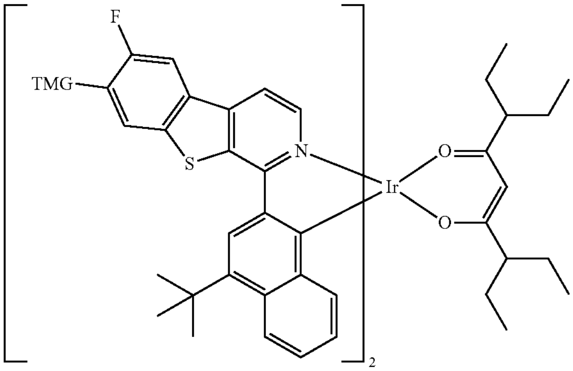
-continued
17
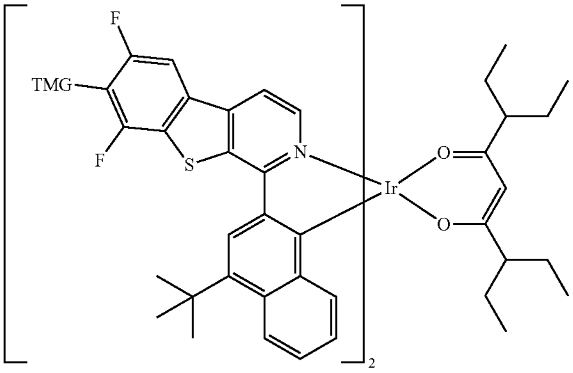
18
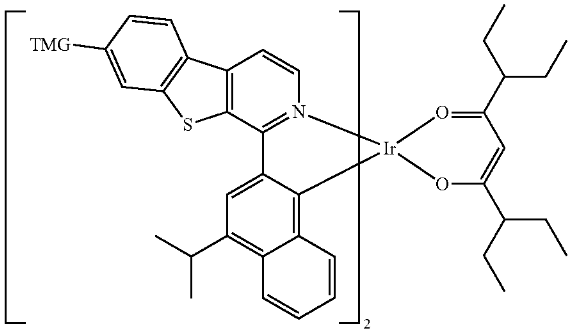
19
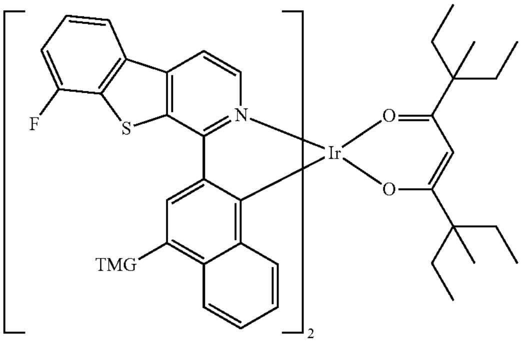
20
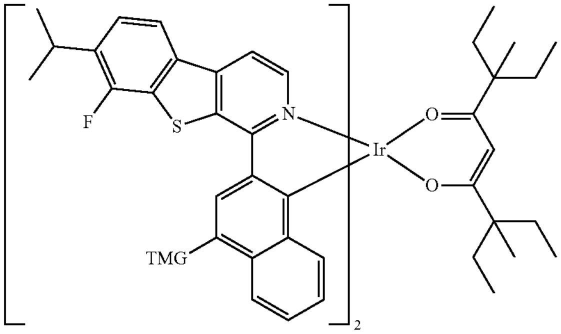

-continued
21
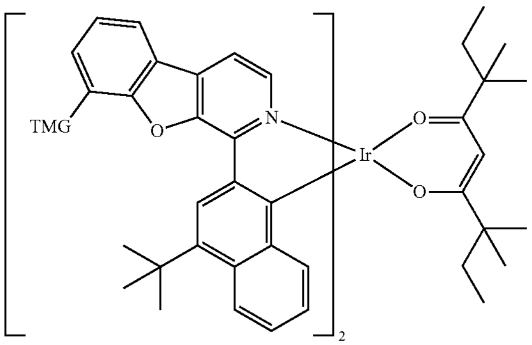
22
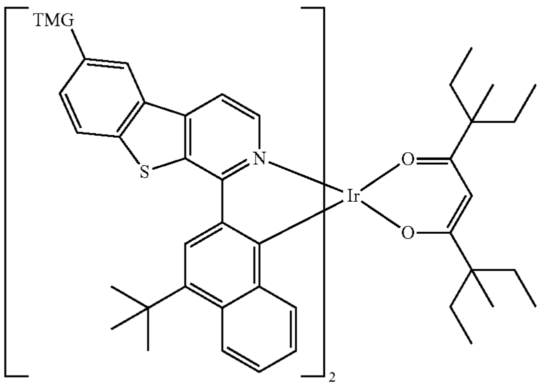
23
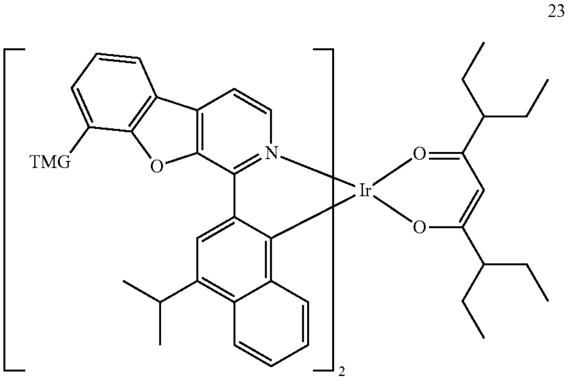
24
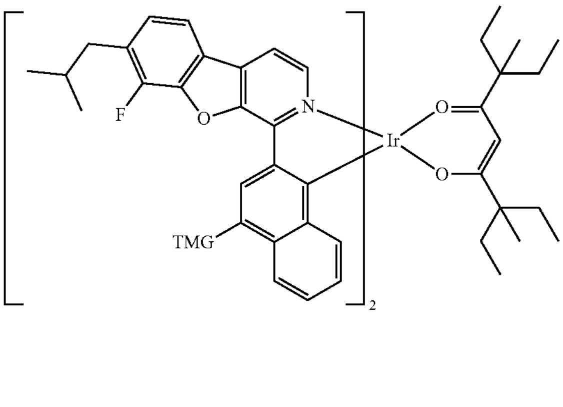
-continued
25
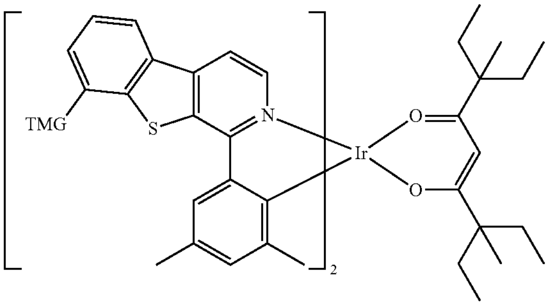
26
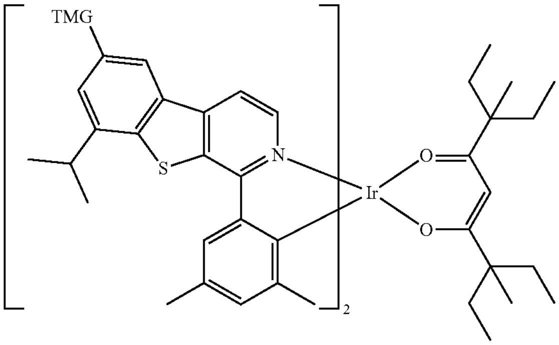
29
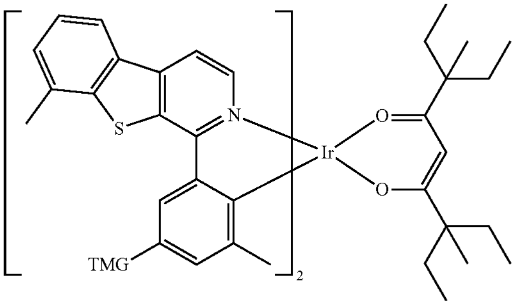
30
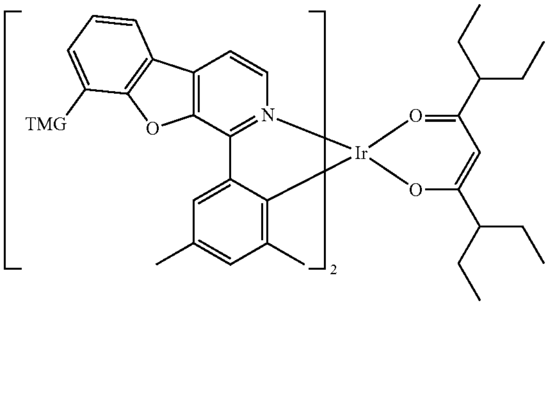

-continued

31

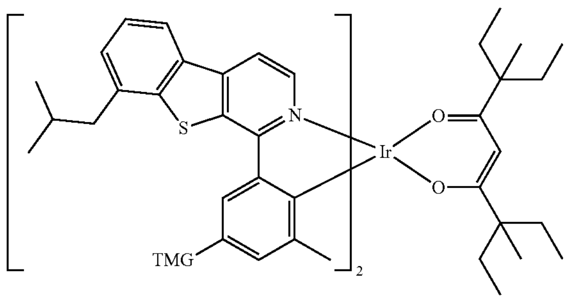

32

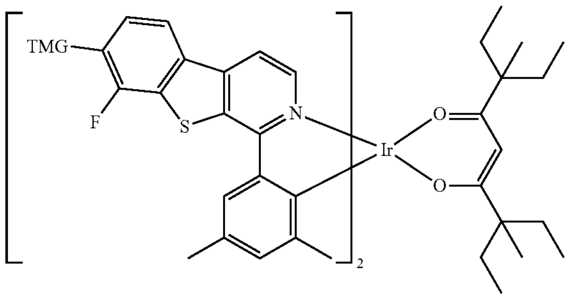

-continued

33

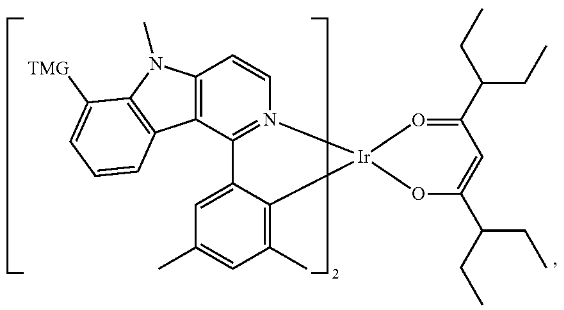

wherein TMG in Compounds 1, 2, 5 to 26 and 29 to 33 is a trimethylgermyl group.

7. A light-emitting device, comprising:

a first electrode;

a second electrode; and an organic layer disposed between the first electrode and the second electrode, wherein the organic layer comprises an emission layer, and wherein the organic layer further comprises at least one organometallic compound of claim 1.

8. The light-emitting device of claim 7, wherein the emission layer comprises the at least one organometallic compound.

9. The light-emitting device of claim 8, wherein the emission layer emits a red light having a maximum emission wavelength of about 580 nanometers to about 730 nanometers.

10. An electronic apparatus, comprising the light-emitting device of claim 7.

* * * * *